United States Patent
Perlmutter et al.

(10) Patent No.: US 11,879,024 B1
(45) Date of Patent: Jan. 23, 2024

(54) SOFT MOLD FORMULATIONS FOR SURFACE RELIEF GRATING FABRICATION WITH IMPRINTING LITHOGRAPHY

(71) Applicant: META PLATFORMS TECHNOLOGIES, LLC, Menlo Park, CA (US)

(72) Inventors: Zachary Perlmutter, Seattle, WA (US); Tingling Rao, Bellevue, WA (US); Giuseppe Calafiore, Woodinville, WA (US); Emily Anne Makoutz, Carnation, WA (US)

(73) Assignee: META PLATFORMS TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 17/375,874

(22) Filed: Jul. 14, 2021

Related U.S. Application Data

(60) Provisional application No. 63/051,758, filed on Jul. 14, 2020.

(51) Int. Cl.
  C08F 222/20 (2006.01)
  G03F 7/004 (2006.01)

(52) U.S. Cl.
  CPC .......... *C08F 222/20* (2013.01); *G03F 7/0046* (2013.01)

(58) Field of Classification Search
  CPC ..................... C08F 222/20; G03F 7/0046
  See application file for complete search history.

(56) References Cited

U.S. PATENT DOCUMENTS

| | | |
|---|---|---|
| 2,994,726 A | 8/1961 | Hodgson et al. |
| 4,068,849 A | 1/1978 | DiSalvo et al. |
| 4,180,673 A | 12/1979 | Burguette |
| 4,970,129 A | 11/1990 | Ingwall et al. |
| 5,219,710 A | 6/1993 | Horn et al. |
| 5,292,620 A | 3/1994 | Booth et al. |
| 5,759,721 A | 6/1998 | Dhal et al. |
| 5,858,614 A | 1/1999 | Sato et al. |
| 5,874,187 A | 2/1999 | Colvin et al. |
| 5,932,045 A | 8/1999 | Campbell et al. |
| 6,103,454 A | 8/2000 | Dhar et al. |
| 6,482,551 B1 | 11/2002 | Dhar et al. |
| 6,650,447 B2 | 11/2003 | Curtis et al. |
| 6,743,552 B2 | 6/2004 | Setthachayanon et al. |
| 6,765,061 B2 | 7/2004 | Dhar et al. |
| 6,780,546 B2 | 8/2004 | Trentler et al. |
| 7,704,643 B2 | 4/2010 | Cole et al. |
| 8,071,260 B1 | 12/2011 | Cole et al. |
| 8,183,303 B2 | 5/2012 | Jeong et al. |
| 8,202,468 B2* | 6/2012 | Zhu ........................ B82Y 10/00 |
| | | 264/494 |
| 8,206,639 B2* | 6/2012 | Zhu ........................ C08G 59/245 |
| | | 264/494 |
| 8,282,381 B1* | 10/2012 | Zhu ........................ B82Y 40/00 |
| | | 264/293 |
| 8,344,065 B2* | 1/2013 | Zhu ........................ G03F 7/0002 |
| | | 264/293 |
| 8,574,822 B2* | 11/2013 | Zhu ........................ B82Y 10/00 |
| | | 522/120 |
| 8,822,125 B2* | 9/2014 | Kim ........................ G03F 7/0002 |
| | | 430/286.1 |
| 2002/0142227 A1 | 10/2002 | Dhar et al. |
| 2003/0053774 A1 | 3/2003 | Blomquist et al. |
| 2003/0096172 A1 | 5/2003 | Ichihashi et al. |
| 2003/0139486 A1 | 7/2003 | Yamada et al. |
| 2003/0206320 A1 | 11/2003 | Cole et al. |
| 2004/0027625 A1 | 2/2004 | Trentler et al. |
| 2004/0038035 A1 | 2/2004 | Johnson et al. |
| 2004/0197670 A1 | 10/2004 | Takeyama |
| 2005/0058911 A1 | 3/2005 | Takeyama |
| 2005/0064333 A1 | 3/2005 | Crivello |
| 2006/0069222 A1 | 3/2006 | Chisholm et al. |
| 2006/0223921 A1 | 10/2006 | Bauer et al. |
| 2007/0078198 A1 | 4/2007 | Otsuji et al. |
| 2008/0312403 A1 | 12/2008 | Stockel et al. |
| 2009/0023879 A1 | 1/2009 | Wanders et al. |
| 2009/0185470 A1 | 7/2009 | Stoeckel et al. |

(Continued)

FOREIGN PATENT DOCUMENTS

| | | |
|---|---|---|
| CN | 1795166 A | 6/2006 |
| CN | 1867566 A | 11/2006 |

(Continued)

OTHER PUBLICATIONS

Zhu et al. UV-based nanoimprinting lithography with a fluorinated flexible stamp. Journal of Vacuum Science & Technology B Mar. 1, 2011; 29 (2): 021015. (Year: 2011).*
Lan et al. UV-Nanoimprint Lithography: Structure, Materials and Fabrication of Flexible Molds. Journal of Nanoscience and Nanotechnology, vol. 13, 3145-3172, 2013. (Year: 2013).*
Corrected Notice of Allowance dated Jun. 12, 2023 for U.S. Appl. No. 17/098,130, filed Nov. 13, 2020, 2 pages.
Corrected Notice of Allowance datd Jul. 13, 2023 for U.S. Appl. No. 17/386,280, filed Jul. 27, 2021, 4 pages.

(Continued)

*Primary Examiner* — Sanza L. McClendon
(74) *Attorney, Agent, or Firm* — Morgan, Lewis & Bockius LLP

(57) ABSTRACT

Disclosed herein is a nanoimprint lithography (NIL) soft mold precursor material comprising a curable fluorinated base resin component, one or more additives, one or more crosslinkers, and one or more of a photo radical generator, a photo acid generator, or both. According to certain embodiments, further disclosed herein are a polymeric material comprising a partially or totally polymerized or cross-linked NIL precursor material, a NIL soft mold comprising the polymeric material, a process for making the NIL soft mold, and a method of using the NIL soft mold to form a NIL grating.

18 Claims, 11 Drawing Sheets

(56) References Cited

U.S. PATENT DOCUMENTS

| | | |
|---|---|---|
| 2009/0195847 A1 | 8/2009 | Mikoshiba et al. |
| 2009/0247660 A1 | 10/2009 | Park et al. |
| 2009/0295041 A1* | 12/2009 | Petrucci-Samija ............ B29C 35/0888 264/494 |
| 2009/0310196 A1 | 12/2009 | Shimizu et al. |
| 2010/0086860 A1 | 4/2010 | Roelle et al. |
| 2010/0086861 A1 | 4/2010 | Weiser et al. |
| 2010/0087564 A1 | 4/2010 | Weiser et al. |
| 2010/0112459 A1 | 5/2010 | Weiser et al. |
| 2010/0197821 A1 | 8/2010 | Jeong et al. |
| 2010/0197824 A1 | 8/2010 | Bissinger et al. |
| 2010/0197876 A1 | 8/2010 | Lyu et al. |
| 2010/0203241 A1 | 8/2010 | Weiser et al. |
| 2010/0221646 A1 | 9/2010 | Kawamonzen et al. |
| 2011/0065827 A1 | 3/2011 | Fäcke et al. |
| 2011/0092612 A1 | 4/2011 | Miki et al. |
| 2011/0207029 A1 | 8/2011 | Hagen et al. |
| 2011/0311906 A1 | 12/2011 | Rölle et al. |
| 2012/0010315 A1 | 1/2012 | Rhee et al. |
| 2012/0161088 A1 | 6/2012 | Choi et al. |
| 2012/0219884 A1 | 8/2012 | Weiser et al. |
| 2012/0219885 A1 | 8/2012 | Facke et al. |
| 2013/0038939 A1 | 2/2013 | Walker, Jr. et al. |
| 2013/0241092 A1 | 9/2013 | Takeuchi et al. |
| 2013/0252140 A1 | 9/2013 | Facke et al. |
| 2013/0270535 A1 | 10/2013 | Pillow et al. |
| 2014/0072720 A1 | 3/2014 | Watkins et al. |
| 2014/0170345 A1 | 6/2014 | Aoshima et al. |
| 2014/0349218 A1 | 11/2014 | Shimizu et al. |
| 2015/0050479 A1 | 2/2015 | Nakamura et al. |
| 2015/0050480 A1 | 2/2015 | Suzuki et al. |
| 2015/0057422 A1 | 2/2015 | Kondo et al. |
| 2015/0118601 A1 | 4/2015 | Rolle et al. |
| 2015/0212487 A1 | 7/2015 | Azakami et al. |
| 2016/0046551 A1 | 2/2016 | Shiota et al. |
| 2016/0046552 A1 | 2/2016 | Shiota et al. |
| 2016/0109618 A1 | 4/2016 | Hunt et al. |
| 2016/0252808 A1 | 9/2016 | Berneth et al. |
| 2017/0045816 A1 | 2/2017 | Facke et al. |
| 2017/0303957 A1 | 10/2017 | Vidal et al. |
| 2017/0362165 A1 | 12/2017 | Facke et al. |
| 2017/0363957 A1 | 12/2017 | Roelle et al. |
| 2017/0369783 A1 | 12/2017 | Horiguchi et al. |
| 2018/0079925 A1 | 3/2018 | Lyon et al. |
| 2018/0208531 A1 | 7/2018 | Yen et al. |
| 2018/0217311 A1 | 8/2018 | Hiraoka et al. |
| 2018/0217312 A1 | 8/2018 | Hiraoka et al. |
| 2018/0223107 A1 | 8/2018 | Monickam et al. |
| 2020/0247073 A1* | 8/2020 | Rao ............ G02B 1/04 |
| 2020/0249568 A1* | 8/2020 | Rao ............ C09D 163/00 |
| 2020/0354311 A1 | 11/2020 | Lane et al. |
| 2020/0355997 A1 | 11/2020 | Lane et al. |
| 2021/0155581 A1 | 5/2021 | Purvis et al. |
| 2021/0155584 A1 | 5/2021 | Purvis et al. |
| 2021/0155585 A1 | 5/2021 | Purvis et al. |
| 2021/0155599 A1 | 5/2021 | Purvis et al. |
| 2022/0153693 A1 | 5/2022 | Purvis, II et al. |
| 2022/0153895 A1 | 5/2022 | Purvis, II et al. |

FOREIGN PATENT DOCUMENTS

| | | | |
|---|---|---|---|
| CN | 101713923 A | 5/2010 | |
| CN | 102574877 A | 7/2012 | |
| CN | 102850622 A | 1/2013 | |
| CN | 102854746 A | 1/2013 | |
| CN | 103153948 A | 6/2013 | |
| CN | 103254083 A | 8/2013 | |
| CN | 103755742 A | 4/2014 | |
| CN | 104003907 A | 8/2014 | |
| CN | 104395960 A | 3/2015 | |
| CN | 105418674 A | 3/2016 | |
| DE | 2365631 A1 | 10/1975 | |
| EP | 0320954 A2 | 6/1989 | |
| EP | 0415729 A2 | 3/1991 | |
| EP | 0775591 A2 | 5/1997 | |
| EP | 1512704 A1 | 3/2005 | |
| EP | 1627867 A1 | 2/2006 | |
| EP | 1708180 A2 | 10/2006 | |
| EP | 1792923 A1 | 6/2007 | |
| EP | 1873174 A1 * | 1/2008 | ......... B29C 37/0053 |
| EP | 2065890 A2 | 6/2009 | |
| EP | 2172504 A1 | 4/2010 | |
| EP | 2221664 A1 * | 8/2010 | ............. B82Y 10/00 |
| EP | 2228846 A1 | 9/2010 | |
| EP | 2330173 A2 | 6/2011 | |
| EP | 2354845 A1 | 8/2011 | |
| EP | 2735903 A1 | 5/2014 | |
| EP | 1984318 B1 | 8/2015 | |
| EP | 3107522 B1 | 10/2018 | |
| EP | 3747861 A1 | 12/2020 | |
| IT | 20070022 A1 | 10/2008 | |
| JP | H02150410 A | 6/1990 | |
| JP | H06123858 A | 5/1994 | |
| JP | H06301322 A | 10/1994 | |
| JP | H07145138 A | 6/1995 | |
| JP | H0816077 A | 1/1996 | |
| JP | H10259219 A | 9/1998 | |
| JP | H1114801 A | 1/1999 | |
| JP | 2000344716 A | 12/2000 | |
| JP | 2000356702 A | 12/2000 | |
| JP | 2001125474 A | 5/2001 | |
| JP | 2001288177 A | 10/2001 | |
| JP | 2003029400 A | 1/2003 | |
| JP | 2003029604 A | 1/2003 | |
| JP | 2003167124 A | 6/2003 | |
| JP | 2005129139 A | 5/2005 | |
| JP | 2005263988 A | 9/2005 | |
| JP | 2006208772 A | 8/2006 | |
| JP | 2007084815 A | 4/2007 | |
| JP | 2008179777 A | 8/2008 | |
| JP | 2008266632 A | 11/2008 | |
| JP | 2008285468 A | 11/2008 | |
| JP | 2009047871 A | 3/2009 | |
| JP | 2009079013 A | 4/2009 | |
| JP | 2009091459 A | 4/2009 | |
| JP | 2009256275 A | 11/2009 | |
| JP | 2010077274 A | 4/2010 | |
| JP | 2010096942 A | 4/2010 | |
| JP | 2010150462 A | 7/2010 | |
| JP | 2010208911 A | 9/2010 | |
| JP | 2011168526 A | 9/2011 | |
| JP | 2011170073 A | 9/2011 | |
| JP | 2011225469 A | 11/2011 | |
| JP | 2012082387 A | 4/2012 | |
| JP | 2012224569 A | 11/2012 | |
| JP | 2013014533 A | 1/2013 | |
| JP | 2013043383 A | 3/2013 | |
| JP | 2013122643 A | 6/2013 | |
| JP | 5257805 B1 | 8/2013 | |
| JP | 2013193958 A | 9/2013 | |
| JP | 2014001215 A | 1/2014 | |
| JP | 2014063104 A | 4/2014 | |
| JP | 2014132000 A | 7/2014 | |
| JP | 2015117358 A | 6/2015 | |
| JP | 2016109983 A | 6/2016 | |
| JP | 2016160420 A | 9/2016 | |
| JP | 2017062343 A | 3/2017 | |
| JP | 2018188372 A | 11/2018 | |
| KR | 100727871 B1 | 6/2007 | |
| KR | 20090097120 A | 9/2009 | |
| KR | 20110100974 A | 9/2011 | |
| KR | 20140117220 A | 10/2014 | |
| TW | 201311639 A | 3/2013 | |
| TW | I480695 B | 4/2015 | |
| TW | I494327 B | 8/2015 | |
| WO | 03101955 A2 | 12/2003 | |
| WO | 2005016919 A1 | 2/2005 | |
| WO | WO-2005101466 A2 * | 10/2005 | ............. A61K 47/34 |
| WO | 2005114331 A1 | 12/2005 | |
| WO | 2008125199 A1 | 10/2008 | |
| WO | 2008125229 A1 | 10/2008 | |
| WO | 2010027676 A2 | 3/2010 | |

(56) References Cited

FOREIGN PATENT DOCUMENTS

| WO | 2011054792 | A1 | 5/2011 | |
|---|---|---|---|---|
| WO | WO-2012070833 | A2 * | 5/2012 | ............... C09D 4/00 |
| WO | 2013011893 | A1 | 1/2013 | |
| WO | 2015161969 | A1 | 10/2015 | |
| WO | 2017023642 | A1 | 2/2017 | |
| WO | 2017136711 | A1 | 8/2017 | |
| WO | 2018041132 | A1 | 3/2018 | |
| WO | 2018071920 | A1 | 4/2018 | |
| WO | 2019151463 | A1 | 8/2019 | |
| WO | 2019237117 | A1 | 12/2019 | |
| WO | 2021108191 | A1 | 6/2021 | |
| WO | 2021108232 | A1 | 6/2021 | |

OTHER PUBLICATIONS

Final Office Action mailed May 5, 2023 for U.S. Application No. 17/098, 173, filed Nov. 13, 2020, 12 pages.
Final Office Action dated Jun. 27, 2023 for U.S. Appl. No. 17/098,187, filed Nov. 13, 2020,17 pages.
International Preliminary Report on Patentability for International Application No. PCT/US2021/059208, dated May 25, 2023, 10 pages.
International Preliminary Report on Patentability for International Application No. PCT/US2021/059241, dated May 25, 2023, 10 pages.
Non-Final Office Action dated May 16, 2023 for U.S. Appl. No. 17/515,208, filed Oct. 29, 2021,19 pages.
Notice of Allowance dated May 8, 2023 for U.S. Appl. No. 17/386,280, filed Jul. 27, 2021,10 pages.
Notice of Allowance dated Jul. 10, 2023 for U.S. Appl. No. 16/865,073, filed May 1, 2020, 4 pages.
Notice of Allowance dated Jun. 16, 2023 for U.S. Appl. No. 16/865,073, filed May 1, 2020, 5 pages.
Notice of Allowance dated May 18, 2023 for U.S. Appl. No. 17/386,280, filed Jul. 27, 2021,4 pages.
Office Action dated Jun. 27, 2023 for European Patent Application No. 20709047.3, filed on Apr. 2, 2020, 5 pages.
Office Action dated May 4, 2023 for Chinese Patent Application No. 202080031926.0, filed on Oct. 27, 2021, 10 pages.
Clark K.J., "A New Method for the Preparation of 9:10 Disubstituted Anthracenes," Journal of the Chemical Society, 1956, pp. 1511-1515.
Corrected Notice of Allowability dated Jan. 9, 2023 for U.S. Appl. No. 17/098 130, filed Nov. 13, 2020, 6 pages.
Corrected Notice of Allowance dated Mar. 15, 2023 for U.S. Appl. No. 17/386,280, filed Jul. 27, 2021, 4 pages.
Final Office Action dated Apr. 3, 2023 for U.S. Appl. No. 16/778,492, filed Jan. 31, 2020, 16 pages.
Final Office Action dated Feb. 17, 2023 for U.S. Appl. No. 16/779,446, filed Jan. 31, 2020, 8 pages.
Hailer., et al., "Action of o- and p-anisyl Magnesium Bromide on Anthraquinone and 13- methylanthraquinone", Comptes Rendus, 1910, vol. 150, pp. 1290-1295.
Non-Final Office Action dated Jan. 12, 2023 for U.S. Appl. No. 17/098,166, filed Nov. 13, 2020, 15 pages.
Non-Final Office Action dated Mar. 17, 2023 for U.S. Appl. No. 17/098,146, filed Nov. 13, 2020, 16 pages.
Non-Final Office Action dated Jan. 19, 2023 for U.S. Appl. No. 17/098,187, filed Nov. 13, 2020, 23 pages.
Non-Final Office Action dated Apr. 21, 2023 for U.S. Appl. No. 17/098,166, filed Nov. 13, 2020, 10 pages.
Non-Final Office Action dated Jan. 23, 2023 for U.S. Appl. No. 17/098,173, filed Nov. 13, 2020, 17 pages.
Non-Final Office Action dated Jan. 24, 2023 for U.S. Appl. No. 16/865,066, filed May 1, 2020, 10 pages.
Notice of Allowance dated Mar. 8, 2023 for U.S. Appl. No. 16/865,073, filed May 1, 2020, 7 pages.
Notice of Allowance dated Dec. 21, 2022 for U.S. Appl. No. 17/098,130, filed Nov. 13, 2020, 9 pages.
Notice of Allowance dated Jan. 26, 2023 for U.S. Appl. No. 17/386,280, filed Jul. 27, 2021, 9 pages.
Notice of Allowance dated Mar. 31, 2023 for U.S. Appl. No. 17/098,130, filed Nov. 13, 2020, 7 pages.
Office Action dated Dec. 8, 2022 for Chinese Application No. 202080033443.4, filed May 5, 2020, 17 pages.
Patel M., et al., "Novel Catechol-Derived Phosphorus-Based Precursors for Coating Applications," Polymer Bulletin, Jun. 21, 2019, vol. 77, pp. 2183-2203.
Ludman J.E., et al., "Very Thick Holographic Non Spatial Filtering of Laser Beams," Optical Engineering, Jun. 1997, vol. 36 (6), pp. 1700-1705.
Machine Translation of JP2000344716A, dated Dec. 2000, 11 pages.
Machine Translation of JP525780581, dated Aug. 2013, 31 pages.
Murali R., et al., "Ionic Miscibility Enhancement in Poly(tetrafluoroethylene) / Poly(ethyl acrylate) Blends. I. Dynamic Mechanical Studies," Journal of Polymer Science, Part B: Polymer Physics, 1988, vol. 26, pp. 1385-1396.
Nakabayashi K., et al., "Poly(phenylene thioether)s with Fluorene-Based Carda Structure toward High Transparency, High Refractive Index, and LowBirefringence," Macromolecules, Aug. 23, 2016, vol. 49 (16), XP055713197, 7 pages.
Nakawaga Y., "Synthesis of Highly Refractive Poly(phenylene thioether) Derived from 2,4-Dicloro-6-alkylthio-1,3,5-triazines and Aromatic Dithiols," Macromolecules, ACS Publications, 2011 American Chemical Society, 2011, vol. 44, pp. 9180-9186.
Natansohn A., et al., "Miscibility Enhancement in Polymers Via lonic Interactions: Dynamic Mechanical and NMR Studies," Makromolekulare Chemical Macromolecular Symposia, Mar. 1988, vol. 16, pp. 175-193.
Non-Final Office Action dated Feb. 16, 2022 for U.S. Appl. No. 17/098,130, filed Nov. 13, 2020, 16 pages.
Non-Final Office Action dated Dec. 9, 2022 for U.S. Appl. No. 16/778,492, filed Jan. 31, 2020, 11 pages.
Non-Final Office Action dated May 12, 2022 for U.S. Appl. No. 16/865,066, filed May 1, 2020, 14 pages.
Non-Final Office Action dated Aug. 17, 2022 for U.S. Appl. No. 16/779,446, filed Jan. 31, 2020, 9 pages.
Non-Final Office Action dated May 17, 2022 for U.S. Appl. No. 16/865,073, filed May 1, 2020, 20 Pages.
Non-Final Office Action dated May 19, 2021 for U.S. Appl. No. 16/865,066, filed May 1, 2020, 13 Pages.
Non-Final Office Action dated Jun. 22, 2022 for U.S. Appl. No. 17/098,146, filed Nov. 13, 2020, 13 pages.
Non-Final Office Action dated May 25, 2021 for U.S. Appl. No. 16/865,073, filed May 1, 2020, 20 Pages.
Non-Final Office Action dated Oct. 3, 2022 for U.S. Appl. No. 17/386,280, filed Jul. 27, 2021, 11 pages.
Notice of Allowance dated Oct. 4, 2022 for U.S. Appl. No. 16/865,066, filed May 1, 2020, 10 pages.
Olabisi O., et al., "Polymer-Polymer Miscibility," Academic Press, New York, 1979, 384 pages.
Piton M.C., et al., "Charge-Transfer Interactions in Copolymer Blends. 3. Poly[(N-ethylcarbazol-3-yl)methyl methacrylate-co-styrene] Blended with Poly[2-[(3,5-dinitrobenzoyl)oxy]ethyl methacrylate-co-methyl methacrylate]," Macromolecules, Feb. 1, 1995, vol. 28 (5), pp. 1605-1608.
Pradana A., et al., "Tailoring the Refractive Index of Nanoimprint Resist by Blending With TiO2 Nanoparticles," Optical Materials Express, Jan. 24, 2014, vol. 4, No. 2, 9 pages.
Saccone M., et al., "Halogen-Bonded Photoresponsive Materials," Top Curr. Chem., vol. 359, Jan. 1, 2015, pp. 147-166.
Sigma-Aldrich: "Pentaerythritol Triacrylate," May 15, 2020, 4 Pages, XP055696130, Retrieved from the Internet: URL: https://www.sigmaaldrich.com/IN/en/product/aldrich/246794.
Sigma-Aldrich: "Poly (Ethylene Glycol) Methacrylate," May 15, 2020, 3 Pages, XP055696050, Retrieved from the Internet: URL: https://www.sigmaaldrich.com/IN/en/substance/polyethyleneglycolmethacrylate1234525736861?context=product.
Smothers W.K., et al., "Photopolymers for Holography," SPIE Practical Holography IV, 1990, vol. 1212, pp. 20-29.

(56) References Cited

OTHER PUBLICATIONS

Taylor-Smith R.E., et al., "Probing Interdomain Mixing Effects via Specific Interactions: A Model System Approach," Macromolecules, May 1, 1993, vol. 26 (11), pp. 2802-2809.
Vita F., et al., "Effects of Resin Addition on Holographic Polymer Dispersed Liquid Crystals," Journal of Optics. A: Pure and Applied Optics, Institute of Physics Publishing, 2009, vol. 11, No. 2, 5 pages.
White J.L., et al., "Heteronuclear Correlation in Solid Polymers: Identification of Hydrogen Bond Donors and Acceptors in Miscible Polymer Blends," Macromolecules, 1994, vol. 27 (6), pp. 1648-1650.
White J.L., et al., "Probin Miscibility and Intermolecular Interactions in Solid Polymer Blends Using the Nuclear Overhauser Effect," Macromolecules, 1993, vol. 26 (12), pp. 3049-3054.
Yan L., et al., "Copolytnerization of (10-oxo-10-hydro-9-oxa-10Lamda5-Phosphaphenanthrene-10-yl)-Methyl Acrylate with Styrene," Chinese Chemical Letters, 2009, vol. 20, pp. 881-884.
Yoon H., et al., "Effect of Acrylate Monomers on the Diffraction Behavior of Photopolymers Fabricated with Cellulose Ester Polymer Binder," Optical Materials, Nov. 6, 2004, vol. 27, No. 6, pp. 1190-1196.
You N-H., et al., "Highly Refractive Polymer Resin Derived from Sulfur-Containing Aromatic Acrylate," Journal of Polymer Science, Part A: Polymer Chemistry, vol. 48 (12), Jun. 15, 2010, XP055704696, pp. 2604-2609.
Zhao X., et al., "Synthesis and Charcterization of Thianthrene-Based Epoxy with High Refractive Index Over 1.7," Phosphorus, Sulfur and Silicon and the Related Elements, Sep. 5, 2017, vol. 193 (1), XP055704972, pp. 33-40.
Zhou Z-L., et al., "Ionomeric Blends, II. Compatibility and Dynamic Mechanical Properties of Sulfonated cis-1,4-Polyisoprenes and Styrene/4-Vinylpyridine Copolymer Blends," Journal of Polymer Science, Polymer Physics Edition, 1983, vol. 21, pp. 595-603.
Aldrich, "Controlled Radical Polymerization Guide: ATRP, RAFT, NMP," 2012, 52 pages.
Alim M.D., et al., "High Dynamic Range (Δn) Two-Stage Photopolymers via Enhanced Solubility of a High Refractive Index Acrylate Writing Monomer," Applied Materials and Interfaces, 2018, vol. 10 (1), pp. 1217-1224.
"Amonil & Amoprime—Low Viscosity Imprint Resist and Adhesion Promoter," AMO GmBH [online], May 15, 2020, 2 Pages, XP055696154, Retrieved from the Internet: URL: https://www.amo.de/wp-content/uploads/2017/04/FactSheetAMONIL.pdf.
Arimitsu K., et al., "Preparation of Base-Amplifying Microcapsules and Their Application to Photoreactive Materials," Journal of Polymer Science, Part A: Polymer Chemistry, Nov. 1, 2015, vol. 53 (21), pp. 2440-2443.
Bier F., et al., "DOPO-Based Phosphorus-Containing Methacrylic (Co) Polymers: Glass Transition Temperature Investigation," Macro Molecular Materials and Engineering, Jan. 11, 2019, vol. 304, pp. 1-11.
Brinke G.T., et al., "The Thermal Characterization of Multicomponent Systems by Enthalpy Relaxation," Thermochimica Acta, 1994, vol. 238, pp. 75-98.
Chodkiewicz W., et al., "Stereochemistry of Meso-Dihydroanthracene Quinols," Chemical Abstracts Service, Jan. 1, 1962, pp. 954-956.
Christian P., "Some Ethers and Esters from Meso-Dichlorodiphenylanthracene.Stereoisomerism of the Meso Ethers," Chemical Abstracts Service, Jan. 1, 1948, pp. 503-505.
Clark K.J., "84. The Preparation of 9 : 10-Di-(4-Carboxybutyl)Anthracene and Related Reactions," Journal Of The Chemical Society, Jan. 1, 1957, pp. 463-466.
Colburn W.S., et al., "vol. Hologram Formation in Photopolymer Materials," Applied Optics, Jul. 1971, vol. 10, No. 7, pp. 1636-1641.
Co-pending U.S. Appl. No. 17/515,194, inventors Austin; Lane et al., filed Oct. 29, 2021.
Co-pending U.S. Appl. No. 17/515,208, inventors Austin; Lane et al., filed Oct. 29, 2021.
Co-pending U.S. Appl. No. 16/779,446, filed Jan. 31, 2020, 141 Pages.

Cruz., et al., "The Basis for Miscibility in Polyester-Polycarbonate Blends," Macromolecules, American Chemical Society, Jul.-Aug. 1979, vol. 12, No. 4, pp. 726-731.
Devlin N.R., et al., "Patterning Decomposable Polynorbornene with Electron Beam Lithography to Create Nanochannels," Journal of Vacuum Science and Technology, vol. 27, No. 6, Dec. 1, 2009, pp. 2508-2511.
Dong J., et al., "Self-Assembly of Highly Stable Zirconium(IV) Coordination Cages with Aggregation Induced Emission Molecular Rotors for Live-Cell Imaging," Angewandte Chemie International Edition, vol. 59, No. 25, Jun. 15, 2020, 10 pages.
Final Office Action dated Oct. 20, 2022 for U.S. Appl. No. 16/865,073, filed May 1, 2020, 17 pages.
Final Office Action dated Dec. 21, 2021 for U.S. Appl. No. 16/865,073, filed May 1, 2020, 21 pages.
Final Office Action dated Jul. 28, 2022 for U.S. Appl. No. 17/098,130, filed Nov. 13, 2020, 14 pages.
Final Office Action dated Oct. 28, 2022 for U.S. Appl. No. 17/098,146, filed Nov. 13, 2020, 17 pages.
Final Office Action dated Nov. 29, 2021 for U.S. Appl. No. 16/865,066, filed May 1, 2020, 13 pages.
Gadwal I., et al., "A New Approach for the Synthesis of Miktoarm Star Polymers Through a Combination of Thioi-Epoxy "Click" Chemistry and ATRP/Ring-Opening Polymerization Techniques," Journal of Polymer Science Part A: Polymer Chemistry, Oct. 31, 2018, vol. 57, No. 2, 11 pages.
Gadwal I., et al., "Multiply Functionalized Dendrimers: Protectivegroup-Free Synthesis Through Sequential Thiol-Epoxy 'click' Chemistry and Esterification Reaction," RSC Advances, May 4, 2015, vol. 5, No. 55, 5 pages.
Goldenberg L.M., et al., "Very Efficient Surface Relief Holographic Materials Based on Azobenzene-Containing Epoxy Resins Cured in Films," Journal Of Materials Chemistry, Jan. 1, 2010, vol. 20, No. 41, pp. 9161-9171.
Greene T.W., et al., "Protective Groups in Organic Synthesis," Third Edition, 1999, 799 pages.
Inan T.Y., et al."Preparation and Characterization of Novel UV-Curable Urethane Methacrylate Difunctional Monomers and their Structure-Property Relationships, 1," Macromolecular Chemistry and Physics, 2001, vol. 202, No. 4, pp. 532-540.
International Preliminary Report on Patentability for International Application No. PCT/US2020/016584, dated Aug. 19, 2021, 9 Pages.
International Preliminary Report on Patentability for International Application No. PCT/US2020/061120, dated Jun. 9, 2022, 9 pages.
International Preliminary Report on Patentability for International Application No. PCT/US2020/061218, dated Jun. 9, 2022, 9 pages.
International Preliminary Report on Patentability for International Application No. PCT/US2020/061396, dated Jun. 9, 2022, 13 pages.
International Preliminary Report on Patentability for International Application No. PCT/US2020/061714, dated Jun. 9, 2022, 11 pages.
International Preliminary Report on Patentability for International Application No. PCT/US2020/062284, dated Jun. 9, 2022, 7 pages.
International Search Report and Written Opinion for International Application No. PCT/US2020/016584, dated May 27, 2020, 11 Pages.
International Search Report and Written Opinion for International Application No. PCT/US2020/031433, dated Jul. 20, 2020, 10 Pages.
International Search Report and Written Opinion for International Application No. PCT/US2020/031445, dated Jun. 29, 2020, 10 Pages.
International Search Report and Written Opinion for International Application No. PCT/US2020/061120, dated Feb. 19, 2021, 12 pages.
International Search Report and Written Opinion for International Application No. PCT/US2020/061218, dated Feb. 16, 2021, 11 pages.
International Search Report and Written Opinion for International Application No. PCT/US2021/059208, dated Apr. 19, 2022, 15 pages.

(56) References Cited

OTHER PUBLICATIONS

International Search Report and Written Opinion for International Application No. PCT/US2021/059241, dated Apr. 19, 2022, 15 pages.

International Search Report and Written Opinion for International Application PCT/US2022/022929, dated Aug. 30, 2022, 8 pages.

Kelts L.W., et al., "Two-Dimensional NMR of Synthetic Polymers: Polymer Blend Miscibility at the Molecular Level," Macromolecules, 1993, vol. 26 (11), pp. 2941-2949.

Kerker M., "The Scattering of Light and Other Electromagnetic Radiation," Academic Press, New york and London, 1969, pp. 1-486.

Kim J., et al., "Synthesis of Fluorene-containing Photosensitive Polymer and Its Application to the Carbon Black-based Photoresist for LCD Color-Filter," Polymer (Korea), 2011, vol. 35 (1), pp. 87-93.

Klein W.R., et al., "Unified Approach to Ultrasonic Light Diffraction," IEEE Transaction on Sonics and Ultrasonics, Jul. 1967, vol. 14, Issue 3, pp. 123-134.

Kothari R., et al., "Direct Imprint Patterning of 2-D and 3-D Nanoparticle/Polymer Hybrid and Crystalline Metal Oxide Structures for Printed Optical, Electronic, and Energy Devices," 2016 6th Electronic System-Integration Technology Conference (ESTC), 2016, pp. 1-2.

Landry C.J.T., et al., "Novel Miscible Blends of Etheric Polyphosphazenes with Acidic Polymers," Macromolecules, 1993, vol. 26, pp. 35-46.

Lesnichii V.V, et al., "Study of Diffusion in Bulk Polymer Films Below Glass Transition: Evidences of Dynamical Heterogeneities," Journal of Physics: Conference Series, 2018, 6 pages.

Liu H.Y., et al., "A Comparative Study of Amorphous, Anatase, Rutile, and Mixed Phase $TiO_2$ Films by Mist Chemical Vapor Deposition and Ultraviolet Photodetectors Applications," IEEE Sensors Journal, May 15, 2018, vol. 18, No. 10, pp. 4022-4029.

Liu Y., et al., "Influence of Chemical Structure of Monomers on Thermo-Stability of Holographic Polymer Dispersed Liquid Crystal Gratings," Acta Polymerica Sinica, Apr. 21, 2010, vol. 10, No. 4, pp. 408-415.

Corrected Notice of Allowance dated Sep. 8, 2023 for U.S. Appl. No. 17/098,130, filed Nov. 13, 2020, 2 pages.

Office Action dated Jul. 28, 2023 for Chinese Application No. 202080081563.1, filed May 24, 2022, 07 pages.

Office Action dated Jun. 30, 2023 for Chinese Application No. 202080081554.2, filed May 24, 2022, 5 pages.

\* cited by examiner

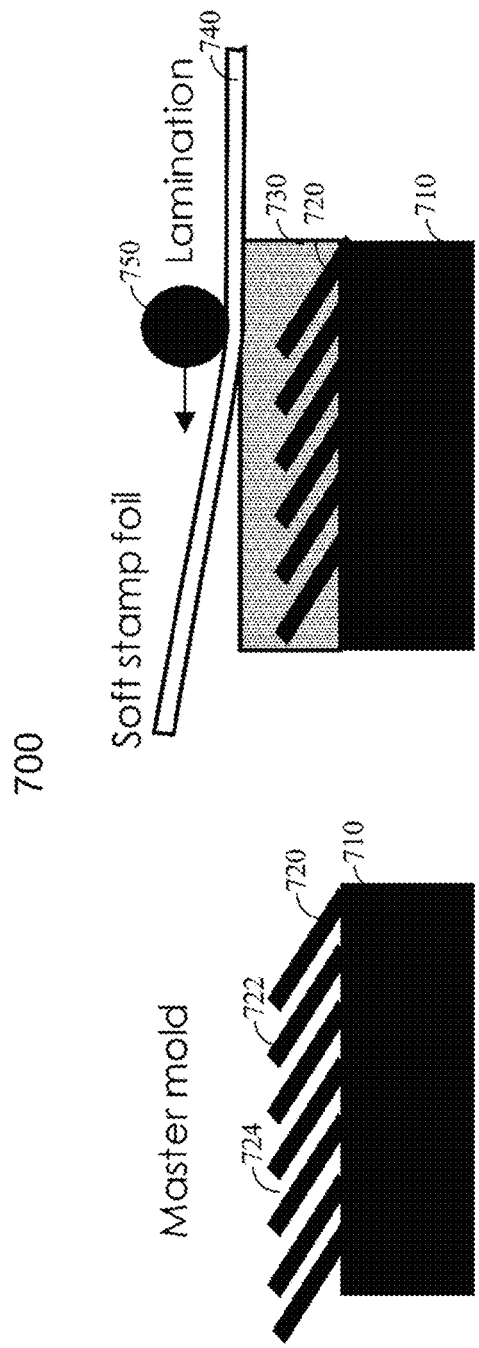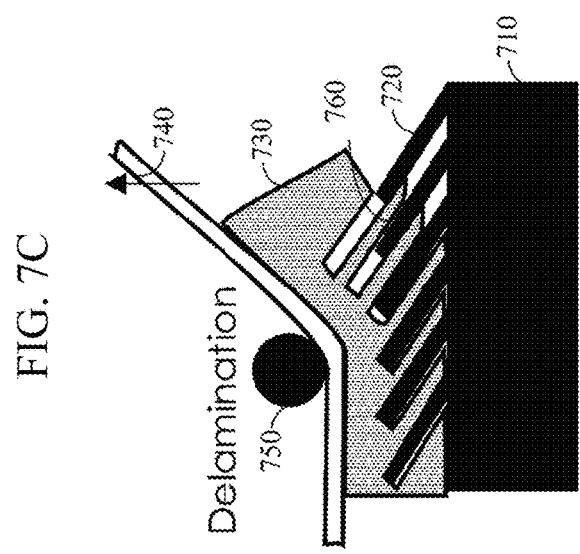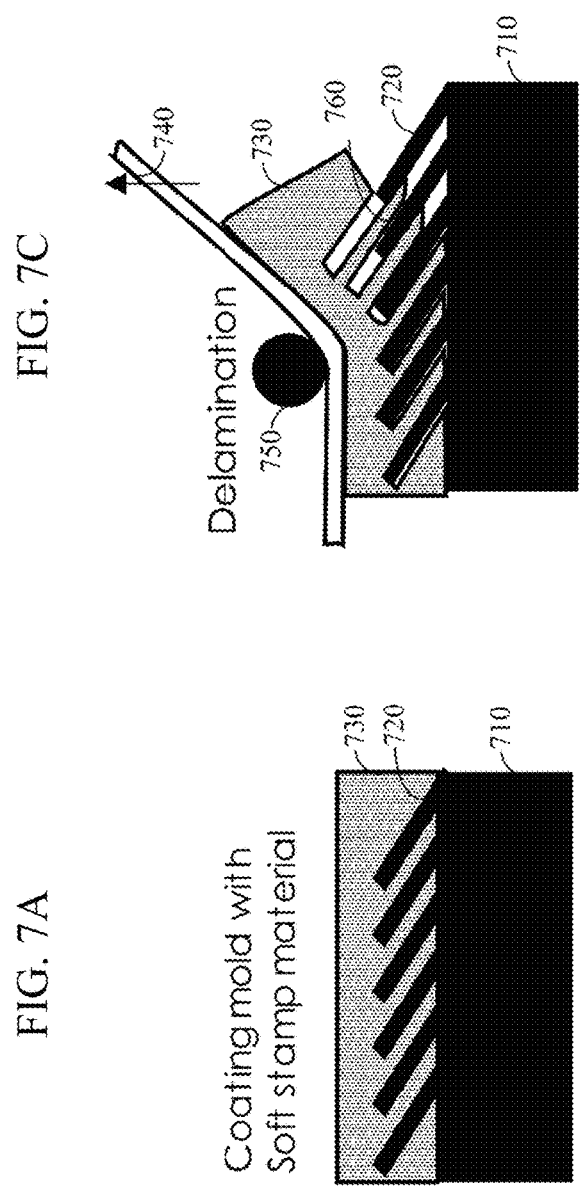
FIG. 7A
FIG. 7B
FIG. 7C
FIG. 7D

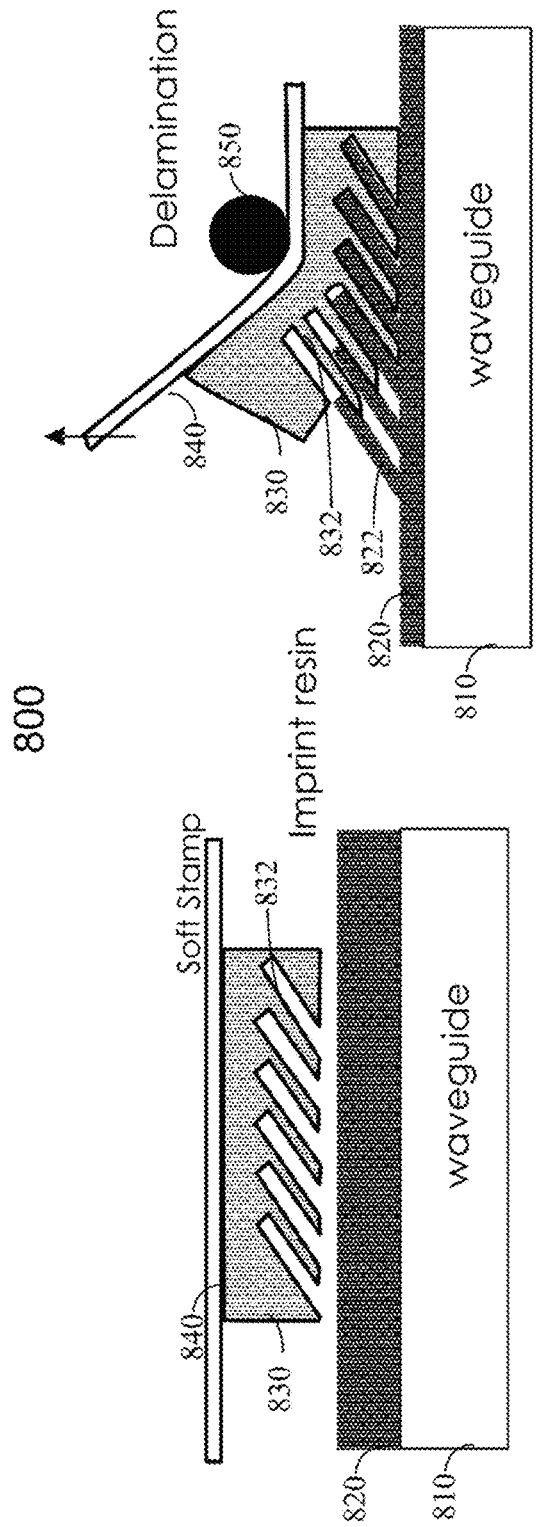
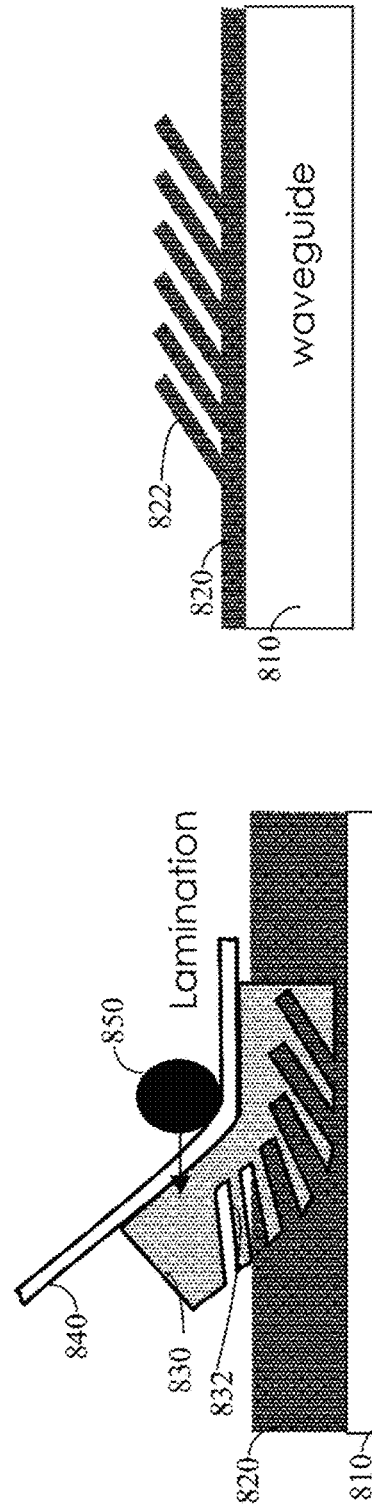
FIG. 8A
FIG. 8B
FIG. 8C
FIG. 8D

SOFT MOLD FORMULATIONS FOR SURFACE RELIEF GRATING FABRICATION WITH IMPRINTING LITHOGRAPHY

RELATED APPLICATIONS

This application claims the benefit of, and priority to, U.S. Provisional Patent Application Ser. No. 63/051,758, filed on Jul. 14, 2020, incorporated by reference herein in its entirety.

TECHNICAL FIELD

The present disclosure relates generally to nanoimprint lithography (NIL) soft mold precursor materials, various polymeric materials comprising a partially or totally polymerized or crosslinked NIL soft mold precursor material, NIL soft molds comprising such polymeric materials, and related processes for making NIL soft molds, and using NIL soft molds to form NIL gratings.

BACKGROUND

An artificial reality system, such as a head-mounted display (HMD) or heads-up display (HUD) system, generally includes a near-eye display (e.g., a headset or a pair of glasses) configured to present content to a user via an electronic or optic display within, for example, about 10-20 mm in front of the user's eyes. The near-eye display may display virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or lenses (often referred to as optical see-through).

One example optical see-through AR system may use a waveguide-based optical display, where light of projected images may be coupled into a waveguide (e.g., a substrate), propagate within the waveguide, and be coupled out of the waveguide at different locations. In some implementations, the light of the projected images may be coupled into or out of the waveguide using a diffractive optical element, such as a slanted surface-relief grating. To achieve desired performance, such as high efficiency, low artifact, and angular selectivity, deep surface-relief gratings with large slanted angles and wide ranges of grating duty cycles may be used. However, fabricating the slanted surface-relief grating with the desired profile at a high fabrication speed and high yield remains a challenging task.

SUMMARY

This disclosure relates generally to a nanoimprint lithography (NIL) precursor material comprising a curable fluorinated base resin component; one or more additives; one or more crosslinkers; and one or more of a radical generator, an acid generator, or both. According to certain embodiments, further disclosed herein are a polymeric material comprising a partially or totally polymerized or crosslinked NIL precursor material, a NIL soft mold comprising the polymeric material, a process for making the NIL soft mold, and a method of using the NIL soft mold to form a NIL grating.

The disclosure provides a nanoimprint lithography (NIL) soft mold precursor material, comprising a curable fluorinated base resin component; one or more additives; one or more crosslinkers; and one or more of a radical generator, an acid generator, or both.

In some embodiments, the base resin component is UV curable. In some embodiments, the base resin component comprises one or more UV curable groups. In some embodiments, each molecule of the base resin component comprises one or more UV curable groups. In some embodiments, the one or more UV curable groups is acrylate, epoxy, thiol, or a mixture thereof.

In some embodiments, the base resin component is thermal curable. In some embodiment, the component comprises one or more thermal curable groups. In some embodiments, each molecule of the base resin component comprises one or more thermal curable groups. In some embodiments, the one or more thermal curable groups is acrylate, epoxy, vinyl, thiol, or a mixture thereof.

In some embodiments, the base resin component comprises backbones of perfluoropolyether, fluorinated siloxane, or any derivatives thereof. In some embodiments, the base resin component comprises a tetra-functional perfluoropolyether acrylate. In some embodiments, the weight percent of the tetra-functional perfluoropolyether acrylate in the precursor material ranges from 40% to 80%. In some embodiments, the weight percent of the tetra-functional perfluoropolyether acrylate in the precursor material ranges from 45% to 70%. In some embodiments, the weight percent of the tetra-functional perfluoropolyether acrylate in the precursor material ranges from 53% to 60%. In some embodiments, the weight percent of the tetra-functional perfluoropolyether acrylate in the precursor material is about 25%, about 26%, about 27%, about 28%, about 29%, about 30%, about 31%, about 32%, about 33%, about 34%, about 35%, about 36%, about 37%, about 38%, about 39%, about 40%, about 41%, about 42%, about 43%, about 44%, about 45%, about 46%, about 47%, about 48%, about 49%, about 50%, about 51%, about 52%, about 53%, about 54%, about 55%, about 56%, about 57%, about 58%, about 59%, about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, about 85%, about 86%, about 87%, about 88%, about 89%, about 90%, about 91%, about 92%, about 93%, about 94%, or about 95%.

In some embodiments, the base resin component comprises backbones of perfluoropolyether, fluorinated siloxane, or any derivatives thereof. In some embodiments, the base resin component comprises a tri-functional perfluoropolyether acrylate. In some embodiments, the weight percent of the tri-functional perfluoropolyether acrylate in the precursor material ranges from 40% to 80%. In some embodiments, the weight percent of the tri-functional perfluoropolyether acrylate in the precursor material ranges from 45% to 70%. In some embodiments, the weight percent of the tri-functional perfluoropolyether acrylate in the precursor material ranges from 53% to 60%. In some embodiments, the weight percent of the tri-functional perfluoropolyether acrylate in the precursor material is about 25%, about 26%, about 27%, about 28%, about 29%, about 30%, about 31%, about 32%, about 33%, about 34%, about 35%, about 36%, about 37%, about 38%, about 39%, about 40%, about 41%, about 42%, about 43%, about 44%, about 45%, about 46%, about 47%, about 48%, about 49%, about 50%, about 51%, about 52%, about 53%, about 54%, about 55%, about 56%, about 57%, about 58%, about 59%, about 60%, about 61%, about 62%, about 63%, about 64%, about 65%, about 66%, about 67%, about 68%, about 69%, about 70%, about 71%, about 72%, about 73%, about 74%, about 75%, about 76%, about 77%, about 78%, about 79%, about 80%, about 81%, about 82%, about 83%, about 84%, about 85%, about 86%, about 87%, about 88%, about 89%, about 90%, about 91%, about 92%, about 93%, about 94%, or about 95%.

In some embodiments, the base resin component comprises a bi-functional perfluoropolyether acrylate. In some embodiments, the weight percent of the bi-functional perfluoropolyether acrylate in the precursor material ranges from 5% to 40%. In some embodiments, the weight percent of the bi-functional perfluoropolyether acrylate in the precursor material ranges from 15% to 30%. In some embodiments, the weight percent of the bi-functional perfluoropolyether acrylate in the precursor material ranges from 20% to 26%. In some embodiments, the weight percent of the bi-functional perfluoropolyether acrylate in the precursor material is about 1%, about 2%, about 3%, about 4%, about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, about 25%, about 26%, about 27%, about 28%, about 29%, about 30%, about 31%, about 32%, about 33%, about 34%, about 35%, about 36%, about 37%, about 38%, about 39%, about 40%, about 41%, about 42%, about 43%, about 44%, about 45%, about 46%, about 47%, about 48%, about 49%, or about 50%.

In some embodiments, the one or more additives comprises fluoro-hydrocarbon, fluoro-siloxane, polydimethylsiloxane, or a mixture thereof. In some embodiments, the one or more additives is a fluorinated acrylate oligomer. In some embodiments, the weight percent of the one or more additives in the precursor material ranges from 0.1% to 20%. In some embodiments, the weight percent of the one or more additives in the precursor material ranges from 1% to 15%. In some embodiments, the weight percent of the one or more additives in the precursor material ranges from 2% to 8%. In some embodiments, the weight percent of the one or more additives in the precursor material is about 1%, about 2%, about 3%, about 4%, about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, or about 25%.

In some embodiments, the one or more crosslinkers comprise a plurality of acrylate, thiol, vinyl or epoxy groups. In some embodiments, the one or more crosslinkers is acrylate or trimethylolpropane triacrylate. In some embodiments, the weight percent of the one or more crosslinkers in the precursor material ranges from 1% to 25%. In some embodiments, the weight percent of the one or more crosslinkers in the precursor material ranges from 5% to 20%. In some embodiments, the weight percent of the one or more crosslinkers in the precursor material ranges from 8% to 15%. In some embodiments, the weight percent of the one or more crosslinkers in the precursor material is about 1%, about 2%, about 3%, about 4%, about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, or about 25%.

In some embodiments, the one or more photo radical generators or photo acid generators is diphenyl(2,4,6-trimethylbenzoyl)phosphine oxide/2-hydroxy-2-methylpropiophenone. In some embodiments, the weight percent of the one or more photo radical generators or photo acid generators ranges from 0.1% to 20%. In some embodiments, the weight percent of the one or more photo radical generators or photo acid generators in the precursor material ranges from 1% to 15%. In some embodiments, the weight percent of the one or more photo radical generators or photo acid generators in the precursor material ranges from 2% to 8%. In some embodiments, the weight percent of the one or more photo radical generators or photo acid generators in the precursor material is about 0.1%, about 0.2%, about 0.3%, about 0.4%, about 0.5%, about 0.6%, about 0.7%, about 0.8%, about 0.9%, or about 1%. In some embodiments, the weight percent of the one or more photo radical generators or photo acid generators in the precursor material is about 1%, about 2%, about 3%, about 4%, about 5%, about 6%, about 7%, about 8%, about 9%, about 10%, about 11%, about 12%, about 13%, about 14%, about 15%, about 16%, about 17%, about 18%, about 19%, about 20%, about 21%, about 22%, about 23%, about 24%, or about 25%.

In some embodiments, the base resin component is light-sensitive.

In some embodiments, the base resin component comprises one or more crosslinkable monomers, one or more polymerizable monomers, or both. In some embodiments, the crosslinkable monomers or the polymerizable monomers comprise one or more crosslinkable or polymerizable moieties. In some embodiments, the crosslinkable or polymerizable moieties are selected from vinyl, allyl, epoxide, acrylate, and methacrylate. In some embodiments, the crosslinkable or polymerizable moieties are selected from optionally substituted alkenyl, optionally substituted cycloalkenyl, optionally substituted alkynyl, optionally substituted acrylate, optionally substituted methacrylate, optionally substituted styrene, optionally substituted epoxide, optionally substituted thiirane, optionally substituted lactone, and optionally substituted carbonate.

In some embodiments, the base resin component comprises one or more of (2,7-bis[(2-acryloyloxyethl)-sulfanyl] thianthrene), benzyl methacrylate, 1,6-hexanediol diacrylate, 1,4-butanediol diacrylate, acryloxypropylsilsesquioxane, or methylsilsesquioxane.

In some embodiments, the base resin component comprises one or more of trimethylolpropane (EO)n triacrylate, caprolactone acrylate, polypropylene glycol monomethacrylate, cyclic trimethylolpropane formal acrylate, phenoxy benzyl acrylate, 3,3,5-trimethyl cyclohexyl acrylate, isobornyl acrylate, o-phenylphenol EO acrylate, 4-tert-butylcyclohexyl acrylate, benzyl acrylate, benzyl methacrylate, biphenylmethyl acrylate, lauryl acrylate, lauryl methacrylate, tridecyl acrylate, lauryl tetradecyl methacrylate, isodecyl acrylate, isodecyl methacrylate, phenol (EO) acrylate, phenoxyethyl methacrylate, phenol (EO)2 acrylate, phenol (EO)4 acrylate, tetrahydrofurfuryl acrylate, tetrahydrofurfuryl methacrylate, nonyl phenol (PO)2 acrylate, nonyl phenol (EO)4 acrylate, nonyl phenol (EO)8 acrylate, ethoxy ethyl acrylate, stearyl acrylate, stearyl methacrylate, methoxy PEG600 methacrylate, 1,6-hexanediol diacrylate, 1,6-hexanediol dimethacrylate, 1,6-hexanediol (EO)n diacrylate, polypropylene glycol 400 diacrylate, 1,4-butanediol dimethacrylate, polypropylene glycol 700 (EO)6 dimethacrylate, 1,6-Hexanediol (EO)n diacrylate, hydroxy pivalic acid neopentyl glycol diacrylate, bisphenol A (EO)10 diacrylate, bisphenol A (EO)10 dimethacrylate, neopentyl glycol dimethacrylate, neopentyl glycol (PO)2 diacrylate, tripropylene glycol diacrylate, ethylene glycol dimethacrylate, dipropylene glycol diacrylate, bisphenol A (EO)30 diacrylate, bisphenol A (EO)30 dimethacrylate, diethylene glycol dimethacrylate, triethylene glycol diacrylate, triethylene glycol dimethacrylate, tetraethylene glycol dimethacrylate, bisphenol A (EO)4 diacrylate, bisphenol A (EO)4 dimethacrylate, bisphenol A (EO)3 diacrylate, bisphenol A (EO)3 dimethacrylate, 1,3-butylene glycol dimethacrylate, tricyclodecane dimethanol diacrylate, tetraethylene glycol diacrylate, polyethylene glycol 400 diacrylate, polyethylene glycol 400 dimethacrylate, polyethylene glycol 200 diacrylate, polyethylene glycol 200 dimethacrylate, polyethylene glycol 300 diacrylate, polyethylene glycol 600 diacrylate, polyethylene glycol 600 dimethacrylate, bisphenol F (EO)4 diacrylate, trimethylolpropane triacrylate, trimethylolpropane trimethacrylate, trimethylolpropane (EO)3 triacrylate, trimethylolpropane (EO)15 triacrylate, trimethylolpropane (EO)6 triacrylate, trimethylolpropane (EO)9 triacrylate, glycerine (PO)3 triacrylate, pentaerythritol triacrylate, trimethylolpropane (PO)3 triacrylate, tris(2-hydroxyethyl)isocyanurate triacrylate, pentaerythritol (EO)n tetraacrylate, ditrimethylolpropane tetraacrylate, pentaerythritol tetraacrylate, dipentaerythritol pentaacrylate, and dipentaerythritol hexaacrylate.

In some embodiments, the base resin component comprises one or more of a phosphate methacrylate, an amine acrylate, an acrylated amine synergist, a carboxylethyl acrylate, a modified epoxy acrylate, a bisfluorene diacrylate, a modified bisphenol fluorene diacrylate, a modified bisphenol fluorene type, a butadiene acrylate, an aromatic difunctional acrylate, an aliphatic multifunctional acrylate, a polyester acrylate, a trifunctional polyester acrylate, a tetrafunctional polyester acrylate, a phenyl epoxy acrylate, a bisphenol A epoxy acrylate, a water soluble acrylate, an aliphatic alkyl epoxy acrylate, a bisphenol A epoxy methacrylate, a soybean oil epoxy acrylate, a difunctional polyester acrylate, a trifunctional polyester acrylate, a tetrafunctional polyester acrylate, a chlorinated polyester acrylate, a hexafunctional polyester acrylate, an aliphatic difunctional acrylate, an aliphatic difunctional methacrylate, an aliphatic trifunctional acrylate, an aliphatic trifunctional methacrylate, an aromatic difunctional acrylate, an aromatic tetrafunctional acrylate, an aliphatic tetrafunctional acrylate, an aliphatic hexafunctional acrylate, an aromatic hexafunctional acrylate, an acrylic acrylate, a polyester acrylate, a sucrose benzoate, a caprolactone methacrylate, a caprolactone acrylate, a phosphate methacrylate, an aliphatic multifunctional acrylate, a phenol novolac epoxy acrylate, a cresol novolac epoxy acrylate, an alkali strippable polyester acrylate, a melamine acrylate, a silicone polyester acrylate, a silicone urethane acrylate, a dendritic acrylate, an aliphatic tetrafunctional methacrylate, a water dispersion urethane acrylate, a water soluble acrylate, an aminated polyester acrylate, a modified epoxy acrylate, or a trifunctional polyester acrylate.

In some embodiments, the base resin component further comprises one or more fluorinated compounds. In some embodiments, the one or more fluorinated compounds are selected from: 2,2,3,3,4,4,5,5,6,6,7,7-dodecafluoroheptyl acrylate, 3,3,4,4,5,5,6,6,7,7,8,8,9,9,10,10,11,11,12,12,12-heneicosafluorododecyl acrylate, 3,3,4,4,5,5,6,6,7,7,8,8,9,9,10,10,10-heptadecafluorodecyl methacrylate, 2,2,3,3,4,4,4-heptafluorobutyl acrylate, 2,2,3,3,4,4,4-heptafluorobutyl methacrylate, 2,2,3,4,4,4-hexafluorobutyl acrylate, 2,2,3,4,4,4-hexafluorobutyl methacrylate, 1,1,1,3,3,3-hexafluoroisopropyl acrylate, 1,1,1,3,3,3-hexafluoroisopropyl methacrylate, 2,2,3,3,4,4,5,5-octafluoropentyl acrylate, 2,2,3,3,4,4,5,5-octafluoropentyl methacrylate, 2,2,3,3,3-pentafluoropropyl acrylate, 2,2,3,3,3-pentafluoropropyl methacrylate, 1H,1H,2H,2H-perfluorodecyl acrylate, 2,2,3,3-tetrafluoropropyl methacrylate, 3,3,4,4,5,5,6,6,7,7,8,8,8-tridecafluorooctyl acrylate, 3,3,4,4,5,5,6,6,7,7,8,8,8-tridecafluorooctyl methacrylate, 2,2,2-trifluoroethyl methacrylate, and 2-[(1',1',1'-trifluoro-2'-(trifluoromethyl)-2'-hydroxy)propyl]-3-norbornyl methacrylate.

In some embodiments, the viscosity of the precursor material ranges from 1 cps to 3500 cps. In some embodiments, the viscosity of the precursor material ranges from 50 cps to 3000 cps. In some embodiments, the viscosity of the precursor material ranges from 200 cps to 2800 cps. In some embodiments, the viscosity of the precursor material is between 200 cps and 300 cps, between 300 cps and 400 cps, between 400 cps and 500 cps, between 500 cps and 600 cps, between 600 cps and 700 cps, between 700 cps and 800 cps, between 800 cps and 900 cps, between 900 cps and 1000 cps, between 1000 cps and 1100 cps, between 1100 cps and 1200 cps, between 1200 cps and 1300 cps, between 1300 cps and 1400 cps, between 1400 cps and 1500 cps, between 1500 cps and 1600 cps, between 1600 cps and 1700 cps, between 1700 cps and 1800 cps, between 1800 cps and 1900 cps, between 1900 cps and 2000 cps, between 2000 cps and 2100 cps, between 2100 cps and 2200 cps, between 2200 cps and 2300 cps, between 2300 cps and 2400 cps, between 2400 cps and 2500 cps, between 2500 cps and 2600 cps, between 2600 cps and 2700 cps, or between 2700 cps and 2800 cps.

The disclosure further provides a polymeric material comprising a partially or totally polymerized or crosslinked precursor material.

In some embodiments, the polymerized or crosslinked precursor material has a modulus ranging from 50 MPa to 2.5 GPa. In some embodiments, the polymerized or crosslinked precursor material has a modulus ranging from 80 MPa to 2 GPa. In some embodiments, the polymerized or crosslinked precursor material has a modulus ranging from 100 MPa to 1.5 GPa.

In some embodiments, the polymerized or crosslinked precursor material has a water contact angle ranging from 90° to 115°. In some embodiments, the polymerized or crosslinked precursor material has a water contact angle ranging from 92° to 113°. In some embodiments, the polymerized or crosslinked precursor material has a water contact angle ranging from 93° to 110°. Without wishing to be bound by any particular theory, it is believed that polymerized or crosslinked precursor material can be made as described herein with an water contact angle of as low as 65°, however such materials may suffer from adhesion issues.

The disclosure further provides a NIL soft mold comprising the polymeric material.

In some embodiments, the mold further comprises a microstructure. In some embodiments, the microstructure has a duty cycle ranging from 10% to 90%. In some embodiments, the microstructure has a duty cycle ranging from 20% to 70%. In some embodiments, the microstructure has a duty cycle ranging from 25% to 55%.

In some embodiments, the microstructure has a duty cycle ranging from 0.10 to 0.90. In some embodiments, the microstructure has a duty cycle ranging from 0.20 to 0.70. In some embodiments, the microstructure has a duty cycle ranging from 0.25 to 0.55.

In some embodiments, the microstructure is a binary structure.

In some embodiments, the microstructure is a non-slanted grating. In some embodiments, the microstructure is a slanted grating. In some embodiments, a slant angle ranges from more than 0° to about 70°. In some embodiments, a slant angle is greater than 30°. In some embodiments, a slant angle is greater than 35°.

In some embodiment, the microstructure has a pitch from about 100 nm to about 700 nm. In some embodiment, the microstructure has a pitch of about 100 nm. In some embodiment, the microstructure has a pitch of about 150 nm. In some embodiment, the microstructure has a pitch of about 200 nm. In some embodiment, the microstructure has a pitch of about 250 nm. In some embodiment, the microstructure has a pitch of about 300 nm. In some embodiment, the microstructure has a pitch of about 350 nm. In some embodiment, the microstructure has a pitch of about 400 nm. In some embodiment, the microstructure has a pitch of about 450 nm. In some embodiment, the microstructure has a pitch of about 500 nm. In some embodiment, the microstructure has a pitch of about 550 nm. In some embodiment, the microstructure has a pitch of about 600 nm. In some embodiment, the microstructure has a pitch of about 650 nm. In some embodiment, the microstructure has a pitch of about 700 nm.

In some embodiments, the microstructure has a depth from about 30 nm to about 450 nm. In some embodiments, the microstructure has a depth from about 50 nm to about 350 nm. In some embodiments, the microstructure has a depth from about 75 nm to about 300 nm. In some embodiments, the microstructure has a depth greater than 100 nm and lower than 500 nm.

In some embodiments, the microstructure has an aspect ratio from 0.5:1 to 6:1. In some embodiments, the microstructure has an aspect ratio from 1:1 to 5:1. In some embodiments, the microstructure has an aspect ratio greater than 3:1 and lower than 8:1.

The disclosure further provides a process for making the NIL soft mold, comprising obtaining a NIL soft mold precursor material; imprinting the NIL soft mold precursor material with a microstructure; and exposing the NIL soft mold precursor material to a curing process, thereby obtaining a NIL soft mold.

In some embodiments, the imprinting the NIL soft mold precursor material with a microstructure comprises imprinting the soft mold precursor material with a master mold.

In some embodiments, the curing process comprises subjecting the NIL soft mold precursor material to a light source.

The disclosure further provides a method of using the NIL soft mold to form a NIL grating, comprising obtaining a NIL precursor material; imprinting the NIL precursor material with the NIL soft mold using a NIL process; and curing the NIL precursor material, thereby forming a NIL grating.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 6A shows a molding process. FIG. 6B shows a demolding process.

FIGS. 7A-7D illustrate an example process for fabricating a soft stamp used to make a slanted surface-relief grating according to certain embodiments. FIG. 7A shows a master mold.

FIG. 7B illustrates the master mold coated with a soft stamp material layer. FIG. 7C illustrates a lamination process for laminating a soft stamp foil onto the soft stamp material layer. FIG. 7D illustrates a delamination process, where the soft stamp including the soft stamp foil and the attached soft stamp material layer is detached from the master mold.

FIGS. 8A-8D illustrate an example process for fabricating a slanted surface-relief grating using a soft stamp according to certain embodiments. FIG. 8A shows a waveguide coated with an imprint resin layer. FIG. 8B shows the lamination of the soft stamp onto the imprint resin layer. FIG. 8C shows the delamination of the soft stamp from the imprint resin layer. FIG. 8D shows an example of an imprinted slanted grating formed on the waveguide.

In FIG. 11A, W denotes the width of a ridge (e.g., a nanostructure), and β denotes the grating period. The duty cycle is the ratio between the width of a ridge W and the grating period p. In FIG. 11B, α denotes the angle for the leading edge of a slanted grating, and β denotes the angle for the trailing edge of the slanted grating. The slant angle (e.g., "Slant") is determined using the angle for the leading edge α and the angle for the trailing edge β, using the formula Slant=arctan[(tan(α)+tan(β))*0.5].

Figure 1:
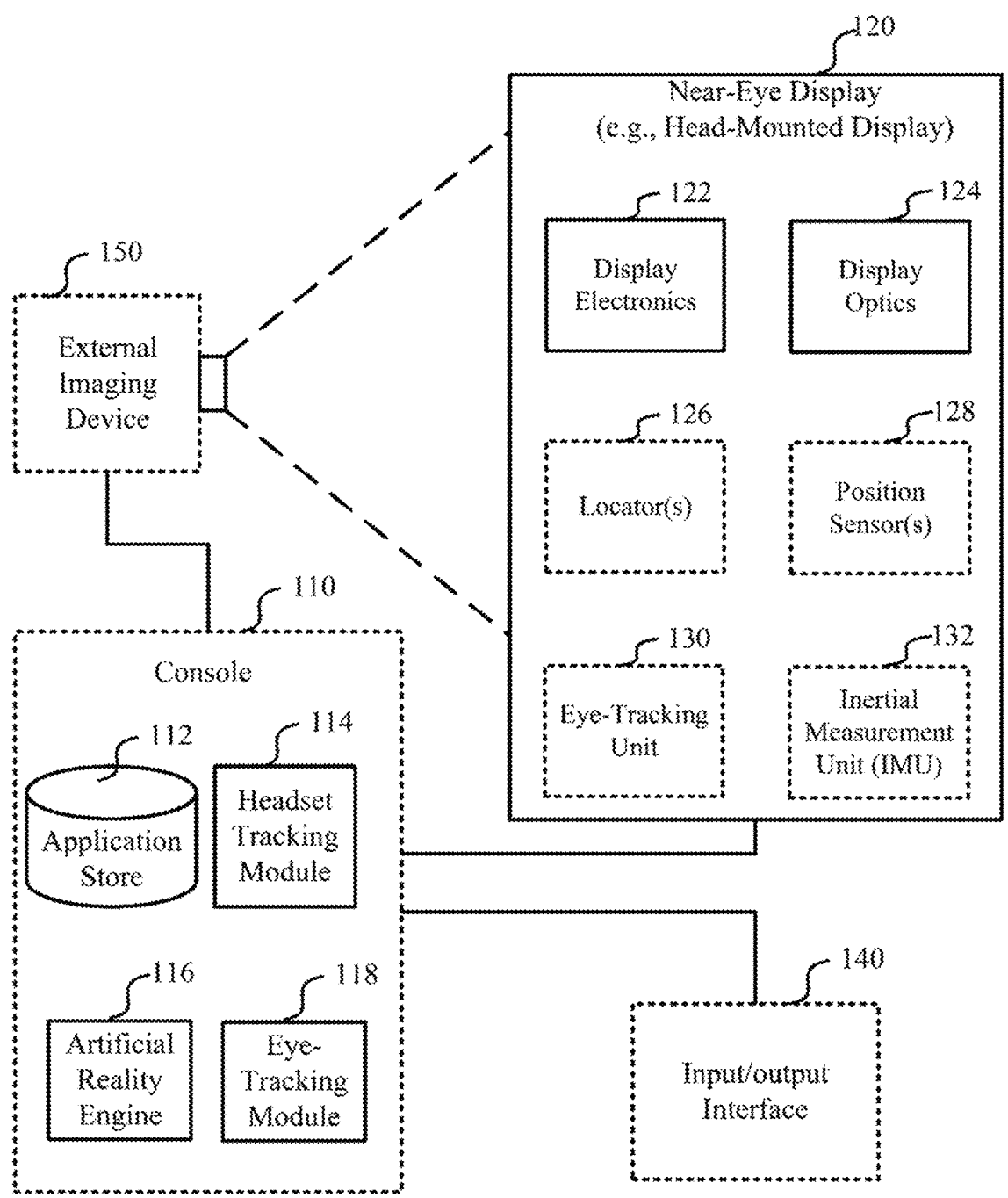
FIG. 1 is a simplified block diagram of an example artificial reality system environment including a near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Surface relief gratings have been used in waveguide combiners for artificial reality/virtual reality (AR/VR) devices to support pupil replication. One way to fabricate surface relief grating is using nanoimprinting lithography (NIL), which requires at least one soft mold to transfer patterns from a hard master mold to the imprinting materials prepared on the substrate. To support optimal releasing performance during pattern transfer, soft mold materials should have preferably moderate to low viscosity (before curing) to support the coating process, low surface energy to reduce adhesion to the master mold and imprinting material surfaces, and moderate to high mechanical strength (e.g., modulus) to maintain pattern fidelity during/after delamination. See, for example, Williams et al., Nano Lett. 10, 1421-1428 (2010), doi:10.1021/nl100326q, and Hu et al., Macromolecules 43(24) (2010), doi:10.1021/ma101180k, each of which is hereby incorporated herein by reference in its entirety for all purposes. The present disclosure provides curable formulations of soft mold that meet the above constraints therefore enabling imprinting gratings with variable duty cycles, depths, slant, and convoluted shapes.

More specifically, and without limitation, this disclosure relates to a nanoimprint lithography (NIL) soft mold precursor material comprising a curable fluorinated base resin component, one or more additives to modify surface energy and viscosity, one or more crosslinkers to modify mechanical strength, and one or more of a photo radical generator, a photo acid generator, or both, for initiating reactions. For example, in some embodiments, the NIL soft mold precursor material (e.g., before curing) has a viscosity range from 1 cps to 3500 cps, from 50 cps to 3000 cps, or from 200 cps to 2800 cps.

In some embodiments, the base resin component is UV curable. In some embodiments, the base resin component comprises one or more UV curable groups such as acrylate or epoxy, or mixture of such on each molecule in the base resin component. For example, in some such embodiments, the curable base resin component comprise backbones of perfluoropolyether, fluorinated siloxane, and/or their derivatives. In some embodiments, the one or more additives comprise fluoro-hydrocarbon, fluoro-siloxane, polydimentylsiloxane, and/or a mixture of such. In some embodiments, the one or more crosslinkers comprise a plurality of acrylate or epoxy groups.

According to certain embodiments, the disclosure also provides a polymeric material comprising a partially or totally polymerized or crosslinked NIL precursor material. In some embodiments, the polymeric material (e.g., after curing) has a modulus range from 50 MPa to 2.5 GPa, from 80 MPa to 2 GPa, or from 100 MPa to 1.5 GP. In some embodiments, the polymeric material (e.g., after curing) has a water contact angle from 90° to 115°, from 92° to 113°, or from 93° to 110°.

According to certain embodiments, the disclosure also provides a NIL soft mold comprising the polymeric material.

In some embodiments, the NIL soft mold has a binary structure with a duty cycle of from about 0.10 to about 0.90. In some embodiments, the NIL soft mold has a binary structure with a duty cycle of 0.10, 0.15, 0.20, 0.25, 0.30, 0.35, 0.40, 0.45, 0.50, 0.55, 0.60, 0.65, 0.70, 0.75, 0.80, 0.85, or 0.90. In some embodiments, the NIL soft mold has a slanted structure with a duty cycle of from about 0.10 to about 0.90. In some embodiments, the NIL soft mold has a slanted structure with a duty cycle of 0.10, 0.15, 0.20, 0.25, 0.30, 0.35, 0.40, 0.45, 0.50, 0.55, 0.60, 0.65, 0.70, 0.75, 0.80, 0.85, or 0.90.

According to certain embodiments, further disclosed herein are processes and methods for making and using the NIL soft mold (e.g., imprinting) to form a NIL grating.

Near-Eye Displays for Artificial Reality Systems:

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified block diagram of an example of an artificial reality system environment 100 including a near-eye display 120 in accordance with certain embodiments. Artificial reality system environment 100 shown in FIG. 1 may include near-eye display 120, an optional external imaging device 150, and an optional input/output interface 140 that may each be coupled to an optional console 110. While FIG. 1 shows example artificial reality system environment 100 including one near-eye display 120, one external imaging device 150, and one input/output interface 140, any number of these components may be included in artificial reality system environment 100, or any of the components may be omitted. For example, there may be multiple near-eye displays 120 monitored by one or more external imaging devices 150 in communication with console 110. In some configurations, artificial reality system environment 100 may not include external imaging device 150, optional input/output interface 140, and optional console 110. In alternative configurations, different or additional components may be included in artificial reality system environment 100.

Near-eye display 120 may be a head-mounted display that presents content to a user. Examples of content presented by near-eye display 120 include one or more of images, videos, audios, or some combination thereof. In some embodiments, audios may be presented via an external device (e.g., speakers and/or headphones) that receives audio information from near-eye display 120, console 110, or both, and presents audio data based on the audio information. Near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, near-eye display 120 may be implemented in any suitable form factor, including a pair of glasses. Some embodiments of near-eye display 120 are further described below with respect to FIGS. 2-4. Additionally, in various embodiments, the functionality described herein may be used in a headset that combines images of an environment external to near-eye display 120 and artificial reality content (e.g., computer-generated images). Therefore, near-eye display 120 may augment images of a physical, real-world environment external to near-eye display 120 with generated content (e.g., images, video, sound, etc.) to present an augmented reality to a user.

In various embodiments, near-eye display 120 may include one or more of display electronics 122, display optics 124, and an eye-tracking unit 130. In some embodiments, near-eye display 120 may also include one or more locators 126, one or more position sensors 128, and an inertial measurement unit (IMU) 132. Near-eye display 120 may omit any of these elements or include additional elements in various embodiments. Additionally, in some embodiments, near-eye display 120 may include elements combining the function of various elements described in conjunction with FIG. 1.

Display electronics 122 may display or facilitate the display of images to the user according to data received from, for example, console 110. In various embodiments, display electronics 122 may include one or more display panels, such as a liquid crystal display (LCD), an organic light emitting diode (OLED) display, an inorganic light emitting diode (ILED) display, a micro light emitting diode (mLED) display, an active-matrix OLED display (AMO-LED), a transparent OLED display (TOLED), or some other display. For example, in one implementation of near-eye display 120, display electronics 122 may include a front TOLED panel, a rear display panel, and an optical component (e.g., an attenuator, polarizer, or diffractive or spectral film) between the front and rear display panels. Display electronics 122 may include pixels to emit light of a predominant color such as red, green, blue, white, or yellow. In some implementations, display electronics 122 may display a three-dimensional (3D) image through stereoscopic effects produced by two-dimensional panels to create a subjective perception of image depth. For example, display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, display optics 124 may display image content optically (e.g., using optical waveguides and couplers) or magnify image light received from display electronics 122, correct optical errors associated with the image light, and present the corrected image light to a user of near-eye display 120. In various embodiments, display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from display electronics 122. Display optics 124 may include a combination of different optical elements as well as mechanical couplings to maintain relative spacing and orientation of the optical elements in the combination. One or more optical elements in display optics 124 may have an optical coating, such as an anti-reflective coating, a reflective coating, a filtering coating, or a combination of different optical coatings.

Magnification of the image light by display optics 124 may allow display electronics 122 to be physically smaller, weigh less, and consume less power than larger displays. Additionally, magnification may increase a field of view of the displayed content. The amount of magnification of image light by display optics 124 may be changed by adjusting, adding, or removing optical elements from display optics 124. In some embodiments, display optics 124 may project displayed images to one or more image planes that may be further away from the user's eyes than near-eye display 120.

Display optics 124 may also be designed to correct one or more types of optical errors, such as two-dimensional optical errors, three-dimensional optical errors, or a combination thereof. Two-dimensional errors may include optical aberrations that occur in two dimensions. Example types of two-dimensional errors may include barrel distortion, pincushion distortion, longitudinal chromatic aberration, and transverse chromatic aberration. Three-dimensional errors may include optical errors that occur in three dimensions. Example types of three-dimensional errors may include spherical aberration, chromatic aberration, field curvature, and astigmatism.

Locators 126 may be objects located in specific positions on near-eye display 120 relative to one another and relative to a reference point on near-eye display 120. In some implementations, console 110 may identify locators 126 in images captured by external imaging device 150 to determine the artificial reality headset's position, orientation, or both. A locator 126 may be a light emitting diode (LED), a corner cube reflector, a reflective marker, a type of light source that contrasts with an environment in which near-eye display 120 operates, or some combinations thereof. In embodiments where locators 126 are active components (e.g., LEDs or other types of light emitting devices), locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

External imaging device 150 may generate slow calibration data based on calibration parameters received from console 110. Slow calibration data may include one or more images showing observed positions of locators 126 that are detectable by external imaging device 150. External imaging device 150 may include one or more cameras, one or more video cameras, any other device capable of capturing images including one or more of locators 126, or some combinations thereof. Additionally, external imaging device 150 may include one or more filters (e.g., to increase signal to noise ratio). External imaging device 150 may be configured to detect light emitted or reflected from locators 126 in a field of view of external imaging device 150. In embodiments where locators 126 include passive elements (e.g., retroreflectors), external imaging device 150 may include a light source that illuminates some or all of locators 126, which may retro-reflect the light to the light source in external imaging device 150. Slow calibration data may be communicated from external imaging device 150 to console 110, and external imaging device 150 may receive one or more calibration parameters from console 110 to adjust one or more imaging parameters (e.g., focal length, focus, frame rate, sensor temperature, shutter speed, aperture, etc.).

Position sensors 128 may generate one or more measurement signals in response to motion of near-eye display 120. Examples of position sensors 128 may include accelerometers, gyroscopes, magnetometers, other motion-detecting or error-correcting sensors, or some combinations thereof. For example, in some embodiments, position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

IMU 132 may be an electronic device that generates fast calibration data based on measurement signals received from one or more of position sensors 128. Position sensors 128 may be located external to IMU 132, internal to IMU 132, or some combination thereof. Based on the one or more measurement signals from one or more position sensors 128, IMU 132 may generate fast calibration data indicating an estimated position of near-eye display 120 relative to an initial position of near-eye display 120. For example, IMU 132 may integrate measurement signals received from accelerometers over time to estimate a velocity vector and integrate the velocity vector over time to determine an estimated position of a reference point on near-eye display 120. Alternatively, IMU 132 may provide the sampled measurement signals to console 110, which may determine the fast calibration data. While the reference point may generally be defined as a point in space, in various embodiments, the reference point may also be defined as a point within near-eye display 120 (e.g., a center of IMU 132).

Eye-tracking unit 130 may include one or more eye-tracking systems. Eye tracking may refer to determining an eye's position, including orientation and location of the eye, relative to near-eye display 120. An eye-tracking system may include an imaging system to image one or more eyes and may optionally include a light emitter, which may generate light that is directed to an eye such that light reflected by the eye may be captured by the imaging system. For example, eye-tracking unit 130 may include a non-coherent or coherent light source (e.g., a laser diode) emitting light in the visible spectrum or infrared spectrum, and a camera capturing the light reflected by the user's eye. As another example, eye-tracking unit 130 may capture reflected radio waves emitted by a miniature radar unit. Eye-tracking unit 130 may use low-power light emitters that emit light at frequencies and intensities that would not injure the eye or cause physical discomfort. Eye-tracking unit 130 may be arranged to increase contrast in images of an eye captured by eye-tracking unit 130 while reducing the overall power consumed by eye-tracking unit 130 (e.g., reducing power consumed by a light emitter and an imaging system included in eye-tracking unit 130). For example, in some implementations, eye-tracking unit 130 may consume less than 100 milliwatts of power.

Near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or some combination thereof. Because the orientation may be determined for both eyes of the user, eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

Input/output interface 140 may be a device that allows a user to send action requests to console 110. An action request may be a request to perform a particular action. For example, an action request may be to start or to end an application or to perform a particular action within the application. Input/output interface 140 may include one or more input devices. Example input devices may include a keyboard, a mouse, a game controller, a glove, a button, a touch screen, or any other suitable device for receiving action requests and communicating the received action requests to console 110. An action request received by the input/output interface 140 may be communicated to console 110, which may perform an action corresponding to the requested action. In some embodiments, input/output interface 140 may provide haptic feedback to the user in accordance with instructions received from console 110. For example, input/output interface 140 may provide haptic feedback when an action request is received, or when console 110 has performed a requested action and communicates instructions to input/output interface 140.

Console 110 may provide content to near-eye display 120 for presentation to the user in accordance with information received from one or more of external imaging device 150, near-eye display 120, and input/output interface 140. In the example shown in FIG. 1, console 110 may include an application store 112, a headset tracking module 114, an artificial reality engine 116, and eye-tracking module 118. Some embodiments of console 110 may include different or additional modules than those described in conjunction with FIG. 1. Functions further described below may be distributed among components of console 110 in a different manner than is described here.

In some embodiments, console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of console 110 described in conjunction with FIG. 1 may be encoded as instructions in the non-transitory computer-readable storage medium that, when executed by the processor, cause the processor to perform the functions further described below.

Application store 112 may store one or more applications for execution by console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

Headset tracking module 114 may track movements of near-eye display 120 using slow calibration information from external imaging device 150. For example, headset tracking module 114 may determine positions of a reference point of near-eye display 120 using observed locators from the slow calibration information and a model of near-eye display 120. Headset tracking module 114 may also determine positions of a reference point of near-eye display 120 using position information from the fast calibration information. Additionally, in some embodiments, headset tracking module 114 may use portions of the fast calibration information, the slow calibration information, or some combination thereof, to predict a future location of near-eye display 120. Headset tracking module 114 may provide the estimated or predicted future position of near-eye display 120 to artificial reality engine 116.

Headset tracking module 114 may calibrate the artificial reality system environment 100 using one or more calibration parameters, and may adjust one or more calibration parameters to reduce errors in determining the position of near-eye display 120. For example, headset tracking module 114 may adjust the focus of external imaging device 150 to obtain a more accurate position for observed locators on near-eye display 120. Moreover, calibration performed by headset tracking module 114 may also account for information received from IMU 132. Additionally, if tracking of near-eye display 120 is lost (e.g., external imaging device 150 loses line of sight of at least a threshold number of locators 126), headset tracking module 114 may re-calibrate some or all of the calibration parameters.

Artificial reality engine 116 may execute applications within artificial reality system environment 100 and receive position information of near-eye display 120, acceleration information of near-eye display 120, velocity information of near-eye display 120, predicted future positions of near-eye display 120, or some combination thereof from headset tracking module 114. Artificial reality engine 116 may also receive estimated eye position and orientation information from eye-tracking module 118. Based on the received information, artificial reality engine 116 may determine content to provide to near-eye display 120 for presentation to the user. For example, if the received information indicates that the user has looked to the left, artificial reality engine 116 may generate content for near-eye display 120 that mirrors the user's eye movement in a virtual environment. Additionally, artificial reality engine 116 may perform an action within an application executing on console 110 in response to an action request received from input/output interface 140, and provide feedback to the user indicating that the action has been performed. The feedback may be visual or audible feedback via near-eye display 120 or haptic feedback via input/output interface 140.

Eye-tracking module 118 may receive eye-tracking data from eye-tracking unit 130 and determine the position of the user's eye based on the eye tracking data. The position of the eye may include an eye's orientation, location, or both relative to near-eye display 120 or any element thereof. Because the eye's axes of rotation change as a function of the eye's location in its socket, determining the eye's location in its socket may allow eye-tracking module 118 to more accurately determine the eye's orientation.

In some embodiments, eye-tracking module 118 may store a mapping between images captured by eye-tracking unit 130 and eye positions to determine a reference eye position from an image captured by eye-tracking unit 130. Alternatively or additionally, eye-tracking module 118 may determine an updated eye position relative to a reference eye position by comparing an image from which the reference eye position is determined to an image from which the updated eye position is to be determined. Eye-tracking module 118 may determine eye position using measurements from different imaging devices or other sensors. For example, eye-tracking module 118 may use measurements from a slow eye-tracking system to determine a reference eye position, and then determine updated positions relative to the reference eye position from a fast eye-tracking system until a next reference eye position is determined based on measurements from the slow eye-tracking system.

Eye-tracking module 118 may also determine eye calibration parameters to improve precision and accuracy of eye tracking. Eye calibration parameters may include parameters that may change whenever a user dons or adjusts near-eye display 120. Example eye calibration parameters may include an estimated distance between a component of eye-tracking unit 130 and one or more parts of the eye, such as the eye's center, pupil, cornea boundary, or a point on the surface of the eye. Other example eye calibration parameters may be specific to a particular user and may include an estimated average eye radius, an average corneal radius, an average sclera radius, a map of features on the eye surface, and an estimated eye surface contour. In embodiments where light from the outside of near-eye display 120 may reach the eye (as in some augmented reality applications), the calibration parameters may include correction factors for intensity and color balance due to variations in light from the outside of near-eye display 120. Eye-tracking module 118 may use eye calibration parameters to determine whether the measurements captured by eye-tracking unit 130 would allow eye-tracking module 118 to determine an accurate eye position (also referred to herein as "valid measurements"). Invalid measurements, from which eye-tracking module 118 may not be able to determine an accurate eye position, may be caused by the user blinking, adjusting the headset, or removing the headset, and/or may be caused by near-eye display 120 experiencing greater than a threshold change in illumination due to external light. In some embodiments, at least some of the functions of eye-tracking module 118 may be performed by eye-tracking unit 130.

Figure 2:
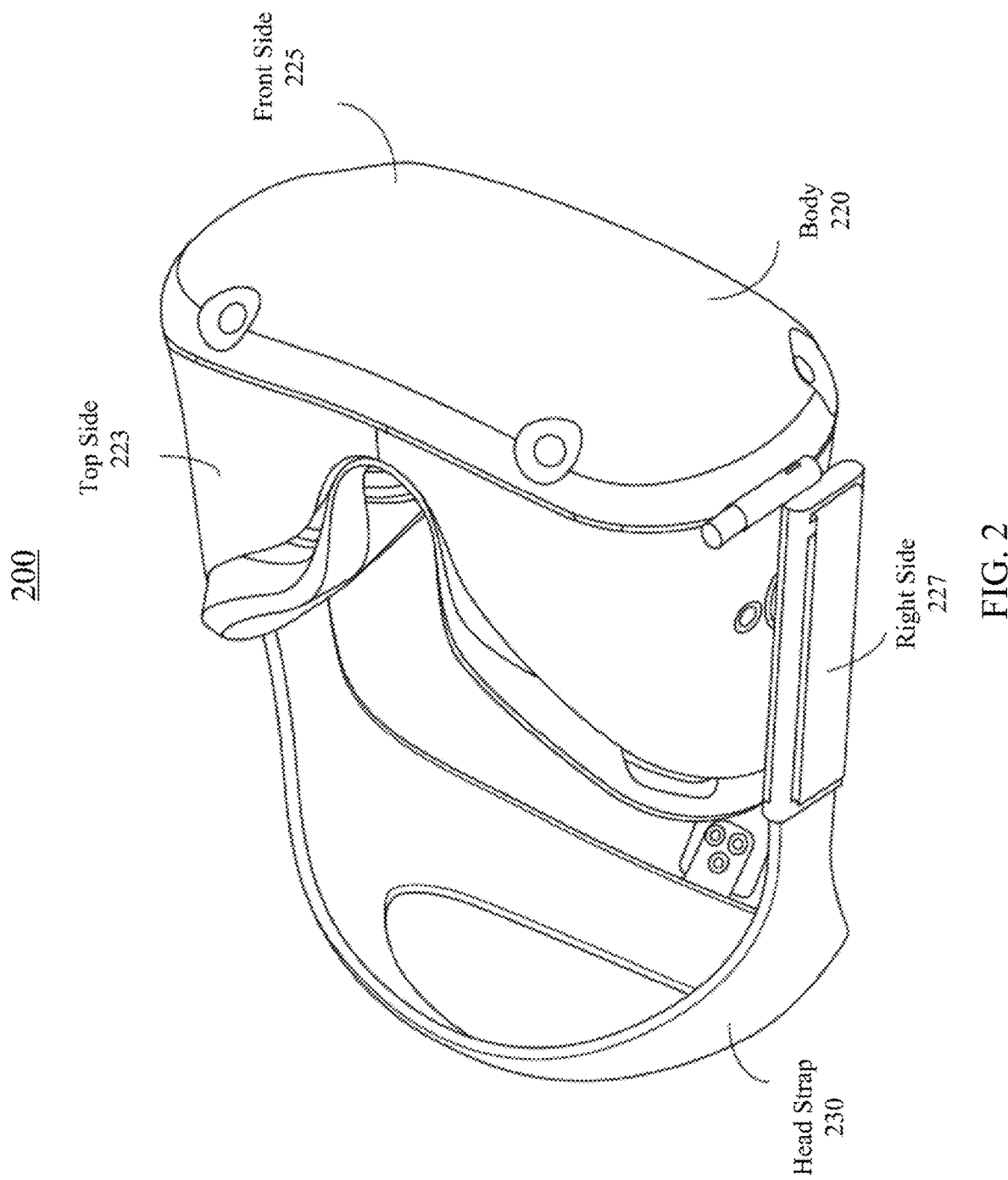
FIG. 2 is a perspective view of an example near-eye display in the form of a head-mounted display (HMD) device for implementing some of the examples disclosed herein.

FIG. 2 is a perspective view of an example of a near-eye display in the form of a head-mounted display (HMD) device 200 for implementing some of the examples disclosed herein. HMD device 200 may be a part of, e.g., a virtual reality (VR) system, an augmented reality (AR) system, a mixed reality (MR) system, or some combinations thereof. HMD device 200 may include a body 220 and a head strap 230. FIG. 2 shows a top side 223, a front side 225, and a right side 227 of body 220 in the perspective view. Head strap 230 may have an adjustable or extendible length. There may be a sufficient space between body 220 and head strap 230 of HMD device 200 for allowing a user to mount HMD device 200 onto the user's head. In various embodiments, HMD device 200 may include additional, fewer, or different components. For example, in some embodiments, HMD device 200 may include eyeglass temples and temples tips as shown in, for example, FIG. 2, rather than head strap 230.

HMD device 200 may present to a user media including virtual and/or augmented views of a physical, real-world environment with computer-generated elements. Examples of the media presented by HMD device 200 may include images (e.g., two-dimensional (2D) or three-dimensional (3D) images), videos (e.g., 2D or 3D videos), audios, or some combinations thereof. The images and videos may be presented to each eye of the user by one or more display assemblies (not shown in FIG. 2) enclosed in body 220 of HMD device 200. In various embodiments, the one or more display assemblies may include a single electronic display panel or multiple electronic display panels (e.g., one display panel for each eye of the user). Examples of the electronic display panel(s) may include, for example, a liquid crystal display (LCD), an organic light emitting diode (OLED) display, an inorganic light emitting diode (ILED) display, a micro light emitting diode (mLED) display, an active-matrix organic light emitting diode (AMOLED) display, a transparent organic light emitting diode (TOLED) display, some other display, or some combinations thereof. HMD device 200 may include two eye box regions.

In some implementations, HMD device 200 may include various sensors (not shown), such as depth sensors, motion sensors, position sensors, and eye tracking sensors. Some of these sensors may use a structured light pattern for sensing. In some implementations, HMD device 200 may include an input/output interface for communicating with a console. In some implementations, HMD device 200 may include a virtual reality engine (not shown) that can execute applications within HMD device 200 and receive depth information, position information, acceleration information, velocity information, predicted future positions, or some combination thereof of HMD device 200 from the various sensors. In some implementations, the information received by the virtual reality engine may be used for producing a signal (e.g., display instructions) to the one or more display assemblies. In some implementations, HMD device 200 may include locators (not shown, such as locators 126) located in fixed positions on body 220 relative to one another and relative to a reference point. Each of the locators may emit light that is detectable by an external imaging device.

Figure 3:
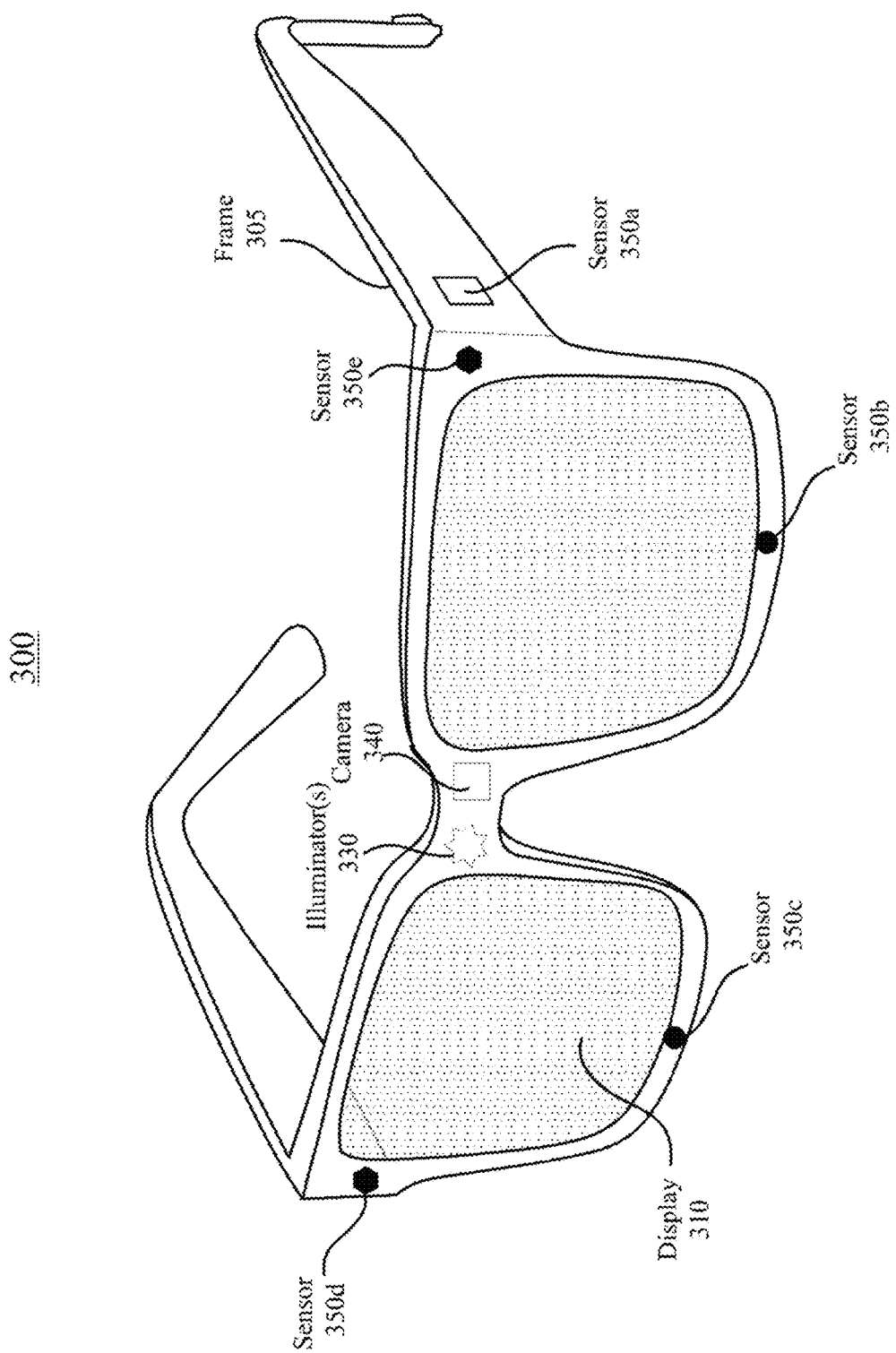
FIG. 3 is a perspective view of an example near-eye display in the form of a pair of glasses for implementing some of the examples disclosed herein.

FIG. 3 is a perspective view of an example of a near-eye display 300 in the form of a pair of glasses for implementing some of the examples disclosed herein. Near-eye display 300 may be a specific implementation of near-eye display 120 of FIG. 1, and may be configured to operate as a virtual reality display, an augmented reality display, and/or a mixed reality display. Near-eye display 300 may include a frame 305 and a display 310. Display 310 may be configured to present content to a user. In some embodiments, display 310 may include display electronics and/or display optics. For example, as described above with respect to near-eye display 120 of FIG. 1, display 310 may include an LCD display panel, an LED display panel, or an optical display panel (e.g., a waveguide display assembly).

Near-eye display 300 may further include various sensors 350a, 350b, 350c, 350d, and 350e on or within frame 305. In some embodiments, sensors 350a-350e may include one or more depth sensors, motion sensors, position sensors, inertial sensors, or ambient light sensors. In some embodiments, sensors 350a-350e may include one or more image sensors configured to generate image data representing different fields of views in different directions. In some embodiments, sensors 350a-350e may be used as input devices to control or influence the displayed content of near-eye display 300, and/or to provide an interactive VR/AR/MR experience to a user of near-eye display 300. In some embodiments, sensors 350a-350e may also be used for stereoscopic imaging.

In some embodiments, near-eye display 300 may further include one or more illuminators 330 to project light into the physical environment. The projected light may be associated with different frequency bands (e.g., visible light, infra-red light, ultra-violet light, etc.), and may serve various purposes. For example, illuminator(s) 330 may project light in a dark environment (or in an environment with low intensity of infra-red light, ultra-violet light, etc.) to assist sensors 350a-350e in capturing images of different objects within the dark environment. In some embodiments, illuminator(s) 330 may be used to project certain light pattern onto the objects within the environment. In some embodiments, illuminator(s) 330 may be used as locators, such as locators 126 described above with respect to FIG. 1.

In some embodiments, near-eye display 300 may also include a high-resolution camera 340. Camera 340 may capture images of the physical environment in the field of view. The captured images may be processed, for example, by a virtual reality engine (e.g., artificial reality engine 116 of FIG. 1) to add virtual objects to the captured images or modify physical objects in the captured images, and the processed images may be displayed to the user by display 310 for AR or MR applications.

Figure 4:
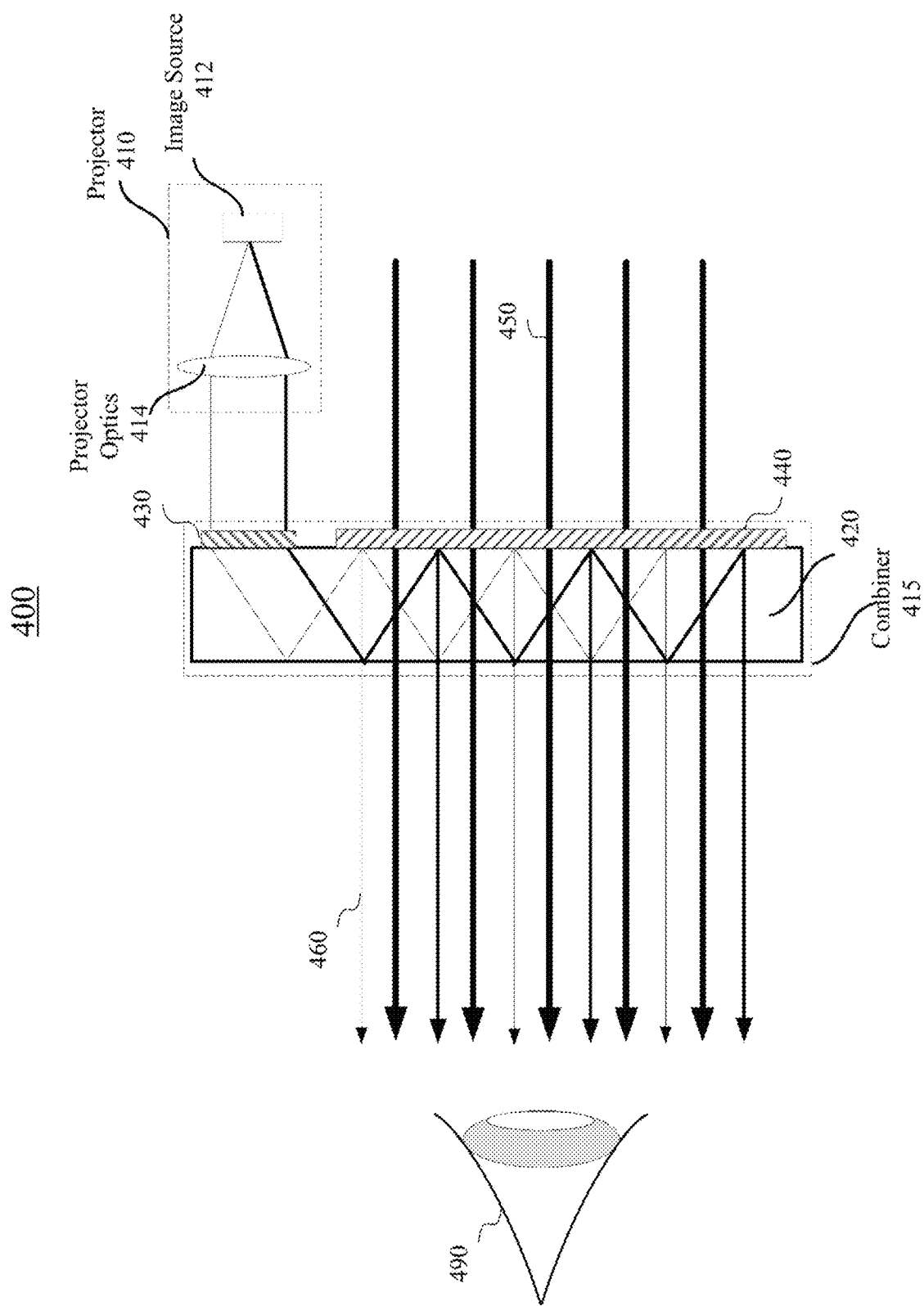
FIG. 4 illustrates an example optical see-through augmented reality system using a waveguide display according to certain embodiments.

FIG. 4 illustrates an example of an optical see-through augmented reality system 400 using a waveguide display according to certain embodiments. Augmented reality system 400 may include a projector 410 and a combiner 415. Projector 410 may include a light source or image source 412 and projector optics 414. In some embodiments, image source 412 may include a plurality of pixels that displays virtual objects, such as an LCD display panel or an LED display panel. In some embodiments, image source 412 may include a light source that generates coherent or partially coherent light. For example, image source 412 may include a laser diode, a vertical cavity surface emitting laser, and/or a light emitting diode. In some embodiments, image source 412 may include a plurality of light sources each emitting a monochromatic image light corresponding to a primary color (e.g., red, green, or blue). In some embodiments, image source 412 may include an optical pattern generator, such as a spatial light modulator. Projector optics 414 may include one or more optical components that can condition the light from image source 412, such as expanding, collimating, scanning, or projecting light from image source 412 to combiner 415. The one or more optical components may include, for example, one or more lenses, liquid lenses, mirrors, apertures, and/or gratings. In some embodiments, projector optics 414 may include a liquid lens (e.g., a liquid crystal lens) with a plurality of electrodes that allows scanning of the light from image source 412.

Combiner 415 may include an input coupler 430 for coupling light from projector 410 into a substrate 420 of combiner 415. Input coupler 430 may include a volume holographic grating, a diffractive optical element (DOE) (e.g., a surface-relief grating), or a refractive coupler (e.g., a wedge or a prism). Input coupler 430 may have a coupling efficiency of greater than 30%, 50%, 75%, 90%, or higher for visible light. As used herein, visible light may refer to light with a wavelength between about 380 nm to about 750 nm. Light coupled into substrate 420 may propagate within substrate 420 through, for example, total internal reflection (TIR). Substrate 420 may be in the form of a lens of a pair of eyeglasses. Substrate 420 may have a flat or a curved surface, and may include one or more types of dielectric materials, such as glass, quartz, plastic, polymer, poly(methyl methacrylate) (PMMA), crystal, or ceramic. A thickness of substrate 420 may range from, for example, less than about 1 mm to about 10 mm or more. Substrate 420 may be transparent to visible light. A material may be "transparent" to a light beam if the light beam can pass through the material with a high transmission rate, such as larger than 50%, 40%, 75%, 80%, 90%, 95%, or higher, where a small portion of the light beam (e.g., less than 50%, 40%, 25%, 20%, 10%, 5%, or less) may be scattered, reflected, or absorbed by the material. The transmission rate (i.e., transmissivity) may be represented by either a photopically weighted or an unweighted average transmission rate over a range of wavelengths, or the lowest transmission rate over a range of wavelengths, such as the visible wavelength range.

Substrate 420 may include or may be coupled to a plurality of output couplers 440 configured to extract at least a portion of the light guided by and propagating within substrate 420 from substrate 420, and direct extracted light 460 to an eye 490 of the user of augmented reality system 400. As input coupler 430, output couplers 440 may include grating couplers (e.g., volume holographic gratings or surface-relief gratings), other DOEs, prisms, etc. Output couplers 440 may have different coupling (e.g., diffraction) efficiencies at different locations. Substrate 420 may also allow light 450 from environment in front of combiner 415 to pass through with little or no loss. Output couplers 440 may also allow light 450 to pass through with little loss. For example, in some implementations, output couplers 440 may have a low diffraction efficiency for light 450 such that light 450 may be refracted or otherwise pass through output couplers 440 with little loss, and thus may have a higher intensity than extracted light 460. In some implementations, output couplers 440 may have a high diffraction efficiency for light 450 and may diffract light 450 to certain desired directions (i.e., diffraction angles) with little loss. As a result, the user may be able to view combined images of the environment in front of combiner 415 and virtual objects projected by projector 410.

Figure 5:
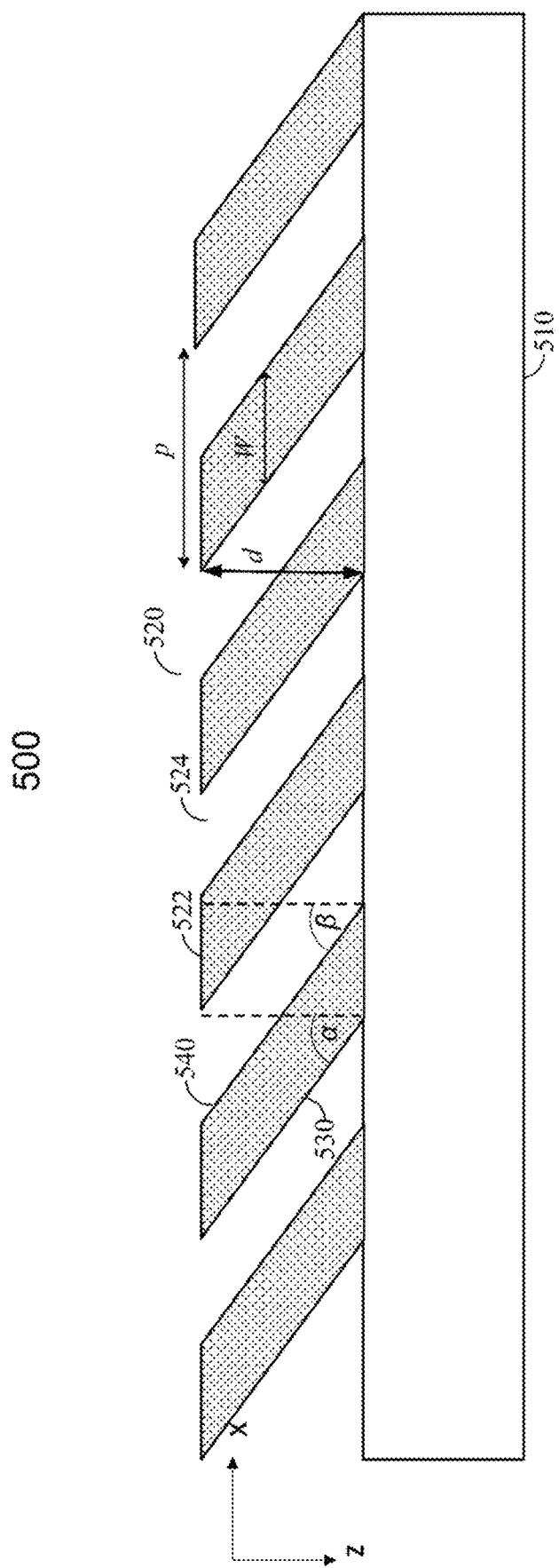
FIG. 5. illustrates an example slanted grating coupler in an example waveguide display according to certain embodiments.

Surface-Relief Structures:

FIG. 5 illustrates an example slanted grating 520 in an example waveguide display 500 according to certain embodiments. Waveguide display 500 may include slanted grating 520 on a waveguide 510, such as substrate 420. Slanted grating 520 may act as a grating coupler for coupling light into or out of waveguide 510. In some embodiments, slanted grating 520 may include a structure with a period p. For example, slanted grating 520 may include a plurality of ridges 522 and grooves 524 between ridges 522. Ridges 522 may be made of a material with a refractive index of $n_{g1}$, such as silicon containing materials (e.g., $SiO_2$, $Si_3N_4$, SiC, $SiO_xN_y$, or amorphous silicon), organic materials (e.g., polymers, spin on carbon (SOC) or amorphous carbon layer (ACL) or diamond like carbon (DLC)), inorganic metal oxide layers (e.g., $TiO_x$, $AlO_x$, $TaO_x$, $HfO_x$, etc.), or a combination thereof.

Each period of slanted grating 520 may include a ridge 522 and a groove 524, which may be an air gap or a region filled with a material with a refractive index $n_{g2}$. In some embodiments, the period p of the slanted grating may vary from one area to another on slanted grating 520, or may vary from one period to another (i.e., chirped) on slanted grating 520. The ratio between the width W of a ridge 522 and the grating period p may be referred to as the duty cycle. Slanted grating 520 may have a duty cycle ranging, for example, from about 10% to about 90% or greater. In some embodiments, the duty cycle may vary from period to period. In some embodiments, the depth d or height of ridges 522 may be greater than 50 nm, 100 nm, 200 nm, 300 nm, or higher.

Each ridge 522 may include a leading edge 530 with a slant angle α and a trailing edge 540 with a slant angle β. Slant angle α and slant angle β may be greater than 10°, 20°, 30°, 40°, 50°, 60°, 70°, or higher. In some embodiments, leading edge 530 and training edge 540 of each ridge 522 may be parallel to each other. In other words, slant angle α is approximately equal to slant angle β. In some embodiments, slant angle α may be different from slant angle β. In some embodiments, slant angle α may be approximately equal to slant angle β. For example, the difference between slant angle α and slant angle β may be less than 20%, 10%, 5%, 1%, or less.

In some implementations, grooves 524 between ridges 522 may be over-coated or filled with a material having a refractive index $n_{g2}$ higher or lower than the refractive index of the material of ridges 522. For example, in some embodiments, a high refractive index material, such as Hafnia, Titania, Tantalum oxide, Tungsten oxide, Zirconium oxide, Gallium sulfide, Gallium nitride, Gallium phosphide, silicon, or a high refractive index polymer, may be used to fill grooves 524. In some embodiments, a low refractive index material, such as silicon oxide, alumina, porous silica, or fluorinated low index monomer (or polymer), may be used to fill grooves 524. As a result, the difference between the refractive index of ridges 522 and the refractive index of grooves 524 may be greater than 0.1, 0.2, 0.3, 0.5, 1.0, or higher.

The slanted grating, such as slanted grating 520 shown in FIG. 5, may be fabricated using many different nanofabrication techniques. The nanofabrication techniques generally include a patterning process and a post-patterning (e.g., over-coating) process. The patterning process may be used to form slanted ridges of the slanted grating. There may be many different nanofabrication techniques for forming the slanted ridges. For example, in some implementations, the slanted grating may be fabricated using lithographic techniques including slanted etching. In some implementations, the slanted grating may be fabricated using nanoimprint lithography (NIL) molding techniques. The post-patterning process may be used to over-coat the slanted ridges and/or to fill the gaps between the slanted ridges with a material having a different refractive index than the slanted ridges. The post-patterning process may be independent from the patterning process. Thus, a same post-patterning process may be used on slanted gratings fabricated using any pattering technique.

Techniques and processes for fabricating the slanted grating described below are for illustration purposes only and are not intended to be limiting. A person skilled in the art would understand that various modifications may be made to the techniques described below. For example, in some implementations, some operations described below may be omitted. In some implementations, additional operations may be performed to fabricate the slanted grating. Techniques disclosed herein may also be used to fabricate other slanted structures on various materials.

As described above, in some implementations, the slanted grating may be fabricated using NIL molding techniques. In NIL molding, a substrate may be coated with a NIL material layer. The NIL material may include an electromagnetic radiation sensitive material or, more specifically, a light-curable optical material. For example, the NIL material may include a light-sensitive base resin that includes a base polymer and a functional group for polymerization during photo-curing (e.g., UV-curing). The NIL material mixture may also include metal oxide nanoparticles (e.g., titanium oxide, zirconium oxide, etc.) for increasing the refractive index of the mixture. The mixture may also include some optional additives and solvent. In general, the base resin material, e.g., the base polymer and the functional group of the base resin material, the nanoparticle material, and/or the loading of the nanoparticles (i.e., weight percentage of the nanoparticles in the cured NIL material) can be selected to tune the refractive index of the moldable NIL material.

A NIL mold (e.g., a hard stamp, a soft stamp including a polymeric material, a hard-soft stamp, or any other working stamp) with a slanted structure may be pressed against the NIL material layer for molding a slanted surface-relief structure in the NIL material layer. A soft stamp (e.g., made of polymers) may offer more flexibility than a hard stamp during the molding and demolding processes. The NIL material layer may be cured subsequently using, for example, heat and/or ultraviolet (UV) light. The NIL mold may then be detached from the NIL material layer, and a slanted structure that is complementary to the slanted structure in the NIL mold may be formed in the NIL material layer.

In various embodiments, different generations of NIL stamps may be made and used as the working stamp to mold the slanted gratings. For example, in some embodiments, a master mold (which may be referred to as a generation 0 mold) may be fabricated (e.g., etched) in, for example, a semiconductor substrate, a quartz, or a metal plate. The master mold may be a hard stamp and may be used as the working stamp to mold the slanted grating directly, which may be referred to as hard stamp NIL or hard NIL. In such case, the slanted structure on the mold may be complimentary to the desired slanted structure of the slanted grating used as the grating coupler on a waveguide display.

In some embodiments, in order to protect the master NIL mold, the master NIL mold may be fabricated first, and a hybrid stamp (which may be referred to as generation 1 mold or stamp) may then be fabricated using the master NIL mold. The hybrid stamp may be used as the working stamp for nanoimprinting. The hybrid stamp may include a hard stamp, a soft stamp, or a hard-soft stamp. Nanoimprinting using a soft stamp may be referred to as soft stamp NIL or soft NIL. In some embodiments, the hybrid mold may include a plastic backplane with soft or hard patterned polymer (e.g., having a Young's modulus about 1 GPa). In some embodiments, the hybrid mold may include a glass backplane with soft or hard patterned polymer (e.g., having a Young's modulus about 1 GPa). In some embodiments, the hybrid mold may include a glass/plastic laminated backplane with soft or hard patterned polymer.

In some embodiments, a generation 2 hybrid mold may be made from the generation 1 mold, and may then be used as the working stamp for the nanoimprinting. In some embodiments, generation 3 hybrid molds, generation 4 hybrid molds, and the like, may be made and used as the working stamp. NIL molding may significantly reduce the cost of making the slanted surface-relief structures because the molding process may be much shorter than the etching process and no expensive reactive ion etching equipment may be needed.

Figure 6A:
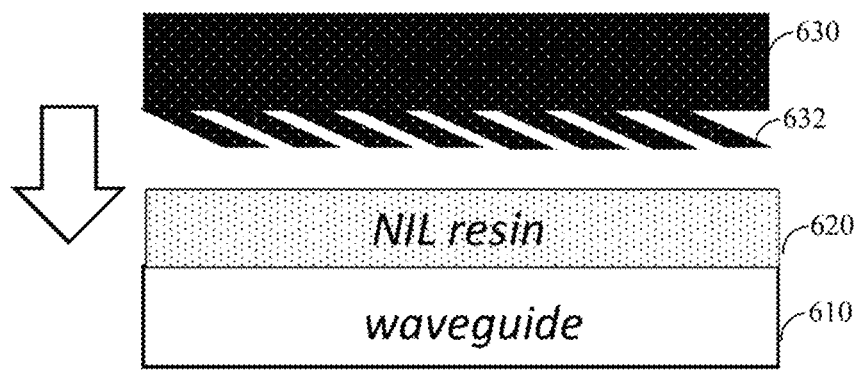
FIGS. 6A and 6B illustrate an example process for fabricating a slanted surface-relief grating by molding according to certain embodiments.
Figure 6B:
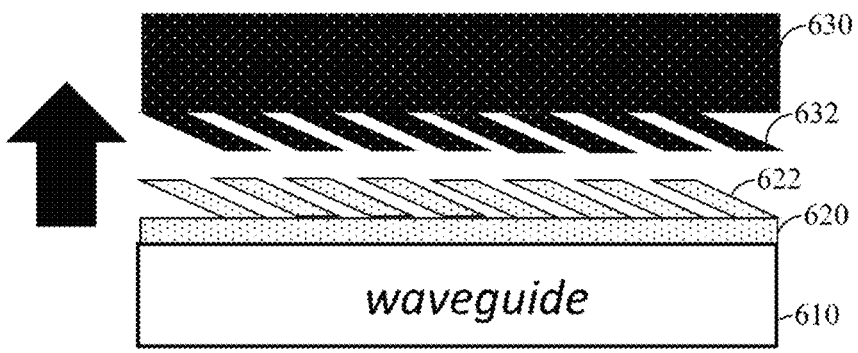

FIGS. 6A and 6B illustrate an example process for fabricating a slanted surface-relief grating by direct molding according to certain embodiments. In FIG. 6A, a waveguide 610 may be coated with a NIL material layer 620. NIL material layer 620 may be deposited on waveguide 610 by, for example, spin-coating, lamination, or ink injection. A NIL mold 630 with slanted ridges 632 may be pressed against NIL material layer 620 and waveguide 610 for molding a slanted grating in NIL material layer 620. NIL material layer 620 may be cured subsequently (e.g., crosslinked) using heat and/or ultraviolet (UV) light.

FIG. 6B shows the demolding process, during which NIL mold 630 is detached from NIL material layer 620 and waveguide 610. As shown in FIG. 6B, after NIL mold 630 is detached from NIL material layer 620 and waveguide 610, a slanted grating 622 that is complementary to slanted ridges 632 in NIL mold 630 may be formed in NIL material layer 620 on waveguide 610.

In some embodiments, a master NIL mold (e.g., a hard mold including a rigid material, such as Si, $SiO_2$, $Si_3N_4$, or a metal) may be fabricated first using, for example, slanted etching, micromachining, or 3-D printing. A soft stamp may be fabricated using the master NIL mold, and the soft stamp may then be used as the working stamp to fabricate the slanted grating. In such a process, the slanted grating structure in the master NIL mold may be similar to the slanted grating of the grating coupler for the waveguide display, and the slanted grating structure on the soft stamp may be complementary to the slanted grating structure in the master NIL mold and the slanted grating of the grating coupler for the waveguide display. Compared with a hard stamp or hard mold, a soft stamp may offer more flexibility during the molding and demolding processes.

FIGS. 7A-7D illustrate an example process for fabricating a soft stamp used for making a slanted surface-relief grating according to certain embodiments. FIG. 7A shows a master mold 710 (e.g., a hard mold or hard stamp). Master mold 710 may include a rigid material, such as a semiconductor substrate (e.g., Si or GaAs), an oxide (e.g., $SiO_2$, $Si_3N_4$, $TiO_x$, $AlO_x$, $TaO_x$, or $HfO_x$), or a metal plate. Master mold 710 may be fabricated using, for example, a slanted etching process using reactive ion beams or chemically assisted reactive ion beams, a micromachining process, or a 3-D printing process. As shown in FIG. 7A, master mold 710 may include a slanted grating 720 that may in turn include a plurality of slanted ridges 722 with gaps 724 between slanted ridges 722.

FIG. 7B illustrates master mold 710 coated with a soft stamp material layer 730. Soft stamp material layer 730 may include, for example, a resin material or a curable polymer material. In some embodiments, soft stamp material layer 730 may include polydimethylsiloxane (PDMS) or another silicone elastomer or silicon-based organic polymer. In some embodiment, soft stamp material layer 730 may include ethylene tetrafluoroethylene (ETFE), perfluoropolyether (PFPE), or other fluorinated polymer materials. In some embodiments, soft stamp material layer 730 may be coated on master mold 710 by, for example, spin-coating or ink injection.

FIG. 7C illustrates a lamination process for laminating a soft stamp foil 740 onto soft stamp material layer 730. A roller 750 may be used to press soft stamp foil 740 against soft stamp material layer 730. The lamination process may also be a planarization process to make the thickness of soft stamp material layer 730 substantially uniform. After the lamination process, soft stamp foil 740 may be tightly or securely attached to soft stamp material layer 730.

FIG. 7D illustrates a delamination process, where a soft stamp including soft stamp foil 740 and attached soft stamp material layer 730 is detached from master mold 710. Soft stamp material layer 730 may include a slanted grating structure that is complementary to the slanted grating structure on master mold 710. Because the flexibility of soft stamp foil 740 and attached soft stamp material layer 730, the delamination process may be relatively easy compared with a demolding process using a hard stamp or mold. In some embodiments, a roller (e.g., roller 750) may be used in the delamination process to ensure a constant or controlled delamination speed. In some embodiments, roller 750 may not be used during the delamination. In some implementations, an anti-sticking layer may be formed on master mold 710 before soft stamp material layer 730 is coated on master mold 710. The anti-sticking layer may also facilitate the delamination process (e.g., between the slanted grating and the soft stamp 760). After the delamination of the soft stamp from master mold 710, the soft stamp may be used to mold the slanted grating on a waveguide of a waveguide display.

FIGS. 8A-8D illustrate an example process for fabricating a slanted surface-relief grating using a soft stamp according to certain embodiments. FIG. 8A shows a waveguide 810 coated with a NIL material layer 820. NIL material layer 820 may be deposited on waveguide 810 by, for example, spin-coating, lamination, or ink injection. A soft stamp 830 including slanted ridges 832 attached to a soft stamp foil 840 may be used for the imprint.

FIG. 8B shows the lamination of soft stamp 830 onto NIL material layer 820. Soft stamp 830 may be pressed against NIL material layer 820 and waveguide 810 using a roller 850, such that slanted ridges 832 may be pressed into NIL material layer 820. NIL material layer 820 may be cured subsequently. For example, NIL material layer 820 may be crosslinked using heat and/or ultraviolet (UV) light.

FIG. 8C shows the delamination of soft stamp 830 from NIL material layer 820. The delamination may be performed by lifting soft stamp foil 840 to detach slanted ridges 832 of soft stamp 830 from NIL material layer 820. NIL material layer 820 may now include a slanted grating 822, which may be used as the grating coupler or may be over-coated to form the grating coupler for the waveguide display. As described above, because of the flexibility of soft stamp 830, the delamination process may be relatively easy compared with a demolding process using a hard stamp or mold. In some embodiments, a roller (e.g., roller 850) may be used in the delamination process to ensure a constant or controlled delamination speed. In some embodiments, roller 850 may not be used during the delamination.

FIG. 8D shows an example imprinted slanted grating 822 formed on waveguide 810 using soft stamp 830. As described above, slanted grating 822 may include ridges and gaps between the ridges and thus may be over-coated with a material having a refractive index different from NIL material layer 820 to fill the gaps and form the grating coupler for the waveguide display.

In various embodiments, the period of the slanted grating may vary from one area to another on slanted grating 822, or may vary from one period to another (i.e., chirped) on slanted grating 822. Slanted grating 822 may have a duty cycle ranging, for example, from about 10% to about 90% or greater. In some embodiments, the duty cycle may vary from period to period. In some embodiments, the depth or height of the ridges of slanted grating 822 may be greater than 50 nm, 100 nm, 200 nm, 300 nm, or higher. The slant angles of the leading edges of the ridges of slanted grating 822 and the slant angles of the trailing edges of the ridges of slanted grating 822 may be greater than 10°, 20°, 30°, 40°, 50°, 60°, 70°, or higher. In some embodiments, the leading edge and training edge of each ridge of slanted grating 822 may be parallel to each other. In some embodiments, the difference between the slant angle of the leading edge of a ridge of slanted grating 822 and the slant angle of the trailing edge of the ridge of slanted grating 822 may be less than 20%, 10%, 5%, 1%, or less.

Figure 9:
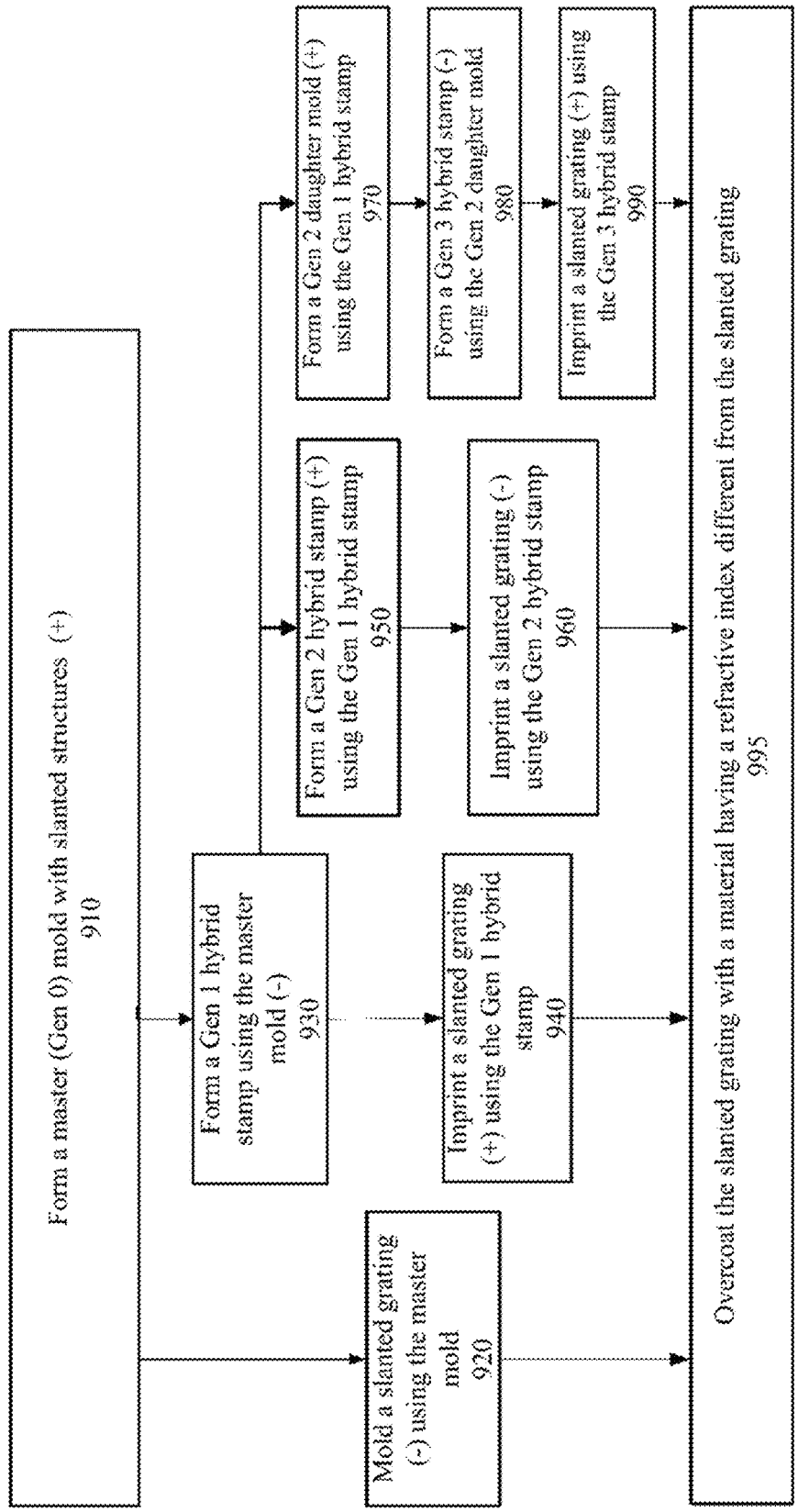
FIG. 9 is a simplified flow chart illustrating an example method of fabricating a slanted surface-relief grating using nanoimprint lithography according to certain embodiments.

FIG. 9 is a simplified flow chart 900 illustrating example methods of fabricating a slanted surface-relief grating using nanoimprint lithography according to certain embodiments. As described above, different generations of NIL stamps may be made and used as the working stamp to mold the slanted gratings. For example, in some embodiments, a master mold (i.e., generation 0 mold, which may be a hard mold) may be used as the working stamp to mold the slanted grating directly. In some embodiments, a hybrid stamp (e.g., a generation 1 hybrid mold or stamp) may be fabricated using the master mold and may be used as the working stamp for nanoimprinting. In some embodiments, a generation 2 hybrid mold (or stamp) may be made from the generation 1 mold, and may be used as the working stamp for the nanoimprinting. In some embodiments, a generation 3 mold, a generation 4 mold, and so on, may be made and used as the working stamp.

At block 910, a master mold with a slanted structure may be fabricated using, for example, a slanted etching process that uses reactive ion beams or chemically-assisted reactive ion beams, a micromachining process, or a 3-D printing process. The master mold may be referred to as the generation 0 (or Gen 0) mold. The master mold may include quartz, fused silica, silicon, other metal-oxides, or plastic compounds. The slanted structure of the master mold may be referred to as having a positive (+) tone. The master mold may be used as a working stamp for molding the slanted grating directly (i.e., hard NIL) at block 920. As described above, when the master mold is used as the working stamp, the slanted structure of the master mold may be complementary to the desired slanted grating. Alternatively, the master mold may be used to make a hybrid stamp as the working stamp for molding the slanted grating. The slanted structure of the hybrid stamp may be similar to the desired slanted grating or may be complementary to the desired slanted grating, depending on the generation of the hybrid stamp.

At block 920, a slanted grating may be molded in, for example, a moldable layer, such as a NIL material layer, using the master mold as described above with respect to, for example, FIGS. 6A and 6B. The moldable layer may be coated on a waveguide substrate. The master mold may be pressed against the moldable layer. The moldable layer may then be cured to fix the structure formed within the moldable layer by the master mold. The master mold may be detached from the moldable layer to form a slanted grating within the moldable layer. The slanted grating within the moldable layer may have a negative (−) tone compared with the slanted structure of the master mold.

Alternatively, at block 930, a hybrid stamp (e.g., a hard stamp, a soft stamp, or a hard-soft stamp) with a slanted structure may be fabricated using the master mold as described above with respect to, for example, FIGS. 7A-7D or the process described with respect to, for example, FIGS. 8A-8D. For example, the process of fabricating the hybrid stamp may include coating the master mold with a soft stamp material, such as a resin material described above. A soft stamp foil may then be laminated on the soft stamp material, for example, using a roller. The soft stamp foil and the attached soft stamp material may be securely attached to each other and may be detached from the master mold to form the soft stamp. The hybrid stamp fabricated at block 930 may be referred to as a generation 1 (or Gen 1) stamp. The slanted grating within the Gen 1 stamp may have a negative (−) tone compared with the slanted structure of the master mold.

At block 940, a slanted surface-relief grating may be imprinted using the Gen 1 stamp as described above with respect to, for example, FIGS. 8A-8D. For example, a waveguide substrate may be coated with a NIL material layer. The Gen 1 stamp may be laminated on the NIL material layer using, for example, a roller. After the NIL material layer is cured, the Gen 1 stamp may be delaminated from the NIL material layer to form a slanted grating within the NIL material layer. The slanted grating within the NIL material layer may have a positive tone.

Alternatively, in some embodiments, at block 950, a second generation hybrid stamp (Gen 2 stamp) may be fabricated using the Gen 1 stamp using a process similar to the process for fabricating the Gen 1 stamp as described above with respect to, for example, FIGS. 7A-8D. The slanted structure within the Gen 2 stamp may have a positive tone.

At block 960, a slanted surface-relief grating may be imprinted using the Gen 2 stamp as described above with respect to, for example, FIGS. 8A-8D. For example, a waveguide substrate may be coated with a NIL material layer. The Gen 2 stamp may be laminated on the NIL material layer using, for example, a roller. After the NIL material layer is cured, the Gen 2 stamp may be delaminated from the NIL material layer to form a slanted grating within the NIL material layer. The slanted grating within the NIL material layer may have a negative tone.

Alternatively, in some embodiments, at block 970, a second generation (Gen 2) daughter mold may be fabricated using the Gen 1 stamp using a process similar to the process for fabricating the Gen 1 stamp as described above with respect to, for example, FIGS. 7A-8D. The slanted structure within the Gen 2 daughter mold may have a positive tone.

At block 980, a third generation hybrid stamp (Gen 3 stamp) may be fabricated using the Gen 2 daughter mold using a process similar to the process for fabricating the Gen 1 stamp or the Gen 2 daughter mold as described above with respect to, for example, FIGS. 7A-8D. The slanted structure within the Gen 3 stamp may have a negative tone.

At block 990, a slanted surface-relief grating may be imprinted using the Gen 3 stamp as described above with respect to, for example, FIGS. 8A-8D. For example, a waveguide substrate may be coated with a NIL material layer. The Gen 3 stamp may be laminated on the NIL material layer using, for example, a roller. After the NIL material layer is cured, the Gen 3 stamp may be delaminated from the NIL material layer to form a slanted grating within the NIL material layer. The slanted grating within the NIL material layer may have a positive tone.

Even though not shown in FIG. 9, in some embodiments, a fourth generation hybrid stamp, a fifth generation hybrid stamp, and so on, may be fabricated using a similar process, and may be used as the working stamp for imprinting the slanted grating.

Optionally, at block 995, the slanted grating may be over-coated with a material having a refractive index different from the slanted grating (e.g., the NIL material layer). For example, in some embodiments, a high refractive index material, such as Hafnia, Titania, Tungsten oxide, Zirconium oxide, Gallium sulfide, Gallium nitride, Gallium phosphide, silicon, or a high refractive index polymer, may be used to over-coat the slanted grating and fill the gaps between the slanted grating ridges. In some embodiments, a low refractive index material, such as silicon oxide, magnesium fluoride, porous silica, or fluorinated low index monomer (or polymer), and the like, may be used to over-coat the slanted grating and fill the gaps between the slanted grating ridges.

Definitions

Unless defined otherwise, all technical and scientific terms used herein have the same meaning as is commonly understood by one of skill in the art to which this disclosure belongs. All patents and publications referred to herein are incorporated by reference in their entireties.

As used herein, the terms "crosslinkable moiety" or "polymerizable moiety" refer to a chemical group capable of participating in a crosslinking or polymerization reaction, at any level, for example, initiation, propagation, etc. Crosslinkable or polymerizable moieties include, but are not limited to, addition crosslinkable or polymerizable moieties and condensation crosslinkable or polymerizable moieties. Crosslinkable or polymerizable moieties include, but are not limited to, double bonds, triple bonds, and the like.

As used herein, the term "inhibitor" refers to one or more compositions, compounds, molecules, etc., that are capable of inhibiting or substantially inhibiting the polymerization of the polymerizable component when the photoinitiating light source is on or off. Polymerization inhibitors typically react very quickly with radicals and effectively stop a polymerization reaction. Inhibitors cause an inhibition time during which little to no photopolymer forms, e.g., only very small chains. Typically, photopolymerization occurs only after nearly 100% of the inhibitor is reacted.

As used herein, the term "oligomer" refers to a polymer having a limited number of repeating units, for example, but without limitation, approximately 30 repeat units or less, or any large molecule able to diffuse at least about 100 nm in approximately 2 minutes at room temperature when dissolved in an article of the present disclosure. Such oligomers may contain one or more crosslinkable or polymerizable groups whereby the crosslinkable or polymerizable groups may be the same or different from other possible monomers in the crosslinkable or polymerizable component. Furthermore, when more than one crosslinkable or polymerizable group is present on the oligomer, they may be the same or different. Additionally, oligomers may be dendritic. Oligomers are considered herein to be photoactive monomers, although they are sometimes referred to as "photoactive oligomer(s)".

As used herein, the terms "photo acid generators," "photo base generators," and "photo radical generators," refer to one or more compositions, compounds, molecules, etc., that, when exposed to a light source, generate one or more compositions, compounds, molecules, etc., that are acidic, basic, or a free radical.

As used herein, the term "about" means that dimensions, sizes, formulations, parameters, shapes and other quantities and characteristics are not and need not be exact, but may be approximate and/or larger or smaller, as desired, reflecting tolerances, conversion factors, rounding off, measurement error and the like, and other factors known to those of skill in the art. In general, a dimension, size, formulation, parameter, shape or other quantity or characteristic is "about" or "approximate" whether or not expressly stated to be such. It is noted that embodiments of very different sizes, shapes and dimensions may employ the described arrangements.

Unless otherwise stated, the chemical structures depicted herein are intended to include compounds which differ only in the presence of one or more isotopically enriched atoms. For example, compounds where one or more hydrogen atoms is replaced by deuterium or tritium, or where one or more carbon atoms is replaced by $^{13}$C- or $^{14}$C-enriched carbons, are within the scope of this disclosure.

"Alkyl" refers to a straight or branched hydrocarbon chain radical consisting solely of carbon and hydrogen atoms, containing no unsaturation, having from one to ten carbon atoms (e.g., (C$_{1-10}$)alkyl or C$_{1-10}$ alkyl). Whenever it appears herein, a numerical range such as "1 to 10" refers to each integer in the given range—e.g., "1 to 10 carbon atoms" means that the alkyl group may consist of 1 carbon atom, 2 carbon atoms, 3 carbon atoms, etc., up to and including 10 carbon atoms, although the definition is also intended to cover the occurrence of the term "alkyl" where no numerical range is specifically designated. Typical alkyl groups include, but are in no way limited to, methyl, ethyl, propyl, isopropyl, n-butyl, isobutyl, sec-butyl isobutyl, tertiary butyl, pentyl, isopentyl, neopentyl, hexyl, septyl, octyl, nonyl and decyl. The alkyl moiety may be attached to the rest of the molecule by a single bond, such as for example, methyl (Me), ethyl (Et), n-propyl (Pr), 1-methylethyl (isopropyl), n-butyl, n-pentyl, 1,1-dimethylethyl (t-butyl) and 3-methylhexyl. Unless stated otherwise specifically in the specification, an alkyl group is optionally substituted by one or more of substituents which are independently heteroalkyl, alkenyl, alkynyl, cycloalkyl, heterocycloalkyl, aryl, aralkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$N(R$^a$)$_2$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$ where each R$^a$ is independently hydrogen, fluoroalkyl, carbocyclyl, carbocyclylalkyl, aryl, aralkyl, heterocycloalkyl, heterocycloalkylalkyl, heteroaryl or heteroarylalkyl.

"Alkenyl" refers to a straight or branched hydrocarbon chain radical group consisting solely of carbon and hydrogen atoms, containing at least one double bond, and having from two to ten carbon atoms (i.e., (C$_{2-10}$)alkenyl or C$_{2-10}$ alkenyl). Whenever it appears herein, a numerical range such as "2 to 10" refers to each integer in the given range—e.g., "2 to 10 carbon atoms" means that the alkenyl group may consist of 2 carbon atoms, 3 carbon atoms, etc., up to and including 10 carbon atoms. The alkenyl moiety may be attached to the rest of the molecule by a single bond, such as for example, ethenyl (i.e., vinyl), prop-1-enyl (i.e., allyl), but-1-enyl, pent-1-enyl and penta-1,4-dienyl. Unless stated otherwise specifically in the specification, an alkenyl group is optionally substituted by one or more substituents which are independently alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Alkynyl" refers to a straight or branched hydrocarbon chain radical group consisting solely of carbon and hydrogen atoms, containing at least one triple bond, having from two to ten carbon atoms (i.e., (C$_{2-10}$)alkynyl or C$_{2-10}$ alkynyl). Whenever it appears herein, a numerical range such as "2 to 10" refers to each integer in the given range—e.g., "2 to 10 carbon atoms" means that the alkynyl group may consist of 2 carbon atoms, 3 carbon atoms, etc., up to and including 10 carbon atoms. The alkynyl may be attached to the rest of the molecule by a single bond, for example, ethynyl, propynyl, butynyl, pentynyl and hexynyl. Unless stated otherwise specifically in the specification, an alkynyl group is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Carboxaldehyde" refers to a —(C=O)H radical.
"Carboxyl" refers to a —(C=O)OH radical.
"Cyano" refers to a —CN radical.
"Cycloalkyl" refers to a monocyclic or polycyclic radical that contains only carbon and hydrogen, and may be saturated, or partially unsaturated. Cycloalkyl groups include groups having from 3 to 10 ring atoms (i.e. (C$_{3-10}$)cycloalkyl or C$_{3-10}$ cycloalkyl). Whenever it appears herein, a numerical range such as "3 to 10" refers to each integer in the given range—e.g., "3 to 10 carbon atoms" means that the cycloalkyl group may consist of 3 carbon atoms, etc., up to and including 10 carbon atoms. Illustrative examples of cycloalkyl groups include, but are not limited to the following moieties: cyclopropyl, cyclobutyl, cyclopentyl, cyclopentenyl, cyclohexyl, cyclohexenyl, cycloheptyl, cyclooctyl, cyclononyl, cyclodecyl, norbornyl, and the like. Unless stated otherwise specifically in the specification, a cycloalkyl group is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

The term "alkoxy" refers to the group —O-alkyl, including from 1 to 8 carbon atoms of a straight, branched, cyclic configuration and combinations thereof attached to the parent structure through an oxygen. Examples include, but are not limited to, methoxy, ethoxy, propoxy, isopropoxy, cyclopropyloxy and cyclohexyloxy. "Lower alkoxy" refers to alkoxy groups containing one to six carbons.

The term "substituted alkoxy" refers to alkoxy wherein the alkyl constituent is substituted (i.e., —O-(substituted alkyl)). Unless stated otherwise specifically in the specification, the alkyl moiety of an alkoxy group is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, —N(R$^a$)C(NR$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Amino" or "amine" refers to a —N(R$^a$)$_2$ radical group, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl, unless stated otherwise specifically in the specification. When a —N(R$^a$)$_2$ group has two R$^a$ substituents other than hydrogen, they can be combined with the nitrogen atom to form a 4-, 5-, 6- or 7-membered ring. For example, —N(R$^a$)$_2$ is intended to include, but is not limited to, 1-pyrrolidinyl and 4-morpholinyl. Unless stated otherwise specifically in the specification, an amino group is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Aromatic" or "aryl" or "Ar" refers to an aromatic radical with six to ten ring atoms (e.g., C$_6$-C$_{10}$ aromatic or C$_6$-C$_{10}$ aryl) which has at least one ring having a conjugated pi electron system which is carbocyclic (e.g., phenyl, fluorenyl, and naphthyl). Bivalent radicals formed from substituted benzene derivatives and having the free valences at ring atoms are named as substituted phenylene radicals. Bivalent radicals derived from univalent polycyclic hydrocarbon radicals whose names end in "-yl" by removal of one hydrogen atom from the carbon atom with the free valence are named by adding "-idene" to the name of the corresponding univalent radical, e.g., a naphthyl group with two points of attachment is termed naphthylidene. Whenever it appears herein, a numerical range such as "6 to 10" refers to each integer in the given range; e.g., "6 to 10 ring atoms" means that the aryl group may consist of 6 ring atoms, 7 ring atoms, etc., up to and including 10 ring atoms. The term includes monocyclic or fused-ring polycyclic (i.e., rings which share adjacent pairs of ring atoms) groups. Unless stated otherwise specifically in the specification, an aryl moiety is optionally substituted by one or more substituents which are independently alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Aralkyl" or "arylalkyl" refers to an (aryl)alkyl-radical where aryl and alkyl are as disclosed herein and which are optionally substituted by one or more of the substituents described as suitable substituents for aryl and alkyl respectively.

"Ester" refers to a chemical radical of formula —COOR, where R is selected from the group consisting of alkyl, cycloalkyl, aryl, heteroaryl (bonded through a ring carbon) and heteroalicyclic (bonded through a ring carbon). The procedures and specific groups to make esters are known to those of skill in the art and can readily be found in seminal sources such as Greene and Wuts, Protective Groups in Organic Synthesis, 3$^{rd}$ Ed., John Wiley & Sons, New York, N.Y., 1999, which is incorporated herein by reference in its entirety. Unless stated otherwise specifically in the specification, an ester group is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, trifluoromethyl, trifluoromethoxy, nitro, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Halo," "halide," or, alternatively, "halogen" is intended to mean fluoro, chloro, bromo or iodo. The terms "haloalkyl," "haloalkenyl," "haloalkynyl," and "haloalkoxy" include alkyl, alkenyl, alkynyl and alkoxy structures that are substituted with one or more halo groups or with combinations thereof. For example, the terms "fluoroalkyl" and "fluoroalkoxy" include haloalkyl and haloalkoxy groups, respectively, in which the halo is fluorine.

"Heteroalkyl," "heteroalkenyl," and "heteroalkynyl" refer to optionally substituted alkyl, alkenyl and alkynyl radicals and which have one or more skeletal chain atoms selected from an atom other than carbon, e.g., oxygen, nitrogen, sulfur, phosphorus or combinations thereof. A numerical range may be given—e.g., C$_1$-C$_4$ heteroalkyl which refers to the chain length in total, which in this example is 4 atoms long. A heteroalkyl group may be substituted with one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, nitro, oxo, thioxo, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Heteroaryl" or "heteroaromatic" or "HetAr" or "Het" refers to a 5- to 18-membered aromatic radical (e.g., C$_5$-C$_{13}$ heteroaryl) that includes one or more ring heteroatoms selected from nitrogen, oxygen and sulfur, and which may be a monocyclic, bicyclic, tricyclic or tetracyclic ring system. Whenever it appears herein, a numerical range such as "5 to 18" refers to each integer in the given range—e.g., "5 to 18 ring atoms" means that the heteroaryl group may consist of 5 ring atoms, 6 ring atoms, etc., up to and including 18 ring atoms. Bivalent radicals derived from univalent heteroaryl radicals whose names end in "-yl" by removal of one hydrogen atom from the atom with the free valence are named by adding "-idene" to the name of the corresponding univalent radical—e.g., a pyridyl group with two points of attachment is a pyridylidene. A N-containing "heteroaromatic" or "heteroaryl" moiety refers to an aromatic group in which at least one of the skeletal atoms of the ring is a nitrogen atom. The polycyclic heteroaryl group may be fused or non-fused. The heteroatom(s) in the heteroaryl radical are optionally oxidized. One or more nitrogen atoms, if present, are optionally quaternized. The heteroaryl may be attached to the rest of the molecule through any atom of the ring(s). Examples of heteroaryls include, but are not limited to, azepinyl, acridinyl, benzimidazolyl, benzindolyl, 1,3-benzodioxolyl, benzofuranyl, benzooxazolyl, benzo[d]thiazolyl, benzothiadiazolyl, benzo[b][1,4]dioxepinyl, benzo[b][1,4]oxazinyl, 1,4-benzodioxanyl, benzonaphthofuranyl, benzoxazolyl, benzodioxolyl, benzodioxinyl, benzoxazolyl, benzopyranyl, benzopyranonyl, benzofuranyl, benzofuranonyl, benzofurazanyl, benzothiazolyl, benzothienyl(benzothiophenyl), benzothieno[3,2-d]pyrimidinyl, benzotriazolyl, benzo[4,6]imidazo[1,2-a]pyridinyl, carbazolyl, cinnolinyl, cyclopenta[d]pyrimidinyl, 6,7-dihydro-5H-cyclopenta[4,5]thieno[2,3-d]pyrimidinyl, 5,6-dihydrobenzo[h]quinazolinyl, 5,6-dihydrobenzo[h]cinnolinyl, 6,7-dihydro-5H-benzo[6,7]cyclohepta[1,2-c]pyridazinyl, dibenzofuranyl, dibenzothiophenyl, furanyl, furazanyl, furanonyl, furo[3,2-c]pyridinyl, 5,6,7,8,9,10-hexahydrocycloocta[d]pyrimidinyl, 5,6,7,8,9,10-hexahydrocycloocta[d]pyridazinyl, 5,6,7,8,9,10-hexahydrocycloocta[d]pyridinyl, isothiazolyl, imidazolyl, indazolyl, indolyl, indazolyl, isoindolyl, indolinyl, isoindolinyl, isoquinolyl, indolizinyl, isoxazolyl, 5,8-methano-5,6,7,8-tetrahydroquinazolinyl, naphthyridinyl, 1,6-naphthyridinonyl, oxadiazolyl, 2-oxoazepinyl, oxazolyl, oxiranyl, 5,6,6a,7,8,9,10,10a-octahydrobenzo[h]quinazolinyl, 1-phenyl-1H-pyrrolyl, phenazinyl, phenothiazinyl, phenoxazinyl, phthalazinyl, pteridinyl, purinyl, pyranyl, pyrrolyl, pyrazolyl, pyrazolo[3,4-d]pyrimidinyl, pyridinyl, pyrido[3,2-d]pyrimidinyl, pyrido[3,4-d]pyrimidinyl, pyrazinyl, pyrimidinyl, pyridazinyl, pyrrolyl, quinazolinyl, quinoxalinyl, quinolinyl, isoquinolinyl, tetrahydroquinolinyl, 5,6,7,8-tetrahydroquinazolinyl, 5,6,7,8-tetrahydrobenzo[4,5]thieno[2,3-d]pyrimidinyl, 6,7,8,9-tetrahydro-5H-cyclohepta[4,5]thieno[2,3-d]pyrimidinyl, 5,6,7,8-tetrahydropyrido[4,5-c]pyridazinyl, thiazolyl, thiadiazolyl, thiapyranyl, triazolyl, tetrazolyl, triazinyl, thieno[2,3-d]pyrimidinyl, thieno[3,2-d]pyrimidinyl, thieno[2,3-c]pyridinyl, and thiophenyl (i.e., thienyl). Unless stated otherwise specifically in the specification, a heteroaryl moiety is optionally substituted by one or more substituents which are independently: alkyl, heteroalkyl, alkenyl, alkynyl, cycloalkyl, heterocycloalkyl, aryl, arylalkyl, heteroaryl, heteroarylalkyl, hydroxy, halo, cyano, nitro, oxo, thioxo, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

Substituted heteroaryl also includes ring systems substituted with one or more oxide (—O—) substituents, such as, for example, pyridinyl N-oxides.

"Heteroarylalkyl" refers to a moiety having an aryl moiety, as described herein, connected to an alkylene moiety, as described herein, wherein the connection to the remainder of the molecule is through the alkylene group.

"Heterocycloalkyl" refers to a stable 3- to 18-membered non-aromatic ring radical that comprises two to twelve carbon atoms and from one to six heteroatoms selected from nitrogen, oxygen and sulfur. Whenever it appears herein, a numerical range such as "3 to 18" refers to each integer in the given range—e.g., "3 to 18 ring atoms" means that the heterocycloalkyl group may consist of 3 ring atoms, 4 ring atoms, etc., up to and including 18 ring atoms. Unless stated otherwise specifically in the specification, the heterocycloalkyl radical is a monocyclic, bicyclic, tricyclic or tetracyclic ring system, which may include fused or bridged ring systems. The heteroatoms in the heterocycloalkyl radical may be optionally oxidized. One or more nitrogen atoms, if present, are optionally quaternized. The heterocycloalkyl radical is partially or fully saturated. The heterocycloalkyl may be attached to the rest of the molecule through any atom of the ring(s). Examples of such heterocycloalkyl radicals include, but are not limited to, dioxolanyl, thienyl[1,3]dithianyl, decahydroisoquinolyl, imidazolinyl, imidazolidinyl, isothiazolidinyl, isoxazolidinyl, morpholinyl, octahydroindolyl, octahydroisoindolyl, 2-oxopiperazinyl, 2-oxopiperidinyl, 2-oxopyrrolidinyl, oxazolidinyl, piperidinyl, piperazinyl, 4-piperidonyl, pyrrolidinyl, pyrazolidinyl, quinuclidinyl, thiazolidinyl, tetrahydrofuryl, trithianyl, tetrahydropyranyl, thiomorpholinyl, thiamorpholinyl, 1-oxothiomorpholinyl, and 1,1-dioxo-thiomorpholinyl. Unless stated otherwise specifically in the specification, a heterocycloalkyl moiety is optionally substituted by one or more substituents which independently are: alkyl, heteroalkyl, alkenyl, alkynyl, cycloalkyl, heterocycloalkyl, aryl, arylalkyl, heteroaryl, heteroarylalkyl, hydroxy, halo, cyano, nitro, oxo, thioxo, trimethylsilanyl, —OR$^a$, —SR$^a$, —OC(O)—R$^a$, —SC(O)—R$^a$, —N(R$^a$)$_2$, —C(O)R$^a$, —C(O)OR$^a$, —C(O)SR$^a$, —OC(O)N(R$^a$)$_2$, —C(O)N(R$^a$)$_2$, —N(R$^a$)C(O)OR$^a$, —N(R$^a$)C(O)R$^a$, —N(R$^a$)C(O)N(R$^a$)$_2$, N(R$^a$)C(NR$^a$)N(R$^a$)$_2$, —N(R$^a$)S(O)$_t$R$^a$ (where t is 1 or 2), —S(O)$_t$R$^a$ (where t is 1 or 2), —S(O)$_t$OR$^a$ (where t is 1 or 2), —S(O)$_t$N(R$^a$)$_2$ (where t is 1 or 2), or PO$_3$(R$^a$)$_2$, where each R$^a$ is independently hydrogen, alkyl, fluoroalkyl, carbocyclyl, carbocyclylalkyl, aryl, aralkyl, heterocycloalkyl, heterocycloalkylalkyl, heteroaryl or heteroarylalkyl.

"Heterocycloalkyl" also includes bicyclic ring systems wherein one non-aromatic ring, usually with 3 to 7 ring atoms, contains at least 2 carbon atoms in addition to 1-3 heteroatoms independently selected from oxygen, sulfur, and nitrogen, as well as combinations comprising at least one of the foregoing heteroatoms; and the other ring, usually with 3 to 7 ring atoms, optionally contains 1-3 heteroatoms independently selected from oxygen, sulfur, and nitrogen and is not aromatic.

"Nitro" refers to the —NO$_2$ radical.

"Oxa" refers to the —O— radical.

"Oxo" refers to the =O radical.

"Moiety" refers to a specific segment or functional group of a molecule. Chemical moieties are often recognized chemical entities embedded in or appended to a molecule.

"Substituted" means that the referenced group may have attached one or more additional groups, radicals or moieties individually and independently selected from, for example, acyl, alkyl, alkylaryl, cycloalkyl, aralkyl, aryl, carbohydrate, carbonate, heteroaryl, heterocycloalkyl, hydroxy, alkoxy, aryloxy, mercapto, alkylthio, arylthio, cyano, halo, carbonyl, ester, thiocarbonyl, isocyanato, thiocyanato, isothiocyanato, nitro, oxo, perhaloalkyl, perfluoroalkyl, phosphate, silyl, sulfinyl, sulfonyl, sulfonamidyl, sulfoxyl, sulfonate, urea, and amino, including mono- and di-substituted amino groups, and protected derivatives thereof. The substituents themselves may be substituted, for example, a cycloalkyl substituent may itself have a halide substituent at one or more of its ring carbons. The term "optionally substituted" means optional substitution with the specified groups, radicals or moieties.

"Sulfanyl" refers to groups that include —S-(optionally substituted alkyl), —S-(optionally substituted aryl), —S-(optionally substituted heteroaryl) and —S-(optionally substituted heterocycloalkyl).

Compounds of the present disclosure also include crystalline and amorphous forms of those compounds, including, for example, polymorphs, pseudopolymorphs, solvates, hydrates, unsolvated polymorphs (including anhydrates), conformational polymorphs, and amorphous forms of the compounds, as well as mixtures thereof. "Crystalline form" and "polymorph" are intended to include all crystalline and amorphous forms of the compound, including, for example, polymorphs, pseudopolymorphs, solvates, hydrates, unsolvated polymorphs (including anhydrates), conformational polymorphs, and amorphous forms, as well as mixtures thereof, unless a particular crystalline or amorphous form is referred to.

Specific Embodiments of the Disclosure

Next-generation artificial reality (e.g., augmented reality (AR), virtual reality (VR), or mixed reality (MR)) devices require a large field-of-view and high see-through quality. One way to achieve such performance is to use nanoimprinting lithography (NIL) to fabricate surface-relief gratings with a high refractive index.

As discussed above, it can be challenging to fabricate surface relief gratings using NIL. A soft mold is required to transfer the grating pattern (e.g., microstructure) from a hard master mold to the NIL material to be imprinted. However, the soft mold material must have a sufficiently low viscosity to support ease of coating (e.g., by the master mold), a sufficiently low surface energy (e.g., water contact angle) to reduce adhesion to either the master mold or to the NIL imprinting materials, and a sufficiently high mechanical strength (e.g., modulus) to maintain pattern fidelity during and after delamination.

Provided below are various aspects and embodiments of NIL soft mold precursor materials (e.g., comprising value ranges for viscosity, water contact angle, and/or modulus, among other parameters) that address these challenges. According to certain embodiments, further disclosed herein are embodiments of a polymeric material comprising a partially or totally polymerized or crosslinked NIL precursor material, a NIL soft mold comprising the polymeric material, a process for making the NIL soft mold, and a method of using the NIL soft mold to form a NIL grating.

NIL Soft Mold Precursor Material.

The present disclosure provides a nanoimprint lithography (NIL) soft mold precursor material, comprising a curable fluorinated base resin component, one or more additives, one or more crosslinkers, and one or more of a photo radical generator, a photo acid generator, or both.

Base Resin Component.

In some embodiments, the base resin component comprises an electromagnetic radiation sensitive material. In some embodiments, the base resin component is thermal-sensitive. In some embodiment, the base resin component is thermal curable. In some embodiments, the base resin component is light-sensitive. In some embodiments, the base resin component is UV curable.

In some embodiments, the base resin component comprises one or more UV curable groups. For example, in some embodiments, each molecule of the base resin component comprises one or more UV curable groups. In some embodiments, the one or more UV curable groups is acrylate, epoxy, or a mixture thereof. In some embodiment, the base resin component is thermal curable. In some embodiment, the component comprises one or more thermal curable groups. In some embodiments, each molecule of the base resin component comprises one or more thermal curable groups. In some embodiments, the one or more thermal curable groups is acrylate, epoxy, vinyl, thiol, or a mixture thereof.

In some embodiments, the base resin component comprises backbones of perfluoropolyether, fluorinated siloxane, or any derivatives thereof. In some embodiments, perfluoropolyether (PFPE) imparts benefits to the NIL soft mold precursor material by reducing surface tension, reducing friction (e.g., abrasion) and wear due to usage. In some embodiments, PFPE further improves mechanical strength, resistance to chemical reactivity and optical properties of the NIL soft mold precursor material.

In some embodiments, the base resin component comprises a tetra-functional perfluoropolyether acrylate. In some embodiments, the weight percent of the tetra-functional perfluoropolyether acrylate in the precursor material ranges from 40% to 80%, from 45% to 70%, or from 53% to 60%. In some embodiments, the weight percent of the tetra-functional perfluoropolyether acrylate in the precursor material is between 30% and 35%, between 35% and 40%, between 40% and 45%, between 45% and 50%, between 50% and 55%, between 55% and 60%, between 60% and 65%, between 65% and 70%, between 70% and 75%, or between 75% and 80%. In some embodiments, the tetra-functional perfluoropolyether acrylate is a dynamic viscosity of between 5,000 and 25,000 mPa, between 10,000 and 20,000 mPa, or between 12,500 and 17,500 mPa.

In some embodiments, the base resin component comprises a bi-functional perfluoropolyether acrylate. In some embodiments, the bi-functional perfluoropolyether acrylate is a bifunctional perfluoropolyether-urethane methacrylate. In some embodiments, the weight percent of the bi-functional perfluoropolyether acrylate in the precursor material ranges from 5% to 40%, from 15% to 30%, or from 20% to 26%. In some embodiments, the weight percent of the bi-functional perfluoropolyether acrylate in the precursor material is between 1% and 5%, between 5% and 10%, between 10% and 15%, between 15% and 20%, between 20% and 25%, between 25% and 30%, between 30% and 35%, between 35% and 40%, between 40% and 45%, or between 45% and 50%. In some embodiments, the bi-functional perfluoropolyether acrylate has a viscosity of between 100 and 2000 mPa, between 300 and 1500 mPa, or between 500 and 1000 mPa. In some embodiments, the bi-functional perfluoropolyether acrylate has a density of between 0.1 and 5 g/cm$^3$, between 0.5 and 3 g/cm$^3$, or between 1 and 2 g/cm$^3$. In some embodiments, the density is measured at a temperature between 10 and 40° C., between 15 and 30° C., or between 17 and 25° C.

In some embodiments, the base resin component comprises backbones of perfluoropolyether modified by one or more polymer modifiers. In some embodiments, the one or more polymer modifiers are selected from amide, amido silane, alcohol, ehyoxylated alcohol, polyurethane dispersion, urethane acrylate, urethane methacrylate, and/or phosphate. In some such embodiments, the base resin component comprises a dialcohol terminated, ethyoxylated perfluoropolyether. In some embodiments, the base resin component comprises a perfluoropolyether-tetraurethane acrylate in a mixture of ethyl acetate and butyl acetate (e.g., 1:1 by weight). In some such embodiments, the NIL soft mold precursor material comprises a final perfluoropolyether (PFPE) content of between 1 and 20% by weight. In some embodiments, the NIL soft mold precursor material comprises a final perfluoropolyether (PFPE) content of greater than 20% by weight.

In some embodiments, the base resin component comprises a light-sensitive material such as a photoinitiator and/or a photoactive polymerizable material (e.g., a monomer, polymer, and/or a combination thereof). The photoinitiator causes light-initiated crosslinking or polymerization of the photoactive polymerizable material (e.g., light-initiated curing) upon exposure to a wavelength of light that activates the photoinitiator (e.g., a photoinitiating light source). In some embodiments, the base resin component comprises a combination of components, some of which individually are not light-sensitive, yet in combination are capable of activating the photoactive monomer or polymer (e.g., a dye/amine, a sensitizer/iodonium salt, a dye/borate salt, etc.). In some embodiments, a light-sensitive material comprises a single photoinitiator or a combination of two or more photoinitiators. For example, in some embodiments, two or more photoinitiators are used to allow light-initiated crosslinking or polymerization of the photoactive monomer or polymer upon exposure to two or more different wavelengths of light. In some embodiments, a light-sensitive material comprises a photoactive polymerizable material that comprises one or more functional groups that undergo curing. In some embodiments, a light-sensitive material comprises one or more photoactive polymerizable materials that are also photoinitiators (e.g., N-methylmaleimide, derivatized acetophenones, etc.).

In some embodiments, the base resin component comprises one or more organic resins that are carbon-based and/or comprise hydrogen, sulfur, oxygen, nitrogen, or various other elements in the one or more resins. In some embodiments, the base resin component comprises acrylate, methyl acrylate, vinyl (e.g., olefin or heterocyclic) groups, and/or a mixture of such.

In some embodiments, the base resin component comprises one or more reactive molecules, monomers, oligomers, and/or polymers. In some embodiments, the base resin component comprises of 1, 2, 3, 4, 5, 6, 7, 8, 9, 10, or more than 10 unique types of reactive molecules, monomers, oligomers, and/or polymers. Specifically, in some embodiments, the base resin component comprises one or more crosslinkable monomers, one or more polymerizable monomers, or both. In some embodiments, the crosslinkable monomers or the polymerizable monomers comprise one or more crosslinkable or polymerizable moieties. In some embodiments, the base resin component comprises no less than 2 unique types of crosslinkable or polymerizable moieties.

Depending on the application, in some embodiments, a respective resin in the one or more resins in the base resin component may be selected based on, inter alia, its refractive index, its interaction with other components in the NIL precursor material and/or the associated processing techniques or mechanisms for curing (e.g., crosslinking or polymerizing) the base resin component. Although in some embodiments the base resin components described herein are curable by UV light, by light wavelengths ranging from about 254 nm to about 415 nm or by other curing methods (e.g., electron beam curing, etc.), in some alternative embodiments, a respective one or more resins having different functional groups are cured or crosslinked using different curing or crosslinking mechanisms and/or under different operating conditions. Thus, in some embodiments, the one or more resins in the base resin component are selected based on the desired processing parameters for NIL molding (e.g., of a slanted or non-slanted surface-relief grating), depending on the functional groups present on the one or more resins.

For example, in some embodiments, the base resin component comprises one or more crosslinkable monomers, one or more polymerizable monomers, or both (e.g., in the one or more UV curable groups). In some embodiments, the crosslinkable monomers or the polymerizable monomers comprise one or more crosslinkable or polymerizable moieties.

In some embodiments, the crosslinkable or polymerizable moieties are selected from an ethylenically unsaturated group, an oxirane ring, and a heterocyclic group. In some embodiments, a base resin component comprising an oxirane ring has a higher refractive index than a base resin component comprising an ethylenically unsaturated group. In some embodiments, the crosslinkable or polymerizable moieties are selected from vinyl, allyl, epoxide, acrylate, and methacrylate. In some embodiments, the crosslinkable or polymerizable moieties are selected from optionally substituted alkenyl, optionally substituted cycloalkenyl, optionally substituted alkynyl, optionally substituted acrylate, optionally substituted methacrylate, optionally substituted styrene, optionally substituted epoxide, optionally substituted thiirane, optionally substituted lactone, and optionally substituted carbonate.

In some embodiments, the crosslinkable or polymerizable moieties are selected from:

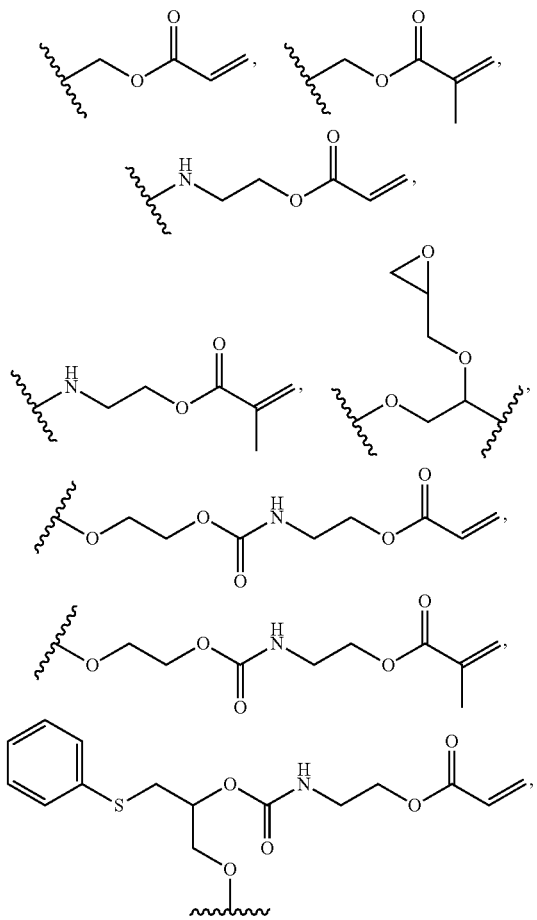

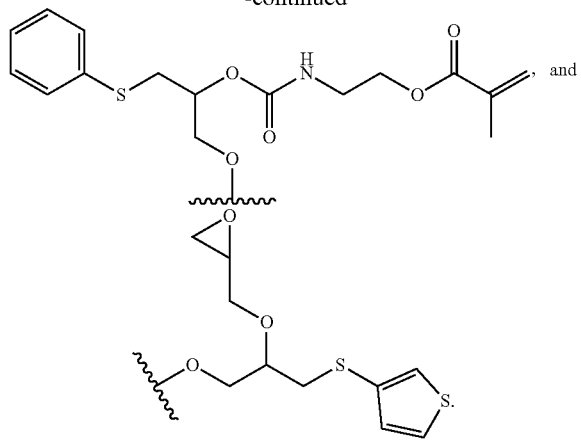

In some embodiments, the crosslinkable monomers or the polymerizable monomers comprise one or more moieties selected from optionally substituted alkyl, optionally substituted heteroalkyl, optionally substituted alkenyl, optionally substituted alkynyl, optionally substituted cycloalkyl, optionally substituted heterocycloalkyl, optionally substituted aryl, optionally substituted arylalkyl, optionally substituted heteroaryl, and optionally substituted heteroarylalkyl.

In some embodiments, the crosslinkable monomers or the polymerizable monomers comprise one or more moieties selected from fluorene, cardo fluorene, spiro fluorene, thianthrene, thiophosphate, anthraquinone, and lactam. In some embodiments, the crosslinkable monomers or the polymerizable monomers comprise one or more linking groups selected from —$C_{1-10}$ alkyl-, —O—$C_{1-10}$ alkyl-, —$C_{1-10}$ alkenyl-, —O—$C_{1-10}$ alkenyl-, —$C_{1-10}$ cycloalkenyl-, —O—$C_{1-10}$ cycloalkenyl-, —$C_{1-10}$ alkynyl-, —O—$C_{1-10}$ alkynyl-, —$C_{1-10}$ aryl-, —O—$C_{1-10}$—, -aryl-, —O—, —S—, —C(O)—, —C(O)O—, —OC(O)—, —OC(O)O—, —N($R^b$)—, —C(O)N($R^b$)—, —N($R^b$)C(O)—, —OC(O)N($R^b$)—, —N($R^b$)C(O)O—, —SC(O)N($R^b$)—, —N($R^b$)C(O)S—, —N($R^b$)C(O)N($R^b$)—, —N($R^b$)C(N$R^b$)N($R^b$)—, —N($R^b$)S(O)$_w$—, —S(O)$_w$N($R^b$)—, —S(O)$_w$O—, —OS(O)$_w$—, —OS(O)$_w$O—, —O(O)P(O$R^b$)O—, (O)P(O—)$_3$, —O(S)P(O$R^b$)O—, and (S)P(O—)$_3$, where w is 1 or 2, and $R^b$ is independently hydrogen, optionally substituted alkyl, or optionally substituted aryl.

In some embodiments, the crosslinkable monomers or the polymerizable monomers comprise one or more terminal groups selected from optionally substituted thiophenyl, optionally substituted thiopyranyl, optionally substituted thienothiophenyl, and optionally substituted benzothiophenyl. In some embodiments, the base resin component comprises one or more derivatives of bisfluorene, dithiolane, thianthrene, biphenol, o-phenylphenol, phenoxy benzyl, bisphenol A, bisphenol F, benzyl, or phenol. In some embodiments, the base resin component comprises one or more of (2,7-bis[(2-acryloyloxyethl)-sulfanyl]thianthrene), benzyl methacrylate, 1,6-hexanediol diacrylate, 1,4-butanediol diacrylate, acryloxypropylsilsesquioxane, or methylsilsesquioxane.

In some embodiments, the base resin component comprises one or more of trimethylolpropane (EO)n triacrylate, caprolactone acrylate, polypropylene glycol monomethacrylate, cyclic trimethylolpropane formal acrylate, phenoxy benzyl acrylate, 3,3,5-trimethyl cyclohexyl acrylate, isobornyl acrylate, o-phenylphenol EO acrylate, 4-tert-butylcyclohexyl acrylate, benzyl acrylate, benzyl methacrylate, biphenylmethyl acrylate, lauryl acrylate, lauryl methacrylate, tridecyl acrylate, lauryl tetradecyl methacrylate, isodecyl acrylate, isodecyl methacrylate, phenol (EO) acrylate, phenoxyethyl methacrylate, phenol (EO)2 acrylate, phenol (EO)4 acrylate, tetrahydrofurfuryl acrylate, tetrahydrofurfuryl methacrylate, nonyl phenol (PO)2 acrylate, nonyl phenol (EO)4 acrylate, nonyl phenol (EO)8 acrylate, ethoxy ethyl acrylate, stearyl acrylate, stearyl methacrylate, methoxy PEG600 methacrylate, 1,6-hexanediol diacrylate, 1,6-hexanediol dimethacrylate, 1,6-hexanediol (EO)n diacrylate, polypropylene glycol 400 diacrylate, 1,4-butanediol dimethacrylate, polypropylene glycol 700 (EO)6 dimethacrylate, 1,6-Hexanediol (EO)n diacrylate, hydroxy pivalic acid neopentyl glycol diacrylate, bisphenol A (EO)10 diacrylate, bisphenol A (EO)10 dimethacrylate, neopentyl glycol dimethacrylate, neopentyl glycol (PO)2 diacrylate, tripropylene glycol diacrylate, ethylene glycol dimethacrylate, dipropylene glycol diacrylate, bisphenol A (EO)30 diacrylate, bisphenol A (EO)30 dimethacrylate, diethylene glycol dimethacrylate, triethylene glycol diacrylate, triethylene glycol dimethacrylate, tetraethylene glycol dimethacrylate, bisphenol A (EO)4 diacrylate, bisphenol A (EO)4 dimethacrylate, bisphenol A (EO)3 diacrylate, bisphenol A (EO)3 dimethacrylate, 1,3-butylene glycol dimethacrylate, tricyclodecane dimethanol diacrylate, tetraethylene glycol diacrylate, polyethylene glycol 400 diacrylate, polyethylene glycol 400 dimethacrylate, polyethylene glycol 200 diacrylate, polyethylene glycol 200 dimethacrylate, polyethylene glycol 300 diacrylate, polyethylene glycol 600 diacrylate, polyethylene glycol 600 dimethacrylate, bisphenol F (EO)4 diacrylate, trimethylolpropane triacrylate, trimethylolpropane trimethacrylate, trimethylolpropane (EO)3 triacrylate, trimethylolpropane (EO)15 triacrylate, trimethylolpropane (EO)6 triacrylate, trimethylolpropane (EO)9 triacrylate, glycerine (PO)3 triacrylate, pentaerythritol triacrylate, trimethylolpropane (PO)3 triacrylate, tris(2-hydroxyethyl)isocyanurate triacrylate, pentaerythritol (EO)n tetraacrylate, ditrimethylolpropane tetraacrylate, pentaerythritol tetraacrylate, dipentaerythritol pentaacrylate, and dipentaerythritol hexaacrylate.

In some embodiments, the base resin component comprises one or more of a phosphate methacrylate, an amine acrylate, an acrylated amine synergist, a carboxylethyl acrylate, a modified epoxy acrylate, a bisfluorene diacrylate, a modified bisphenol fluorene diacrylate, a modified bisphenol fluorene type, a butadiene acrylate, an aromatic difunctional acrylate, an aliphatic multifunctional acrylate, a polyester acrylate, a trifunctional polyester acrylate, a tetrafunctional polyester acrylate, a phenyl epoxy acrylate, a bisphenol A epoxy acrylate, a water soluble acrylate, an aliphatic alkyl epoxy acrylate, a bisphenol A epoxy methacrylate, a soybean oil epoxy acrylate, a difunctional polyester acrylate, a trifunctional polyester acrylate, a tetrafunctional polyester acrylate, a chlorinated polyester acrylate, a hexafunctional polyester acrylate, an aliphatic difunctional acrylate, an aliphatic difunctional methacrylate, an aliphatic trifunctional acrylate, an aliphatic trifunctional methacrylate, an aromatic difunctional acrylate, an aromatic tetrafunctional acrylate, an aliphatic tetrafunctional acrylate, an aliphatic hexafunctional acrylate, an aromatic hexafunctional acrylate, an acrylic acrylate, a polyester acrylate, a sucrose benzoate, a caprolactone methacrylate, a caprolactone acrylate, a phosphate methacrylate, an aliphatic multifunctional acrylate, a phenol novolac epoxy acrylate, a cresol novolac epoxy acrylate, an alkali strippable polyester acrylate, a melamine acrylate, a silicone polyester acrylate, a silicone urethane acrylate, a dendritic acrylate, an aliphatic tetrafunctional methacrylate, a water dispersion urethane acrylate, a water soluble acrylate, an aminated polyester acrylate, a modified epoxy acrylate, or a trifunctional polyester acrylate.

In some embodiments, the base resin component comprises one or more of:

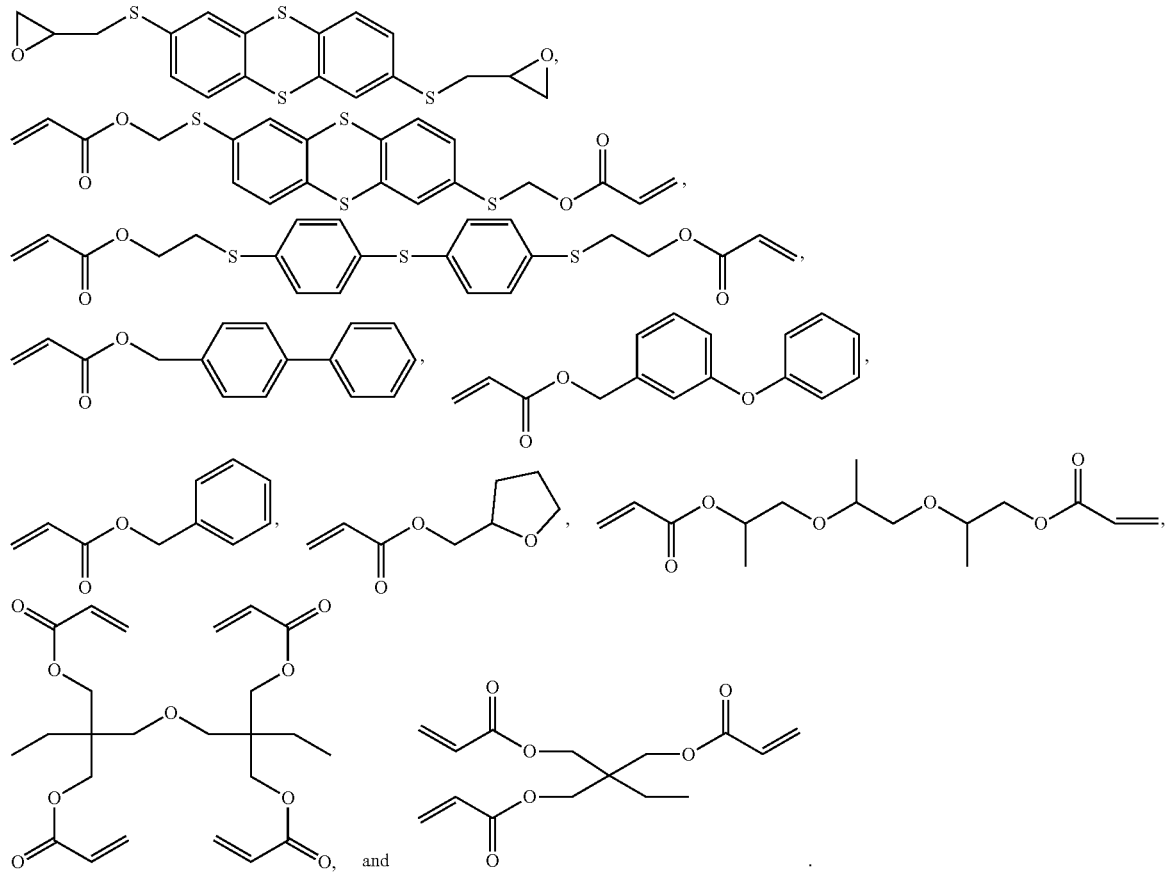

In some embodiments, the base resin component comprises one or more of:

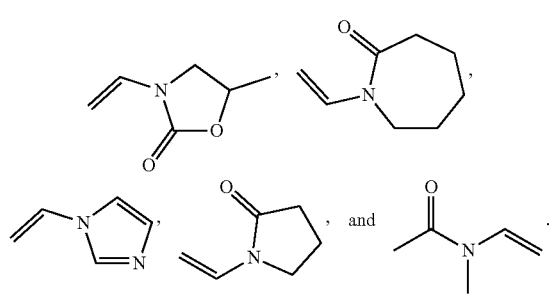

In some embodiments, the base resin component further comprises one or more fluorinated compounds. In some embodiments, the one or more fluorinated compounds are selected from: 2,2,3,3,4,4,5,5,6,6,7,7-dodecafluoroheptyl acrylate, 3,3,4,4,5,5,6,6,7,7,8,8,9,9,10,10,11,11,12,12,12-heneicosafluorododecyl acrylate, 3,3,4,4,5,5,6,6,7,7,8,8,9,9,10,10,10-heptadecafluorodecyl methacrylate, 2,2,3,3,4,4,4-heptafluorobutyl acrylate, 2,2,3,3,4,4,4-heptafluorobutyl methacrylate, 2,2,3,3,4,4-hexafluorobutyl acrylate, 2,2,3,4,4,4-hexafluorobutyl methacrylate, 1,1,1,3,3,3-hexafluoroisopropyl acrylate, 1,1,1,3,3,3-hexafluoroisopropyl methacrylate, 2,2,3,3,4,4,5,5-octafluoropentyl acrylate, 2,2,3,3,4,4,5,5-octafluoropentyl methacrylate, 2,2,3,3,3-pentafluoropropyl acrylate, 2,2,3,3,3-pentafluoropropyl methacrylate, 1H,1H,2H,2H-perfluorodecyl acrylate, 2,2,3,3-tetrafluoropropyl methacrylate, 3,3,4,4,5,5,6,6,7,7,8,8,8-tridecafluorooctyl acrylate, 3,3,4,4,5,5,6,6,7,7,8,8,8-tridecafluorooctyl methacrylate, 2,2,2-trifluoroethyl methacrylate, and 2-[(1',1',1'-trifluoro-2'-(trifluoromethyl)-2'-hydroxy)propyl]-3-norbornyl methacrylate.

The base resin components comprising one or more organic resins or organic elements embodied herein are not intended to exclude further embodiments of base resin components comprising inorganic or metal elements. Rather, in some embodiments, the organic base resin components described herein include carbon elements as well as other non-carbon elements (e.g., hydrogen, sulfur, oxygen, nitrogen, etc.). In some embodiments, the organic base resin includes one or more derivatives from bisfluorene, dithiolane, thianthrene, biphenol, o-phenylphenol, phenoxy benzyl, bisphenol A, bisphenol F, benzyl, phenol, and the like.

Additionally, in some embodiments, the base resin component comprises silicone-based base resin components that include an inorganic silicon-oxygen backbone chain. For example, in some embodiments, the base resin component further comprises one or more siloxane derivative compounds. In some embodiments, the base resin component further comprises one or more surfactants. In some implementations, a base resin component includes a surfactant that comprises a main chain of a siloxane skeleton comprising an inorganic silicon-oxygen backbone chain (e.g., X-12-2430C fluorine contained type), a high number of functional groups and at least one fluorine. In some such embodiments, the surfactant provides increased benefits to the base resin component, including but not limited to increased durability against heat and light, high hardness, anti-stain properties, and/or water and oil repellency. In some embodiments, the weight percentage (wt. %) of the surfactant to the base resin component is between 0.1% and 5%. In some embodiments, the one or more surfactants are selected from a fluorinated surfactant, a crosslinkable surfactant, and a non-crosslinkable surfactant. In some embodiments, the base resin does not include silicone-based base resin components that include an inorganic silicon-oxygen backbone chain.

In some embodiments, the one or more surfactants is a crosslinkable, fluorinated acrylic (e.g., 2,2,3,3,4,4,5,5,6,6,7,7-Dodecafluoroheptyl acrylate; 3,3,4,4,5,5,6,6,7,7,8,8,9,9,10,10,11,11,12,12,12-Heneicosafluorododecyl acrylate; 3,3,4,4,5,5,6,6,7,7,8,8,9,9,10,10,10-Heptadecafluorodecyl methacrylate containing MEHQ as inhibitor; 2,2,3,3,4,4,4-Heptafluorobutyl acrylate; 2,2,3,3,4,4,4-Heptafluorobutyl methacrylate; 2,2,3,4,4,4-Hexafluorobutyl acrylate; 2,2,3,4,4,4-Hexafluorobutyl methacrylate; 1,1,1,3,3,3-Hexafluoroisopropyl acrylate; 1,1,1,3,3,3-Hexafluoroisopropyl methacrylate; 2,2,3,3,4,4,5,5-Octafluoropentyl acrylate containing 100 ppm monomethyl ether hydroquinone as inhibitor; 2,2,3,3,4,4,5,5-Octafluoropentyl methacrylate containing 100 ppm MEHQ as inhibitor; 2,2,3,3,3-Pentafluoropropyl acrylate containing 100 ppm 4-tert-butylcatechol as inhibitor; 2,2,3,3,3-Pentafluoropropyl methacrylate containing 100 ppm 4-tert-butylcatechol as inhibitor; 1H,1H,2H,2H-Perfluorodecyl acrylate containing 100 ppm tert-butylcatechol as inhibitor; 2,2,3,3-Tetrafluoropropyl methacrylate; 3,3,4,4,5,5,6,6,7,7,8,8-Tridecafluorooctyl acrylate containing inhibitor; 3,3,4,4,5,5,6,6,7,7,8,8-Tridecafluorooctyl methacrylate containing 100 ppm 4-tert-butylcatechol as inhibitor; 2,2,2-Trifluoroethyl methacrylate containing 50-200 ppm MEHQ as inhibitor; and/or 2-[(1',1',1'-Trifluoro-2'-(trifluoromethyl)-2'-hydroxy)propyl]-3-norbornyl methacrylate).

In some embodiments, a silicone-based resin has a refractive index that is lower than the refractive index of an organic-based resin. In some embodiments, a silicone-based resin has a refractive index of 1.55 or lower. In some such embodiments, the refractive index of the silicone-based resin is measured at 589 nm. In some embodiments, the base resin component does not include silicon. In some embodiments, the base resin component does not include silicon.

In some embodiments, the one or more resins in the base resin component are provided as commercially available compounds. In some embodiments, the one or more resins in the base resin component are synthesized by various methods. Specifically, in some embodiments, the one or more resins in the base resin component are synthesized such that the resulting resins comprise the desired parameters disclosed herein (e.g., refractive index, viscosity, functional groups, etc.). Non-limiting embodiments of base resin components are provided below in the Examples in Table 1.

Other Components of NIL Soft Mold Precursor Material.

In some embodiments, the one or more additives comprises fluoro-hydrocarbon, fluoro-siloxane, polydimethylsiloxane, or a mixture thereof. In some embodiments, the one or more additives is an acrylate oligomer. In some embodiments, the one or more additives is a fluorinated acrylate oligomer. In some embodiments, the weight percent of the one or more additives in the in the NIL soft mold precursor material ranges from 0.1% to 20%, from 1% to 15%, or from 2% to 8%. In some embodiments, the weight percent of the one or more additives in the in the NIL soft mold precursor material is between 1% and 2%, between 2% and 3%, between 3% and 4%, between 4% and 5%, between 5% and 6%, between 6% and 7%, between 7% and 8%, between 8% and 9%, or between 9% and 10%.

In some embodiments, the one or more crosslinkers comprise a plurality of acrylate or epoxy groups. In some embodiments, the one or more crosslinkers is acrylate or trimethylolpropane triacrylate. In some embodiments, the weight percent of the one or more crosslinkers in the in the NIL soft mold precursor material ranges from 1% to 25%, from 5% to 20%, or from 8% to 15%. In some embodiments, the weight percent of the one or more crosslinkers in the in the NIL soft mold precursor material is between 1% and 5%, between 5% and 10%, between 10% and 15%, between 15% and 20%, between 20% and 25%, or between 25% and 30%.

In some embodiments, the NIL soft mold precursor material further comprises one or more of a photo radical generator, a photo acid generator, or both. In some embodiments, depending on the crosslinking functional group or groups that the base resin component comprises, the base resin component is crosslinked or polymerized via radical photopolymerization (e.g., free radical photopolymerization or controlled radical photopolymerization), acid photopolymerization, ionic photopolymerization (e.g., cationic photopolymerization or anionic photopolymerization), and/or a mixture of such. For example, a base resin component comprising an ethylenically unsaturated group can be crosslinked or polymerized via radical photopolymerization (e.g., free radical photopolymerization). To facilitate the polymerization of a base resin component containing the ethylenically unsaturated group, the NIL precursor material further includes one or more photo radical generators (PRGs). Under UV radiation, the PRGs generate radicals that initiate the polymerization or crosslinking process of the ethylenically unsaturated group of the base resin component molecules. In another example, a base resin component comprising an oxirane ring can be crosslinked or polymerized via ionic photopolymerization (e.g., cationic photopolymerization). To facilitate the polymerization of the base resin component comprising the oxirane ring, the NIL precursor material further includes one or more photo acid generators (PAGs). Under UV radiation, the PAGs generate cations or acid that initiate the polymerization or crosslinking process of the oxirane ring of the base resin component molecules.

In some embodiments, the one or more photo radical generators or photo acid generators is diphenyl(2,4,6-trimethylbenzoyl)phosphine oxide/2-hydroxy-2-methylpropiophenone. In some embodiments, the weight percent of the one or more photo radical generators or photo acid generators in the NIL soft mold precursor material ranges from 0.1% to 20%, from 1% to 15% or from 2% to 8%. In some embodiments, the weight percent of the one or more photo radical generators or photo acid generators is between 1% and 2%, between 2% and 3%, between 3% and 4%, between 4% and 5%, between 5% and 6%, between 6% and 7%, between 7% and 8%, between 8% and 9%, or between 9% and 10%.

In some embodiments, the NIL soft mold precursor material further comprises one or more inhibitors. In some embodiments, the one or more inhibitors are selected from monomethyl ether hydroquinone and 4-tert-butylcatechol. The one or more inhibitors refers to one or more compositions, compounds, molecules, etc., that are capable of inhibiting or substantially inhibiting the crosslinking or polymerization of the crosslinkable or polymerizable component when the photoinitiating light source is on or off. In some embodiments, the one or more inhibitors stabilize the NIL soft mold precursor material and/or the base resin component of the NIL soft mold precursor material to prevent crosslinking or polymerization prior to curing.

In some embodiments, the NIL soft mold precursor material further comprises one or more solvents. In some embodiments, the one or more solvents are selected from 2-(1-methoxy)propyl acetate, propylene glycol monomethyl ether acetate, propylene glycol methyl ether, ethyl acetate, xylene, and toluene.

For example, in some embodiments, the base resin component is mixed with one or more solvents prior to the application of the NIL soft mold precursor material to a substrate (e.g., a spin-coating step), where the addition of solvent decreases the viscosity of the NIL soft mold precursor material to allow an even application onto the substrate (e.g., a film). In some embodiments, the one or more solvents are removed from the NIL soft mold precursor material after the spin-coating step. In some embodiments, the percentage of solvent remaining in the base resin component after the spin-coating step and removal of the solvent is less than 5%.

In some embodiments, the properties (e.g., refractive index, viscosity, etc.) of the NIL soft mold precursor material are measured prior to application onto a substrate (e.g., spin-coating), and the properties of the film are measured after application onto a substrate, and the measurements are compared. In some such embodiments, the measurements are performed in the absence of solvent. For example, in some such implementations, the viscosity of the NIL soft mold precursor material is measured in the absence of solvent.

In some embodiments, the viscosity of the precursor material ranges from 1 cps to 3500 cps, from 50 cps to 3000 cps, or from 200 cps to 2800 cps. In some embodiments, the viscosity is lower than 1 cps. In some alternative embodiments, the viscosity is greater than 3500 cps.

In some embodiments, the viscosity of the precursor material is between 200 cps and 300 cps, between 300 cps and 400 cps, between 400 cps and 500 cps, between 500 cps and 600 cps, between 600 cps and 700 cps, between 700 cps and 800 cps, between 800 cps and 900 cps, between 900 cps and 1000 cps, between 1000 cps and 1100 cps, between 1100 cps and 1200 cps, between 1200 cps and 1300 cps, between 1300 cps and 1400 cps, between 1400 cps and 1500 cps, between 1500 cps and 1600 cps, between 1600 cps and 1700 cps, between 1700 cps and 1800 cps, between 1800 cps and 1900 cps, between 1900 cps and 2000 cps, between 2000 cps and 2100 cps, between 2100 cps and 2200 cps, between 2200 cps and 2300 cps, between 2300 cps and 2400 cps, between 2400 cps and 2500 cps, between 2500 cps and 2600 cps, between 2600 cps and 2700 cps, or between 2700 cps and 2800 cps.

In some embodiments, the viscosity is measured at a temperature between 5 and 100° C., between 10 and 40° C., or between 15 and 25° C. In some embodiments, the viscosity is measured at room temperature.

As described above, in some embodiments, the viscosity indicates the elasticity or liquidity of the NIL soft mold precursor material at a respective temperature (e.g., the imprinting temperature). Specifically, in some embodiments, the viscosity of the NIL soft mold precursor material described herein is sufficiently low so as to allow for the various NIL precursor material to flow to conform to the shape of the hard master mold during the NIL mold-making process.

In some embodiments, the various components of the NIL soft mold precursor material described herein are generally flowable or in liquid form, such that the precursor material is molded or imprinted at an imprinting temperature close to room temperature, (e.g., from about 15° C. to about 50° C.). In some embodiments, the various components of the NIL soft mold precursor material described herein may generally allow the precursor material to be molded or imprinted (e.g., with a hard master mold) without applying heat to the precursor material or the substrate upon which the precursor material is applied, although thermal processing may be involved in other operations (e.g., polymerization) of the NIL mold-making process. In some embodiments, thermal treatment may nonetheless be implemented during molding so as to further reduce the viscosity of the NIL soft mold precursor material to facilitate the flow of the precursor material inside the master mold.

In some embodiments, the NIL soft mold precursor material is a liquid at room temperature (e.g., between 15 and 25° C.). In some embodiments, the base resin component is a liquid at a temperature between 20 and 25° C. In some such embodiments, the viscosity is measured at room temperature. In some embodiments, as described above, the curing is performed at a temperature that is higher than room temperature, and the precursor material is solid at room temperature but liquid at a temperature that is at least higher than room temperature. In some such embodiments, the viscosity is measured at a temperature that is at least higher than room temperature at which the precursor material is a liquid. In some such embodiments, the viscosity is measured at the curing temperature.

In some embodiments, as described above, the imprinting is performed at a temperature that is higher than room temperature to facilitate the flow of the NIL soft mold precursor material inside the master mold, and precursor material is solid at room temperature but liquid the imprinting temperature. In some such embodiments, the viscosity is measured at the imprinting temperature.

In some embodiments, the viscosity is measured at a temperature that is below the curing temperature and/or the imprinting temperature. In some embodiments, the viscosity is measured at a temperature that is between 25 and 40° C., between 40 and 80° C., between 80 and 120° C., between 120 and 200° C., or higher than 200° C. In some embodiments, the viscosity is measured at temperature that is between 100° C. and 150° C., between 100° C. and 140° C., or between 110° C. and 140° C. In some embodiments, the NIL soft mold precursor material is a solid at room temperature, and the viscosity is measured at a temperature that is at least as high as the lowest temperature at which the base resin component is a liquid.

In some embodiments, the refractive index of the NIL soft mold precursor material ranges from 1.1 to 1.8, from 1.15 to 1.6, and/or from 1.3 to 1.5. In some embodiments, the refractive index ranges from 1.1 to 1.73, from 1.12 to 1.7, from 1.14 to 1.65, from 1.2 to 1.6, from 1.23 to 1.55, from 1.26 to 1.5, from 1.29 to 1.47, from 1.31 to 1.45, from 1.33 to 1.43, and/or from 1.35 to 1.4. In some embodiments, the refractive index is selected from about 1.30, about 1.31, about 1.32, about 1.33, about 1.34, about 1.35, about 1.36, about 1.37, about 1.38, about 1.39, about 1.40, about 1.41, about 1.42, about 1.43, about 1.44, about 1.45, about 1.46, about 1.47, about 1.48, about 1.49, about 1.50, about 1.51, about 1.52, about 1.53, about 1.54, about 1.55, about 1.56, and about 1.57.

In some embodiments, the refractive index is further affected by the functional groups of the base resin component. For example, in some embodiments, different base resin materials comprising a common backbone but different functional groups can have different refractive indices. In some embodiments, a base resin component comprises one or more functional groups, including but not limited to crosslinking or polymerizing functional groups, such as those described in detail above.

In some embodiments, the refractive index is measured at 589 nm. In some embodiments, the refractive index is measured at a wavelength in the visible light spectrum (e.g., between about 380 nm to 750 nm). In some embodiments, the refractive index is measured at about 380 nm, about 390 nm, about 400 nm, about 410 nm, about 420 nm, about 430 nm, about 440 nm, about 450 nm, about 460 nm, about 470 nm, about 480 nm, about 490 nm, about 500 nm, about 510 nm, about 520 nm, about 530 nm, about 540 nm, about 550 nm, about 560 nm, about 570 nm, about 580 nm, about 590 nm, about 600 nm, about 610 nm, about 620 nm, about 630 nm, about 640 nm, about 650 nm, about 660 nm, about 670 nm, about 680 nm, about 690 nm, about 700 nm, about 710 nm, about 720 nm, about 730 nm, about 740 nm, or about 750 nm. In some embodiments, the refractive index is measured at a wavelength in the infrared (IR) band (e.g., about 750 nm to 1 mm), in the ultraviolet (UV) band (e.g., about 10 nm to about 380 nm), in another portion of the electromagnetic spectrum, and/or in any combination of portions of the electromagnetic spectrum.

In some embodiments, the refractive index of the NIL soft mold precursor material is determined at least partly based on the refractive index of the base resin component. In some embodiments, the refractive index of the NIL soft mold precursor material is determined at least partly based on a parameter of the base resin component other than the refractive index of the base resin component, such as the viscosity of the base resin component.

Non-limiting embodiments of the various components of NIL soft mold precursor materials are provided below in the Examples in Table 1.

Obtaining a Cured Polymeric Material.

The present disclosure further provides a polymeric material comprising a partially or totally polymerized or crosslinked precursor material, where the precursor material includes any of the embodiments disclosed herein.

In some embodiments, the NIL soft mold precursor material undergoes a process upon exposure to one or more wavelengths of light that changes one or more properties of the precursor material. In some such embodiments, the light-sensitive NIL soft mold precursor material undergoes a crosslinking and/or polymerizing process that hardens the precursor material (e.g., curing). For example, referring to FIG. 8B, in some embodiments, curing is used to set a soft material into a rigid material, such as in a desired shape (e.g., in the shape of a mold). In some embodiments, the photoinitiating light source is a wavelength of light that is in the visible light spectrum. In some embodiments, the photoinitiating light source is a wavelength of light that is ultraviolet light (UV). In some embodiments, the NIL soft mold precursor material is chemically curable, heat curable, electron beam curable, and/or light curable. In some embodiments, the NIL soft mold precursor material is UV curable.

In some embodiments, the NIL soft mold precursor material is cured for a duration between 1 second and 10 seconds, between 10 seconds and 30 seconds, between 30 seconds and 1 minute, between 1 minute and 2 minutes, between 2 minutes and 5 minutes, between 5 minutes and 10 minutes, between 10 minutes and 30 minutes, between 30 minutes and 1 hour, or more than 1 hour. In some embodiments, the NIL soft mold precursor material is cured for about 10 seconds, about 20 seconds, about 30 seconds, about 40 seconds, about 50 seconds, or about 1 minute.

In some embodiments, the curing is performed at room temperature (e.g., between 15 and 25° C.). For example, in some embodiments, the precursor material is flowable or in liquid form (e.g., a liquid) at room temperature, thus allowing the precursor material to be molded or imprinted at an imprinting temperature close to room temperature. In other words, in some such embodiments, the precursor material can be molded or imprinted without heat treatment to the precursor material and/or to the substrate upon which the precursor material is applied. In some alternative embodiments, heat is applied to the precursor material and/or to the substrate during other aspects of the molding process, including the curing (e.g., crosslinking or polymerization) of the precursor material. In some embodiments, the curing comprises a temperature between 25 and 40° C., between 40 and 80° C., between 80 and 120° C., between 120 and 200° C., or higher than 200° C. In some embodiments, the curing comprises a temperature between 100° C. and 150° C., between 100° C. and 140° C., or between 110° C. and 140° C. Additionally, in some embodiments, thermal treatment is implemented during the imprinting of the NIL precursor material so as to further reduce the viscosity of the NIL soft mold precursor material to facilitate the flow of the NIL soft mold precursor material inside the mold.

In some embodiments, the curing is performed under nitrogen.

In some embodiments, the polymerized or crosslinked (e.g., cured) precursor material has a modulus ranging from 50 MPa to 2.5 GPa, from 80 MPa to 2 GPa, or from 100 MPa to 1.5 GPa. In some embodiments, the polymerized or crosslinked (e.g., cured) precursor material has a modulus that is between 100 and 200 MPa, between 200 and 300 MPa, between 300 and 400 MPa, between 400 and 500 MPa, between 500 and 600 MPa, between 600 and 700 MPa, between 700 and 800 MPa, between 800 and 900 MPa, between 900 MPa and 1 GPa, between 1 and 1.1 GPa, between 1.1 and 1.2 GPa, between 1.2 and 1.3 GPa, between 1.3 and 1.4 GPa, or between 1.4 and 1.5 GPa.

In some embodiments, the polymerized or crosslinked (e.g., cured) precursor material has a water contact angle ranging from 90° to 115°, from 92° to 113°, or from 93° to 110°. In some embodiments, the polymerized or crosslinked (e.g., cured) precursor material has a water contact angle lower than 90°. In some embodiments, the polymerized or crosslinked (e.g., cured) precursor material has a water contact angle that is 90°, 91°, 92°, 93°, 94°, 95°, 96°, 97°, 98°, 99°, 100°, 101°, 102°, 103°, 104°, 105°, 106°, 107°, 108°, 109°, 110°, 111°, 112°, 113°, 114°, or 115°. In some embodiments, the polymerized or crosslinked (e.g., cured) precursor material has a water contact angle that is 65°, 66°, 67°, 68°, 69°, 70°, 71°, 72°, 73°, 74°, 75°, 76°, 77° 78°, 79° 80°, 81°, 82°, 83°, 84°, 85°, 86°, 87°, 88°, or 89°.

In some embodiments, the refractive index of the cured polymeric material ranges from 1.1 to 1.8, from 1.15 to 1.6, and/or from 1.3 to 1.5. In some embodiments, the refractive index ranges from 1.1 to 1.73, from 1.12 to 1.7, from 1.14 to 1.65, from 1.2 to 1.6, from 1.23 to 1.55, from 1.26 to 1.5, from 1.29 to 1.47, from 1.31 to 1.45, from 1.33 to 1.43, and/or from 1.35 to 1.4. In some embodiments, the refractive index is selected from about 1.30, about 1.31, about 1.32, about 1.33, about 1.34, about 1.35, about 1.36, about 1.37, about 1.38, about 1.39, about 1.40, about 1.41, about 1.42, about 1.43, about 1.44, about 1.45, about 1.46, about 1.47, about 1.48, about 1.49, about 1.50, about 1.51, about 1.52, about 1.53, about 1.54, about 1.55, about 1.56, and about 1.57.

In some embodiments, the refractive index is further affected by the functional groups of the base resin component. For example, in some embodiments, different base resin materials comprising a common backbone but different functional groups can have different refractive indices. In some embodiments, a base resin component comprises one or more functional groups, including but not limited to crosslinking or polymerizing functional groups, such as those described in detail above.

In some embodiments, the refractive index is measured at 589 nm. In some embodiments, the refractive index is measured at a wavelength in the visible light spectrum (e.g., between about 380 nm to 750 nm). In some embodiments, the refractive index is measured at about 380 nm, about 390 nm, about 400 nm, about 410 nm, about 420 nm, about 430 nm, about 440 nm, about 450 nm, about 460 nm, about 470 nm, about 480 nm, about 490 nm, about 500 nm, about 510 nm, about 520 nm, about 530 nm, about 540 nm, about 550 nm, about 560 nm, about 570 nm, about 580 nm, about 590 nm, about 600 nm, about 610 nm, about 620 nm, about 630 nm, about 640 nm, about 650 nm, about 660 nm, about 670 nm, about 680 nm, about 690 nm, about 700 nm, about 710 nm, about 720 nm, about 730 nm, about 740 nm, or about 750 nm. In some embodiments, the refractive index is measured at a wavelength in the infrared (IR) band (e.g., about 750 nm to 1 mm), in the ultraviolet (UV) band (e.g., about 10 nm to about 380 nm), in another portion of the electromagnetic spectrum, and/or in any combination of portions of the electromagnetic spectrum.

In some embodiments, the refractive index of the cured polymeric material is different from the refractive index of the uncured NIL soft mold precursor material. In some alternative embodiments, the refractive index of the cured polymeric material is the same as the refractive index of the uncured NIL soft mold precursor material.

Soft Molds for Nanoimprint Lithography.

The present disclosure further provides a NIL soft mold comprising the polymeric material including any of the embodiments disclosed herein.

In some embodiments, the mold further comprises a microstructure. In some embodiments, the microstructure is a non-slanted grating. In some alternative embodiments, the microstructure is a slanted grating.

Figure 11A:
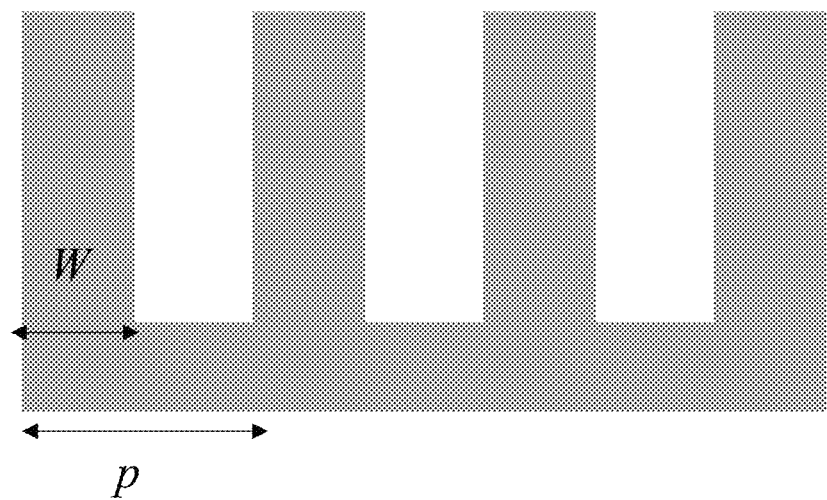
FIGS. 11A and 11B illustrate a non-slanted grating 11A and a slanted grating 11B in accordance with some embodiments.
Figure 11B:
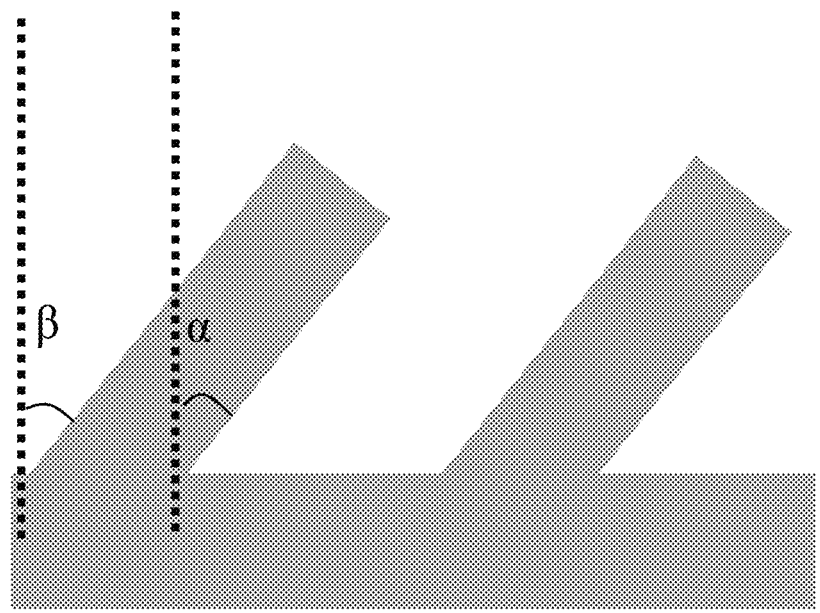

In some embodiments, the microstructure has a duty cycle ranging from 10% to 90%. For example, FIGS. 11A and 11B illustrate a slanted grating and a non-slanted grating, respectively. Furthermore, as illustrated in FIG. 5 and FIG. 11A, the duty cycle is a ratio between the width of a ridge (e.g., W) and the grating period (e.g., p). In some embodiments, the grating has a small or large duty cycle (e.g., below 30% or greater than 70%). In some embodiments, the grating has a duty cycle of less than 10%. In some embodiments, the grating has a duty cycle ranging from 30% to 90%, from 35% to 90%, from 20% to 70%, or from 25% to 55%. In some embodiments, the grating has a duty cycle of greater than 90%.

In some embodiments, the microstructure has a duty cycle ranging from about 0.10 to about 0.90, from about 0.20 to about 0.70, or from about 0.25 to about 0.55. For example, in some embodiments, the microstructure is a slanted grating, and the duty cycle of the slanted grating is 0.10, 0.15, 0.20, 0.25, 0.30, 0.35, 0.40, 0.45, 0.50, 0.55, 0.60, 0.65, 0.70, 0.75, 0.80, 0.85, or 0.90.

In some embodiments, the microstructure is a binary structure having a duty cycle ranging from about 0.10 to about 0.90, from about 0.20 to about 0.70, or from about 0.25 to about 0.55. In some such embodiments, the duty cycle of the binary structure is 0.10, 0.15, 0.20, 0.25, 0.30, 0.35, 0.40, 0.45, 0.50, 0.55, 0.60, 0.65, 0.70, 0.75, 0.80, 0.85, or 0.90.

In some embodiments, the grating period is between 100 nm and 1 μm. In some embodiments, the grating period ranges between 100 and 300 nm, 300 and 500 nm, 500 and 700 nm, or between 700 nm and 1 μm. In some embodiments, the grating period is less than 100 nm or greater than 1 μm.

In some embodiments, the microstructure (e.g., a slanted grating) comprises at least one slant angle ranging from more than 0° to 70°. As illustrated in FIG. 5 and FIG. 11B, the slant angle (e.g., "Slant") is determined using the angle for the leading edge α and the angle for the trailing edge β, using the formula Slant=arctan[(tan(α)+tan(β))*0.5]. In some embodiments, the microstructure (e.g., a slanted grating) has a slant angle that is greater than 10°, 20°, 30°, 40°, 50°, 60°, 70°, or higher. In some embodiments, a slant angle ranges from more than 0° to about 70°. In some embodiments, a slanted grating comprises at least one slant angle greater than 30°. In some embodiments, a slanted grating comprises at least one slant angle greater than 35°.

In some embodiments, the microstructure has a depth greater than 100 nm. In some embodiments, the grating has a depth ranging between 10 and 50 nm, between 50 and 100 nm, between 100 and 200 nm, between 200 and 500 nm, between 500 nm and 1 μm, or higher than 1 μm.

In some embodiments, the microstructure has a depth from 30 nm to 450 nm, from 50 nm to 350 nm, or from 75 nm to 250 nm. In some embodiments, the microstructure has a depth greater than 100 nm and lower than 500 nm.

In some embodiments, the microstructure has an aspect ratio from 0.5:1 to 6:1. In some embodiments, the microstructure has an aspect ratio from 1:1 to 5:1. In some embodiments, the microstructure has an aspect ratio greater than 3:1. In some embodiments, the microstructure has an aspect ratio greater than 3:1 and lower than 8:1. In some embodiments, the grating has an aspect ratio of about 1:1, about 4:3, about 3:2, about 16:9, about 2:1, about 21:9, about 3:1, about 4:1, about 5:1, about 6:1, about 7:1, about 8:1, about 9:1, or about 10:1.

In some embodiments, the refractive index of the NIL soft mold ranges from 1.1 to 1.8, from 1.15 to 1.6, and/or from 1.3 to 1.5. In some embodiments, the refractive index ranges from 1.1 to 1.73, from 1.12 to 1.7, from 1.14 to 1.65, from 1.2 to 1.6, from 1.23 to 1.55, from 1.26 to 1.5, from 1.29 to 1.47, from 1.31 to 1.45, from 1.33 to 1.43, and/or from 1.35 to 1.4. In some embodiments, the refractive index is selected from about 1.30, about 1.31, about 1.32, about 1.33, about 1.34, about 1.35, about 1.36, about 1.37, about 1.38, about 1.39, about 1.40, about 1.41, about 1.42, about 1.43, about 1.44, about 1.45, about 1.46, about 1.47, about 1.48, about 1.49, about 1.50, about 1.51, about 1.52, about 1.53, about 1.54, about 1.55, about 1.56, and about 1.57.

In some embodiments, the refractive index of the NIL soft mold is different from the refractive index of the cured polymeric material and/or the refractive index of the uncured NIL soft mold precursor material. In some alternative embodiments, the refractive index of the NIL soft mold is the same as the refractive index of the cured polymeric material and/or the refractive index of the uncured NIL soft mold precursor material.

Applications of NIL Soft Mold Precursor Formulations.

The present disclosure further provides a process for making the NIL soft mold of any of the embodiments disclosed herein, comprising obtaining a NIL soft mold precursor material, imprinting the NIL soft mold precursor material with a microstructure, and exposing the NIL soft mold precursor material to a curing process, thus obtaining a NIL soft mold.

In some embodiments, the imprinting the NIL soft mold precursor material with a microstructure comprises imprinting the soft mold precursor material with a master mold. In some embodiments, the curing process comprises subjecting the NIL soft mold precursor material to a light source.

For example, in some embodiments, the NIL soft mold precursor material is applied or deposited for NIL molding by, for example, spin-coating, lamination, and/or ink injection on a substrate or waveguide to form a NIL soft mold material layer (e.g., a film). In some embodiments, the NIL soft mold material layer undergoes heat treatment prior to curing (e.g., post-apply bake). In some embodiments, the NIL soft mold material layer is molded (e.g., imprinted, using any of the NIL processes described herein) with a hard master mold and/or cured (e.g., by light and/or UV) to form a NIL mold, such as a NIL mold with a slanted grating. In some embodiments, the cured NIL soft mold material undergoes heat treatment after curing (e.g., post-exposure bake).

The present disclosure further provides a method of using the NIL soft mold of any one of the embodiments disclosed herein, to form a NIL grating, comprising obtaining a NIL precursor material, imprinting the NIL precursor material with the NIL soft mold using a NIL process, and curing the NIL precursor material, thus forming a NIL grating.

In some embodiments, the NIL soft mold disclosed herein is used to fabricate other slanted or non-slanted structures. In some embodiments, the microstructure of the soft mold is assessed for imprintability and/or optical performance (e.g., haze, RI, absorption of resins, etc.) after spin-coating, curing, and/or delamination.

For example, in some embodiments, the NIL soft mold is used to fabricate other slanted or non-slanted structures (e.g., an NIL-molded grating) by applying or depositing a NIL precursor material for NIL molding by, for example, spin-coating, lamination, and/or ink injection on a substrate or waveguide to form a NIL material layer (e.g., a film). In some embodiments, the NIL material layer undergoes heat treatment prior to curing (e.g., post-apply bake). In some embodiments, the NIL material layer is molded (e.g., imprinted, using any of the NIL processes described herein) with the NIL soft mold, in accordance with any of the embodiments of the present disclosure, and cured (e.g., by light and/or UV) to form a surface-relief slanted grating. In some embodiments, the cured NIL surface-relief structure undergoes heat treatment after curing (e.g., post-exposure bake).

In some embodiments, the NIL-molded grating has a refractive index greater than 1.75, greater than 1.78, greater than 1.8, greater than 1.85, greater than 1.9, greater than 1.93, greater than 1.95, or greater than 2. In some such embodiments, the NIL precursor material used for the grating includes a base resin component having a refractive index greater than 1.55, greater than 1.58, or greater than 1.6 and a nanoparticle loading greater than about 45%. In some embodiments, the base resin component includes a refractive index ranging from 1.58 to 1.77, from 1.58 to 1.7, from 1.58 to 1.65, from 1.6 to 1.7, or from 1.6 to 1.65.

In some embodiments, the refractive index of the NIL-molded grating is between about 1.7 and about 3.4, between about 1.75 and about 3.2, or between about 1.75 and about 3.1, depending on the composition of the NIL soft mold precursor material. For example, in some embodiments, the refractive index is greater than or about 1.78, greater than or about 1.8, greater than or about 1.85, greater than or about 1.9, greater than or about 1.95, greater than or about 2, or greater.

In some embodiments, the refractive index ranges from 1.75 to 2.00. In some embodiments, the refractive index is selected from about 1.75, about 1.76, about 1.77, about 1.78, about 1.79, about 1.80, 1.81, about 1.82, about 1.83, about 1.84, about 1.85, about 1.86, about 1.87, about 1.88, about 1.89, about 1.90, about 1.91, about 1.92, about 1.93, about 1.94, about 1.95, about 1.96, about 1.97, about 1.98, about 1.99, and about 2.00.

In some embodiments, the NIL soft mold disclosed herein is used to fabricate surface-relief structures (e.g., slanted or non-slanted surface-relief gratings), where at least one component of the surface-relief structure such as the base resin component is removed by a process and substituted for another material. In some such embodiments, the substitution of the base resin component after the initial fabrication of the surface-relief grating allows for the modulation of the refractive index based on the refractive properties of the substituted material and provides greater flexibility in the method of forming the NIL grating.

EXAMPLES

Further described below is an example of a NIL soft mold precursor material, in accordance with some embodiments of the present disclosure. This example is described for illustration purposes only and is not intended to be limiting. A person skilled in the art would understand that the composition of the NIL soft mold precursor material and/or the microstructure of the NIL soft mold may be varied and/or modified while achieving desired properties of the NIL soft mold precursor materials, such as improved moldability or imprintability of the NIL material mixture and/or improved optical properties (e.g., for a NIL surface-relief grating fabricated using the NIL soft mold) based on the viscosity, modulus, water contact angle, duty cycle, slant angle, depth, etc. In some implementations, some components of the various NIL soft mold precursor material may be omitted or substituted, while additives or additional components may be included to modify the properties of the NIL soft mold precursor material and/or the cured NIL polymeric material.

Table 1 below lists the composition or formulation of a NIL soft mold precursor material, in accordance with some embodiments of the present disclosure. In particular, the NIL soft mold precursor material comprises a tetra-functional (quad-functional) perfluoropolyether acrylate (e.g., 5198X; Solvay) at a weight percent of 56.87%, a bi-functional (di-functional) perfluoropolyether acrylate (e.g., MD700; Solvay) at a weight percent of 22.71%, a crosslinker acrylate (e.g., trimethylolpropane triacrylate, TMP3A; Osaka Organic Chemical) at a weight percent of 10.69%, a fluorinated additive (e.g., fluorinated acrylate oligomer, CN4002; Sartomer) at a weight percent of 5.21%, and a photo radical generator (e.g., diphenyl(2,4,6-trimethylbenzoyl)phosphine oxide/2-hydroxy-2-methylpropiophenone; Sigma-Aldrich) at a weight percent of 4.53%. The NIL soft mold precursor formulation was prepared in 350 g and 2×200 g lots. The viscosity and refractive index of the NIL soft mold precursor formulation prior to curing was 1689 cps and 1.386 at 589 nm, respectively. After curing, the water contact angle of the cured formulation was 106°.

TABLE 1

Composition of NIL Soft Mold Precursor

| Material | Purpose | Supplier | Weight % |
| --- | --- | --- | --- |
| 5198X | Quad-functional PFPE Acrylate | Solvay | 56.87% |
| MD700 | Di-functional PFPE Acrylate | Solvay | 22.71% |
| TMP3A | Crosslinker Acrylate | Osaka Organic Chemical | 10.69% |
| CN4002 | Fluorinated Additive | Sartomer | 5.21% |
| Diphenyl(2,4,6-trimethylbenzoyl)phosphine oxide/2-hydroxy-2-methylpropiophenone | Photo radical generator | Sigma-Aldrich | 4.53% |

Other Embodiments

Embodiments of the invention may be used to implement components of an artificial reality system or may be implemented in conjunction with an artificial reality system. Artificial reality is a form of reality that has been adjusted in some manner before presentation to a user, which may include, for example, a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 10:
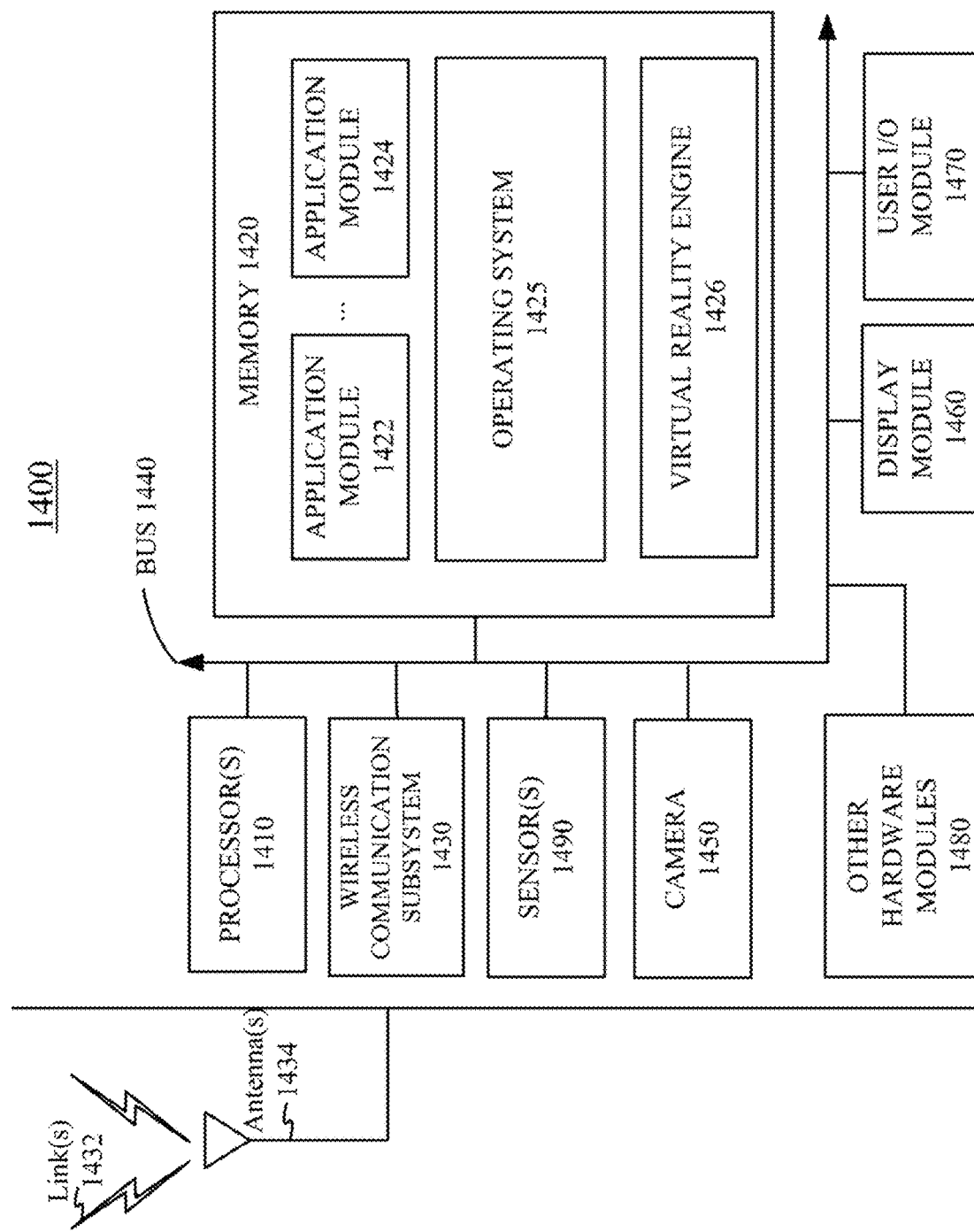
FIG. 10 is a simplified block diagram of an example electronic system of an example near-eye display according to certain embodiments.

FIG. 10 is a simplified block diagram of an example electronic system 1400 of an example near-eye display (e.g., HMD device) for implementing some of the examples disclosed herein. Electronic system 1400 may be used as the electronic system of an HMD device or other near-eye displays described above. In this example, electronic system 1400 may include one or more processor(s) 1410 and a memory 1420. Processor(s) 1410 may be configured to execute instructions for performing operations at a number of components, and can be, for example, a general-purpose processor or microprocessor suitable for implementation within a portable electronic device. Processor(s) 1410 may be communicatively coupled with a plurality of components within electronic system 1400. To realize this communicative coupling, processor(s) 1410 may communicate with the other illustrated components across a bus 1440. Bus 1440 may be any subsystem adapted to transfer data within electronic system 1400. Bus 1440 may include a plurality of computer buses and additional circuitry to transfer data.

Memory 1420 may be coupled to processor(s) 1410. In some embodiments, memory 1420 may offer both short-term and long-term storage and may be divided into several units. Memory 1420 may be volatile, such as static random access memory (SRAM) and/or dynamic random access memory (DRAM) and/or non-volatile, such as read-only memory (ROM), flash memory, and the like. Furthermore, memory 1420 may include removable storage devices, such as secure digital (SD) cards. Memory 1420 may provide storage of computer-readable instructions, data structures, program modules, and other data for electronic system 1400. In some embodiments, memory 1420 may be distributed into different hardware modules. A set of instructions and/or code might be stored on memory 1420. The instructions might take the form of executable code that may be executable by electronic system 1400, and/or might take the form of source and/or installable code, which, upon compilation and/or installation on electronic system 1400 (e.g., using any of a variety of generally available compilers, installation programs, compression/decompression utilities, etc.), may take the form of executable code.

In some embodiments, memory 1420 may store a plurality of application modules 1422 through 1424, which may include any number of applications. Examples of applications may include gaming applications, conferencing applications, video playback applications, or other suitable applications. The applications may include a depth sensing function or eye tracking function. Application modules 1422-1424 may include particular instructions to be executed by processor(s) 1410. In some embodiments, certain applications or parts of application modules 1422-1424 may be executable by other hardware modules 1480. In certain embodiments, memory 1420 may additionally include secure memory, which may include additional security controls to prevent copying or other unauthorized access to secure information.

In some embodiments, memory 1420 may include an operating system 1425 loaded therein. Operating system 1425 may be operable to initiate the execution of the instructions provided by application modules 1422-1424 and/or manage other hardware modules 1480 as well as interfaces with a wireless communication subsystem 1430 which may include one or more wireless transceivers. Operating system 1425 may be adapted to perform other operations across the components of electronic system 1400 including threading, resource management, data storage control and other similar functionality.

Wireless communication subsystem 1430 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1400 may include one or more antennas 1434 for wireless communication as part of wireless communication subsystem 1430 or as a separate component coupled to any portion of the system. Depending on desired functionality, wireless communication subsystem 1430 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 1430 may permit data to be exchanged with a network, other computer systems, and/or any other devices described herein. Wireless communication subsystem 1430 may include a means for transmitting or receiving data, such as identifiers of HMD devices, position data, a geographic map, a heat map, photos, or videos, using antenna(s) 1434 and wireless link(s) 1432. Wireless communication subsystem 1430, processor(s) 1410, and memory 1420 may together comprise at least a part of one or more of a means for performing some functions disclosed herein.

Embodiments of electronic system 1400 may also include one or more sensors 1490. Sensor(s) 1490 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1490 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or some combination thereof. The position sensors may be located external to the IMU, internal to the IMU, or some combination thereof. At least some sensors may use a structured light pattern for sensing.

Electronic system 1400 may include a display module 1460. Display module 1460 may be a near-eye display, and may graphically present information, such as images, videos, and various instructions, from electronic system 1400 to a user. Such information may be derived from one or more application modules 1422-1424, virtual reality engine 1426, one or more other hardware modules 1480, a combination thereof, or any other suitable means for resolving graphical content for the user (e.g., by operating system 1425). Display module 1460 may use liquid crystal display (LCD) technology, light-emitting diode (LED) technology (including, for example, OLED, ILED, mLED, AMOLED, TOLED, etc.), light emitting polymer display (LPD) technology, or some other display technology.

Electronic system 1400 may include a user input/output module 1470. User input/output module 1470 may allow a user to send action requests to electronic system 1400. An action request may be a request to perform a particular action. For example, an action request may be to start or end an application or to perform a particular action within the application. User input/output module 1470 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1400. In some embodiments, user input/output module 1470 may provide haptic feedback to the user in accordance with instructions received from electronic system 1400. For example, the haptic feedback may be provided when an action request is received or has been performed.

Electronic system 1400 may include a camera 1450 that may be used to take photos or videos of a user, for example, for tracking the user's eye position. Camera 1450 may also be used to take photos or videos of the environment, for example, for VR, AR, or MR applications. Camera 1450 may include, for example, a complementary metal-oxide-semiconductor (CMOS) image sensor with a few millions or tens of millions of pixels. In some implementations, camera 1450 may include two or more cameras that may be used to capture 3-D images.

In some embodiments, electronic system 1400 may include a plurality of other hardware modules 1480. Each of other hardware modules 1480 may be a physical module within electronic system 1400. While each of other hardware modules 1480 may be permanently configured as a structure, some of other hardware modules 1480 may be temporarily configured to perform specific functions or temporarily activated. Examples of other hardware modules 1480 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1480 may be implemented in software.

In some embodiments, memory 1420 of electronic system 1400 may also store a virtual reality engine 1426. Virtual reality engine 1426 may execute applications within electronic system 1400 and receive position information, acceleration information, velocity information, predicted future positions, or some combination thereof of the HMD device from the various sensors. In some embodiments, the information received by virtual reality engine 1426 may be used for producing a signal (e.g., display instructions) to display module 1460. For example, if the received information indicates that the user has looked to the left, virtual reality engine 1426 may generate content for the HMD device that mirrors the user's movement in a virtual environment. Additionally, virtual reality engine 1426 may perform an action within an application in response to an action request received from user input/output module 1470 and provide feedback to the user. The provided feedback may be visual, audible, or haptic feedback. In some implementations, processor(s) 1410 may include one or more GPUs that may execute virtual reality engine 1426.

In various implementations, the above-described hardware and modules may be implemented on a single device or on multiple devices that can communicate with one another using wired or wireless connections. For example, in some implementations, some components or modules, such as GPUs, virtual reality engine 1426, and applications (e.g., tracking application), may be implemented on a console separate from the head-mounted display device. In some implementations, one console may be connected to or support more than one HMD.

In alternative configurations, different and/or additional components may be included in electronic system 1400. Similarly, functionality of one or more of the components can be distributed among the components in a manner different from the manner described above. For example, in some embodiments, electronic system 1400 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

The following clauses describe certain embodiments.

Clause 1: a nanoimprint lithography (NIL) soft mold precursor material, comprising: a curable fluorinated base resin component; one or more additives; one or more crosslinkers; and one or more of a photo radical generator, a photo acid generator, or both.

Clause 2a: the precursor material of clause 1, wherein the base resin component is UV curable. Clause 2b: the precursor material of clause 1, wherein the base resin component is thermally curable.

Clause 3a: the precursor material of any one of clause 1, clause 2a, or clause 2b, wherein the base resin component comprises one or more UV curable groups. Clause 3b: the precursor material of any one of clause 1, clause 2a, or clause 2b, wherein the base resin component comprises one or more thermally curable groups.

Clause 4a: the precursor material of clause 3a or clause 3b, wherein each molecule of the base resin component comprises one or more UV curable groups. Clause 4b: the precursor material of clause 3a or clause 3b, wherein each molecule of the base resin component comprises one or more thermally curable groups.

Clause 5a: the precursor material of any one of clause 3a, clause 3b, clause 4a, or clause 4b, wherein the one or more UV curable groups is acrylate, epoxy, thiol, vinyl or a mixture thereof. Clause 5b: the precursor material of any one of clause 3a, clause 3b, clause 4a, or clause 4b, wherein the one or more thermally curable groups is acrylate, epoxy, thiol, vinyl or a mixture thereof.

Clause 6: the precursor material of any one of clauses 1 to 5, wherein the base resin component comprises backbones of perfluoropolyether, fluorinated siloxane, or any derivatives thereof.

Clause 7: the precursor material of any one of clauses 1 to 6, wherein the base resin component comprises a tetra-functional perfluoropolyether acrylate.

Clause 8: the precursor material of clause 7, wherein the weight percent of the tetra-functional perfluoropolyether acrylate in the precursor material ranges from 40% to 80%.

Clause 9: the precursor material of clause 7, wherein the weight percent of the tetra-functional perfluoropolyether acrylate in the precursor material ranges from 45% to 70%.

Clause 10: the precursor material of clause 7, wherein the weight percent of the tetra-functional perfluoropolyether acrylate in the precursor material ranges from 53% to 60%.

Clause 11a: the precursor material of any one of clauses 1 to 10, wherein the base resin component comprises a bi-functional perfluoropolyether acrylate. Clause 11b: the precursor material of any one of clauses 1 to 10, wherein the base resin component comprises a tri-functional perfluoropolyether acrylate.

Clause 12a: the precursor material of clause 11, wherein the weight percent of the bi-functional perfluoropolyether acrylate in the precursor material ranges from 5% to 40%. Clause 12b: the precursor material of clause 11, wherein the weight percent of the tri-functional perfluoropolyether acrylate in the precursor material ranges from 5% to 40%.

Clause 13a: the precursor material of clause 11, wherein the weight percent of the bi-functional perfluoropolyether acrylate in the precursor material ranges from 15% to 30%. Clause 13b: the precursor material of clause 11, wherein the weight percent of the tri-functional perfluoropolyether acrylate in the precursor material ranges from 15% to 30%.

Clause 14a: the precursor material of clause 11, wherein the weight percent of the bi-functional perfluoropolyether acrylate in the precursor material ranges from 20% to 26%. Clause 14b: the precursor material of clause 11, wherein the weight percent of the tri-functional perfluoropolyether acrylate in the precursor material ranges from 20% to 26%.

Clause 15: the precursor material of any one of clauses 1 to 14, wherein the one or more additives comprises fluorohydrocarbon, fluoro-siloxane, polydimethylsiloxane, or a mixture thereof.

Clause 16: the precursor material of any one of clauses 1 to 15, wherein the one or more additives is a fluorinated acrylate oligomer.

Clause 17: the precursor material of any one of clauses 1 to 16, wherein the weight percent of the one or more additives in the precursor material ranges from 0.1% to 20%.

Clause 18: the precursor material of any one of clauses 1 to 16, wherein the weight percent of the one or more additives in the precursor material ranges from 1% to 15%.

Clause 19: the precursor material of any one of clauses 1 to 16, wherein the weight percent of the one or more additives in the precursor material ranges from 2% to 8%.

Clause 20: the precursor material of any one of clauses 1 to 19, wherein the one or more crosslinkers comprise a plurality of acrylate or epoxy groups.

Clause 21: the precursor material of any one of clauses 1 to 20, wherein the one or more crosslinkers is acrylate or trimethylolpropane triacrylate.

Clause 22: the precursor material of any one of clauses 1 to 21, wherein the weight percent of the one or more crosslinkers in the precursor material ranges from 1% to 25%.

Clause 23: the precursor material of any one of clauses 1 to 21, wherein the weight percent of the one or more crosslinkers in the precursor material ranges from 5% to 20%.

Clause 24: the precursor material of any one of clauses 1 to 21, wherein the weight percent of the one or more crosslinkers in the precursor material ranges from 8% to 15%.

Clause 25: the precursor material of any one of clauses 1 to 24, wherein the one or more photo radical generators or photo acid generators is diphenyl(2,4,6-trimethylbenzoyl) phosphine oxide/2-hydroxy-2-methylpropiophenone.

Clause 26: the precursor material of any one of clauses 1 to 25, wherein the weight percent of the one or more photo radical generators or photo acid generators ranges from 0.1% to 20%.

Clause 27: the precursor material of any one of clauses 1 to 16, wherein the weight percent of the one or more photo radical generators or photo acid generators in the precursor material ranges from 1% to 15%.

Clause 28: the precursor material of any one of clauses 1 to 16, wherein the weight percent of the one or more photo radical generators or photo acid generators in the precursor material ranges from 2% to 8%.

Clause 29: the precursor material of any one of clauses 1 to 28, wherein the base resin component is light-sensitive.

Clause 30: the precursor material of any one of clauses 1 to 29, wherein the base resin component comprises one or more crosslinkable monomers, one or more polymerizable monomers, or both.

Clause 31: the precursor material of clause 30, wherein the crosslinkable monomers or the polymerizable monomers comprise one or more crosslinkable or polymerizable moieties.

Clause 32a: the precursor material of clause 31, wherein the crosslinkable or polymerizable moieties are selected from vinyl, allyl, epoxide, acrylate, and methacrylate. Clause 32b: the precursor material of clause 31, wherein the crosslinkable or polymerizable moieties are selected from heterocyclic groups comprising one or more of sulfur, nitrogen, and oxygen.

Clause 33: the precursor material of clause 31, wherein the crosslinkable or polymerizable moieties are selected from optionally substituted alkenyl, optionally substituted cycloalkenyl, optionally substituted alkynyl, optionally substituted acrylate, optionally substituted methacrylate, optionally substituted styrene, optionally substituted epoxide, optionally substituted thiirane, optionally substituted lactone, and optionally substituted carbonate.

Clause 34: the precursor material of any one of clauses 1 to 33, wherein the base resin component comprises one or more of (2,7-bis[(2-acryloyloxyethl)-sulfanyl]thianthrene), benzyl methacrylate, 1,6-hexanediol diacrylate, 1,4-butanediol diacrylate, acryloxypropylsilsesquioxane, or methylsilsesquioxane.

Clause 35: the precursor material of any one of clauses 1 to 33, wherein the base resin component comprises one or more of trimethylolpropane (EO)n triacrylate, caprolactone acrylate, polypropylene glycol monomethacrylate, cyclic trimethylolpropane formal acrylate, phenoxy benzyl acrylate, 3,3,5-trimethyl cyclohexyl acrylate, isobornyl acrylate, o-phenylphenol EO acrylate, 4-tert-butylcyclohexyl acrylate, benzyl acrylate, benzyl methacrylate, biphenylmethyl acrylate, lauryl acrylate, lauryl methacrylate, tridecyl acrylate, lauryl tetradecyl methacrylate, isodecyl acrylate, isodecyl methacrylate, phenol (EO) acrylate, phenoxyethyl methacrylate, phenol (EO)2 acrylate, phenol (EO)4 acrylate, tetrahydrofurfuryl acrylate, tetrahydrofurfuryl methacrylate, nonyl phenol (PO)2 acrylate, nonyl phenol (EO)4 acrylate, nonyl phenol (EO)8 acrylate, ethoxy ethyl acrylate, stearyl acrylate, stearyl methacrylate, methoxy PEG600 methacrylate, 1,6-hexanediol diacrylate, 1,6-hexanediol dimethacrylate, 1,6-hexanediol (EO)n diacrylate, polypropylene glycol 400 diacrylate, 1,4-butanediol dimethacrylate, polypropylene glycol 700 (EO)6 dimethacrylate, 1,6-Hexanediol (EO)n diacrylate, hydroxy pivalic acid neopentyl glycol diacrylate, bisphenol A (EO)10 diacrylate, bisphenol A (EO)10 dimethacrylate, neopentyl glycol dimethacrylate, neopentyl glycol (PO)2 diacrylate, tripropylene glycol diacrylate, ethylene glycol dimethacrylate, dipropylene glycol diacrylate, bisphenol A (EO)30 diacrylate, bisphenol A (EO)30 dimethacrylate, diethylene glycol dimethacrylate, triethylene glycol diacrylate, triethylene glycol dimethacrylate, tetraethylene glycol dimethacrylate, bisphenol A (EO)4 diacrylate, bisphenol A (EO)4 dimethacrylate, bisphenol A (EO)3 diacrylate, bisphenol A (EO)3 dimethacrylate, 1,3-butylene glycol dimethacrylate, tricyclodecane dimethanol diacrylate, tetraethylene glycol diacrylate, polyethylene glycol 400 diacrylate, polyethylene glycol 400 dimethacrylate, polyethylene glycol 200 diacrylate, polyethylene glycol 200 dimethacrylate, polyethylene glycol 300 diacrylate, polyethylene glycol 600 diacrylate, polyethylene glycol 600 dimethacrylate, bisphenol F (EO)4 diacrylate, trimethylolpropane triacrylate, trimethylolpropane trimethacrylate, trimethylolpropane (EO)3 triacrylate, trimethylolpropane (EO)15 triacrylate, trimethylolpropane (EO)6 triacrylate, trimethylolpropane (EO)9 triacrylate, glycerine (PO)3 triacrylate, pentaerythritol triacrylate, trimethylolpropane (PO)3 triacrylate, tris(2-hydroxyethyl)isocyanurate triacrylate, pentaerythritol (EO)n tetraacrylate, ditrimethylolpropane tetraacrylate, pentaerythritol tetraacrylate, dipentaerythritol pentaacrylate, and dipentaerythritol hexaacrylate.

Clause 36: the precursor material of any one of clauses 1 to 33, wherein the base resin component comprises one or more of a phosphate methacrylate, an amine acrylate, an acrylated amine synergist, a carboxylethyl acrylate, a modified epoxy acrylate, a bisfluorene diacrylate, a modified bisphenol fluorene diacrylate, a modified bisphenol fluorene type, a butadiene acrylate, an aromatic difunctional acrylate, an aliphatic multifunctional acrylate, a polyester acrylate, a trifunctional polyester acrylate, a tetrafunctional polyester acrylate, a phenyl epoxy acrylate, a bisphenol A epoxy acrylate, a water soluble acrylate, an aliphatic alkyl epoxy acrylate, a bisphenol A epoxy methacrylate, a soybean oil epoxy acrylate, a difunctional polyester acrylate, a trifunctional polyester acrylate, a tetrafunctional polyester acrylate, a chlorinated polyester acrylate, a hexafunctional polyester acrylate, an aliphatic difunctional acrylate, an aliphatic difunctional methacrylate, an aliphatic trifunctional acrylate, an aliphatic trifunctional methacrylate, an aromatic difunctional acrylate, an aromatic tetrafunctional acrylate, an aliphatic tetrafunctional acrylate, an aliphatic hexafunctional acrylate, an aromatic hexafunctional acrylate, an acrylic acrylate, a polyester acrylate, a sucrose benzoate, a caprolactone methacrylate, a caprolactone acrylate, a phosphate methacrylate, an aliphatic multifunctional acrylate, a phenol novolac epoxy acrylate, a cresol novolac epoxy acrylate, an alkali strippable polyester acrylate, a melamine acrylate, a silicone polyester acrylate, a silicone urethane acrylate, a dendritic acrylate, an aliphatic tetrafunctional methacrylate, a water dispersion urethane acrylate, a water soluble acrylate, an aminated polyester acrylate, a modified epoxy acrylate, or a trifunctional polyester acrylate.

Clause 37: the precursor material of any one of clauses 1 to 36, wherein the base resin component further comprises one or more fluorinated compounds.

Clause 38: the precursor material of clause 37, wherein the one or more fluorinated compounds are selected from: 2,2,3,3,4,4,5,5,6,6,7,7-dodecafluoroheptyl acrylate, 3,3,4,4,5,5,6,6,7,7,8,8,9,9,10,10,11,11,12,12,12-heneicosafluorododecyl acrylate, 3,3,4,4,5,5,6,6,7,7,8,8,9,9,10,10,10-heptadecafluorodecyl methacrylate, 2,2,3,3,4,4,4-heptafluorobutyl acrylate, 2,2,3,3,4,4,4-heptafluorobutyl methacrylate, 2,2,3,4,4,4-hexafluorobutyl acrylate, 2,2,3,4,4,4-hexafluorobutyl methacrylate, 1,1,1,3,3,3-hexafluoroisopropyl acrylate, 1,1,1,3,3,3-hexafluoroisopropyl methacrylate, 2,2,3,3,4,4,5,5-octafluoropentyl acrylate, 2,2,3,3,4,4,5,5-octafluoropentyl methacrylate, 2,2,3,3,3-pentafluoropropyl acrylate, 2,2,3,3,3-pentafluoropropyl methacrylate, 1H,1H,2H,2H-perfluorodecyl acrylate, 2,2,3,3-tetrafluoropropyl methacrylate, 3,3,4,4,5,5,6,6,7,7,8,8,8-tridecafluorooctyl acrylate, 3,3,4,4,5,5,6,6,7,7,8,8,8-tridecafluorooctyl methacrylate, 2,2,2-trifluoroethyl methacrylate, and 2-[(1',1',1'-trifluoro-2'-(trifluoromethyl)-2'-hydroxy)propyl]-3-norbornyl methacrylate.

Clause 39a: the precursor material of any one of clauses 1 to 38, wherein the viscosity of the precursor material ranges from 1 cps to 3500 cps. Clause 39b: the precursor material of any one of clauses 1 to 38, wherein the viscosity of the precursor material is measured at 25° C.

Clause 39c: the precursor material of any one of clauses 1 to 38, wherein the viscosity of an individual component formulated into the precursor material ranges from 1 cps to 10,000 cps, or more than 10,000 cps.

Clause 40: the precursor material of any one of clauses 1 to 38, wherein the viscosity of the precursor material ranges from 50 cps to 3000 cps.

Clause 41: the precursor material of any one of clauses 1 to 38, wherein the viscosity of the precursor material ranges from 200 cps to 2800 cps.

Clause 42: the precursor material of any one of clauses 1 to 38, wherein the viscosity of the precursor material is between 200 cps and 300 cps, between 300 cps and 400 cps, between 400 cps and 500 cps, between 500 cps and 600 cps, between 600 cps and 700 cps, between 700 cps and 800 cps, between 800 cps and 900 cps, between 900 cps and 1000 cps, between 1000 cps and 1100 cps, between 1100 cps and 1200 cps, between 1200 cps and 1300 cps, between 1300 cps and 1400 cps, between 1400 cps and 1500 cps, between 1500 cps and 1600 cps, between 1600 cps and 1700 cps, between 1700 cps and 1800 cps, between 1800 cps and 1900 cps, between 1900 cps and 2000 cps, between 2000 cps and 2100 cps, between 2100 cps and 2200 cps, between 2200 cps and 2300 cps, between 2300 cps and 2400 cps, between 2400 cps and 2500 cps, between 2500 cps and 2600 cps, between 2600 cps and 2700 cps, or between 2700 cps and 2800 cps.

Clause 43: a polymeric material comprising a partially or totally polymerized or crosslinked precursor material of any one of clauses 1 to 42.

Clause 44: the polymeric material of clause 43, wherein the polymerized or crosslinked precursor material has a modulus ranging from 50 MPa to 2.5 GPa.

Clause 45: the polymeric material of clause 43, wherein the polymerized or crosslinked precursor material has a modulus ranging from 80 MPa to 2 GPa.

Clause 46: the polymeric material of clause 43, wherein the polymerized or crosslinked precursor material has a modulus ranging from 100 MPa to 1.5 GPa.

Clause 47: the polymeric material of any one of clauses 43 to 46, wherein the polymerized or crosslinked precursor material has a water contact angle ranging from 90° to 115°.

Clause 48: the polymeric material of any one of clauses 43 to 46, wherein the polymerized or crosslinked precursor material has a water contact angle ranging from 92° to 113°.

Clause 49: the polymeric material of any one of clauses 43 to 46, wherein the polymerized or crosslinked precursor material has a water contact angle ranging from 93° to 110°.

Clause 50: a NIL soft mold comprising the polymeric material of any one of clauses 43 to 49.

Clause 51: the mold of clause 50, wherein the mold further comprises a microstructure.

Clause 52: the mold of clause 51, wherein the microstructure has a duty cycle ranging from 10% to 90%.

Clause 53: the mold of clause 51, wherein the microstructure has a duty cycle ranging from 20% to 70%.

Clause 54: the mold of clause 51, wherein the microstructure has a duty cycle ranging from 25% to 55%.

Clause 55: the mold of clause 51, wherein the microstructure has a duty cycle ranging from 0.10 to 0.90.

Clause 56: the mold of clause 51, wherein the microstructure has a duty cycle ranging from 0.20 to 0.70.

Clause 57: the mold of clause 51, wherein the microstructure has a duty cycle ranging from 0.25 to 0.55.

Clause 58: the mold of any one of clauses 51 to 57, wherein the microstructure is a binary structure.

Clause 59: the mold of any one of clauses 51 to 57, wherein the microstructure is a non-slanted grating.

Clause 60: the mold of any one of clauses 51 to 57, wherein the microstructure is a slanted grating.

Clause 61: the mold of clause 60, wherein a slant angle ranges from more than 0° to about 70°.

Clause 62: the mold of clause 60 or clause 61, wherein a slant angle is greater than 30°.

Clause 63: the mold of clause 60 or clause 61, wherein a slant angle is greater than 35°.

Clause 64: the mold of any one of clauses 51 to 63, wherein the microstructure has a depth from 30 nm to 450 nm.

Clause 65: the mold of any one of clauses 51 to 63, wherein the microstructure has a depth from 50 nm to 350 nm.

Clause 66: the mold of any one of clauses 51 to 63, wherein the microstructure has a depth from 75 nm to 250 nm.

Clause 67: the mold of any one of clauses 51 to 63, wherein the microstructure has a depth greater than 100 nm and lower than 500 nm.

Clause 68: the mold of any one of clauses 51 to 67, wherein the microstructure has an aspect ratio from 0.5:1 to 6:1.

Clause 69: the mold of any one of clauses 51 to 67, wherein the microstructure has an aspect ratio from 1:1 to 5:1.

Clause 70: the mold of any one of clauses 51 to 67, wherein the microstructure has an aspect ratio greater than 3:1 and lower than 8:1.

Clause 71: a process for making the NIL soft mold of any one of clauses 51 to 70, comprising: obtaining a NIL soft mold precursor material; imprinting the NIL soft mold precursor material with a microstructure; and exposing the NIL soft mold precursor material to a curing process, thereby obtaining a NIL soft mold.

Clause 72: the process of clause 71, wherein the imprinting the NIL soft mold precursor material with a microstructure comprises imprinting the soft mold precursor material with a master mold.

Clause 73: the process of clause 71 or clause 72, wherein the curing process comprises subjecting the NIL soft mold precursor material to a light source.

Clause 74: a method of using the NIL soft mold of any one of clauses 51 to 73 to form a NIL grating, comprising: obtaining a NIL precursor material; imprinting the NIL precursor material with the NIL soft mold using a NIL process; and curing the NIL precursor material, thereby forming a NIL grating.

What is claimed is:

1. A nanoimprint lithography (NIL) soft mold polymeric material comprising a partially or totally polymerized or crosslinked precursor material comprising:
   a curable fluorinated base resin component, comprising one or more UV curable groups;
   one or more additives;
   one or more nonfluorinated crosslinkers in a weight percent ranging from 1% to 25%; and
   one or more of a photo radical generator, a photo acid generator, or both;
   wherein the polymeric material has a Young's modulus ranging from 50 MPa to 2.5 GPa, and a water contact angle ranging from 90° to 115°.

2. The nanoimprint lithography (NIL) soft mold polymeric material of claim 1, wherein the one or more UV curable groups comprise one or more of acrylate, epoxy, or a mixture thereof.

3. The nanoimprint lithography (NIL) soft mold polymeric material of claim 1, wherein the base resin component comprises backbones of perfluoropolyether, fluorinated siloxane, or any derivatives thereof.

4. The nanoimprint lithography (NIL) soft mold polymeric material of claim 1, wherein the base resin component comprises a bi-functional perfluoropolyether acrylate, a tri-functional perfluoropolyether acrylate, a tetra-functional perfluoropolyether acrylate, or any combination thereof.

5. The nanoimprint lithography (NIL) soft mold polymeric material of claim 1, wherein the one or more additives comprise fluoro-hydrocarbon, fluoro-siloxane, poly dimethylsiloxane, or a mixture thereof.

6. The nanoimprint lithography (NIL) soft mold polymeric material of claim 1, wherein the one or more additives comprise a fluorinated acrylate oligomer.

7. The nanoimprint lithography (NIL) soft mold polymeric material of claim 1, wherein the weight percent of the one or more additives in the precursor material ranges from 0.1% to 20%.

8. The nanoimprint lithography (NIL) soft mold polymeric material of claim 1, wherein the one or more non-fluorinated crosslinkers comprise a plurality of acrylate or epoxy groups.

9. The nanoimprint lithography (NIL) soft mold polymeric material of claim 1, wherein the one or more non-fluorinated crosslinkers comprise acrylate or trimethylolpropane triacrylate.

10. The nanoimprint lithography (NIL) soft mold polymeric material of claim 1, wherein the one or more photo radical generators or photo acid generators comprise diphenyl(2,4,6-trimethylbenzoyl)phosphine oxide and 2-hydroxy-2-methylpropiophenone.

11. The nanoimprint lithography (NIL) soft mold polymeric material of claim 1, wherein the base resin component further comprises one or more crosslinkable monomers, one or more polymerizable monomers, or both, comprising one or more crosslinkable or polymerizable moieties selected from vinyl, allyl, epoxide, acrylate, and methacrylate.

12. The nanoimprint lithography (NIL) soft mold polymeric material of claim 1, wherein the base resin component further comprises one or more crosslinkable monomers, one or more polymerizable monomers, or both, comprising one or more crosslinkable or polymerizable moieties selected from optionally substituted alkenyl, optionally substituted cycloalkenyl, optionally substituted alkynyl, optionally substituted acrylate, optionally substituted methacrylate, optionally substituted styrene, optionally substituted epoxide, optionally substituted thiirane, optionally substituted lactone, and optionally substituted carbonate.

13. The nanoimprint lithography (NIL) soft mold polymeric material of claim 1, wherein the base resin component comprises one or more of (2,7-bis[(2-acryloyloxyethl)-sulfanyl]thianthrene), benzyl methacrylate, 1,6-hexanediol diacrylate, 1,4-butanediol diacrylate, acryloxypropylsilsesquioxane, or methylsilsesquioxane.

14. The nanoimprint lithography (NIL) soft mold polymeric material of claim 1, wherein the base resin component comprises one or more of trimethylolpropane (EO)n triacrylate, caprolactone acrylate, polypropylene glycol monomethacrylate, cyclic trimethylolpropane formal acrylate, phenoxy benzyl acrylate, 3,3,5-trimethyl cyclohexyl acrylate, isobornyl acrylate, o-phenylphenol EO acrylate, 4-tert-butylcyclohexyl acrylate, benzyl acrylate, benzyl methacrylate, biphenylmethyl acrylate, lauryl acrylate, lauryl methacrylate, tridecyl acrylate, lauryl tetradecyl methacrylate, isodecyl acrylate, isodecyl methacrylate, phenol (EO) acrylate, phenoxyethyl methacrylate, phenol (EO)2 acrylate, phenol (EO)4 acrylate, tetrahydrofurfuryl acrylate, tetrahydrofurfuryl methacrylate, nonyl phenol (PO)2 acrylate, nonyl phenol (EO)4 acrylate, nonyl phenol (EO)8 acrylate, ethoxy ethyl acrylate, stearyl acrylate, stearyl methacrylate, methoxy PEG600 methacrylate, 1,6-hexanediol diacrylate, 1,6-hexanediol dimethacrylate, 1,6-hexanediol (EO)n diacrylate, polypropylene glycol 400 diacrylate, 1,4-butanediol dimethacrylate, polypropylene glycol 700 (EO)6 dimethacrylate, 1,6-Hexanediol (EO)n diacrylate, hydroxy pivalic acid neopentyl glycol diacrylate, bisphenol A (EO)10 diacrylate, bisphenol A (EO)10 dimethacrylate, neopentyl glycol dimethacrylate, neopentyl glycol (PO)2 diacrylate, tripropylene glycol diacrylate, ethylene glycol dimethacrylate, dipropylene glycol diacrylate, bisphenol A (EO)30 diacrylate, bisphenol A (EO)30 dimethacrylate, diethylene glycol dimethacrylate, triethylene glycol diacrylate, triethylene glycol dimethacrylate, tetraethylene glycol dimethacrylate, bisphenol A (EO)4 diacrylate, bisphenol A (EO)4 dimethacrylate, bisphenol A (EO)3 diacrylate, bisphenol A (EO)3 dimethacrylate, 1,3-butylene glycol dimethacrylate, tricyclodecane dimethanol diacrylate, tetraethylene glycol diacrylate, polyethylene glycol 400 diacrylate, polyethylene glycol 400 dimethacrylate, polyethylene glycol 200 diacrylate, polyethylene glycol 200 dimethacrylate, polyethylene glycol 300 diacrylate, polyethylene glycol 600 diacrylate, polyethylene glycol 600 dimethacrylate, bisphenol F (EO)4 diacrylate, trimethylolpropane triacrylate, trimethylolpropane trimethacrylate, trimethylolpropane (EO)3 triacrylate, trimethylolpropane (EO)15 triacrylate, trimethylolpropane (EO)6 triacrylate, trimethylolpropane (EO)9 triacrylate, glycerine (PO)3 triacrylate, pentaerythritol triacrylate, trimethylolpropane (PO)3 triacrylate, tris(2-hydroxyethyl)isocyanurate triacrylate, pentaerythritol (EO)n tetraacrylate, ditrimethylolpropane tetraacrylate, pentaerythritol tetraacrylate, dipentaerythritol pentaacrylate, and dipentaerythritol hexaacrylate.

15. The nanoimprint lithography (NIL) soft mold polymeric material of claim 1, wherein the base resin component comprises one or more of a phosphate methacrylate, an acrylated amine synergist, a carboxylethyl acrylate, a bis-fluorene diacrylate, a modified bisphenol fluorene diacrylate, a modified bisphenol fluorene type, a butadiene acrylate, a polyester acrylate, a trifunctional polyester acrylate, a tetrafunctional polyester acrylate, a phenyl epoxy acrylate, a bisphenol A epoxy acrylate, an aliphatic alkyl epoxy acrylate, a bisphenol A epoxy methacrylate, a soybean oil epoxy acrylate, a difunctional polyester acrylate, a trifunctional polyester acrylate, a tetrafunctional polyester acrylate, a chlorinated polyester acrylate, a hexafunctional polyester acrylate, an aliphatic difunctional acrylate, an aliphatic difunctional methacrylate, an aliphatic trifunctional acrylate, an aliphatic trifunctional methacrylate, an aromatic tetrafunctional acrylate, an aliphatic tetrafunctional acrylate, an aliphatic hexafunctional acrylate, an aromatic hexafunctional acrylate, an acrylic acrylate, a sucrose benzoate, a caprolactone methacrylate, a caprolactone acrylate, a phenol novolac epoxy acrylate, a cresol novolac epoxy acrylate, an alkali strippable polyester acrylate, a melamine acrylate, a silicone polyester acrylate, a silicone urethane acrylate, a dendritic acrylate, an aliphatic tetrafunctional methacrylate, a water dispersion urethane acrylate, an aminated polyester acrylate, or a modified epoxy acrylate.

16. The nanoimprint lithography (NIL) soft mold polymeric material of claim 1, wherein the base resin component further comprises one or more fluorinated compounds.

17. The nanoimprint lithography (NIL) soft mold polymeric material of claim 16, wherein the one or more fluorinated compounds are selected from: 2,2,3,3,4,4,5,5,6,6,7,7-dodecafluoroheptyl acrylate, 3,3,4,4,5,5,6,6,7,7,8,8,9,9,10,10,11,11,12,12,12-heneicosafluorododecyl acrylate, 3,3,4,4,5,5,6,6,7,7,8,8,9,9,10,10,10-heptadecafluorodecyl methacrylate, 2,2,3,3,4,4,4-heptafluorobutyl acrylate, 2,2,3,3,4,4,4-heptafluorobutyl methacrylate, 2,2,3,4,4,4-hexafluorobutyl acrylate, 2,2,3,4,4,4-hexafluorobutyl methacrylate, 1,1,1,3,3,3-hexafluoroisopropyl acrylate, 1,1,1,3,3,3-hexafluoroisopropyl methacrylate, 2,2,3,3,4,4,5,5-octafluoropentyl acrylate, 2,2,3,3,4,4,5,5-octafluoropentyl methacrylate, 2,2,3,3,3-pentafluoropropyl acrylate, 2,2,3,3,3-pentafluoropropyl methacrylate, 1H,1H,2H,2H-perfluorodecyl acrylate, 2,2,3,3-tetrafluoropropyl methacrylate, 3,3,4,4,5,5,6,6,7,7,8,8,8-tridecafluorooctyl acrylate, 3,3,4,4,5,5,6,6,7,7,8,8,8-tridecafluorooctyl methacrylate, 2,2,2-trifluoroethyl methacrylate, and 2-[(1',1',1'-trifluoro-2'-(trifluoromethyl)-2'-hydroxy)propyl]-3-norbornyl methacrylate.

18. The nanoimprint lithography (NIL) soft mold polymeric material of claim 1, wherein the viscosity of the precursor material ranges from 1 cps to 3500 cps measured at 25° C.

\* \* \* \* \*